United States Patent [19]
Shimizu et al.

[11] Patent Number: 5,488,245
[45] Date of Patent: Jan. 30, 1996

[54] SEMICONDUCTOR MEMORY DEVICE CAPABLE OF ELECTRICALLY ERASING AND WRITING INFORMATION

[75] Inventors: Masahiro Shimizu; Masayoshi Shirahata; Takashi Kuroi; Takehisa Yamaguchi, all of Hyogo, Japan

[73] Assignee: Mitsubishi Denki Kabushiki Kaisha, Tokyo, Japan

[21] Appl. No.: 318,482

[22] Filed: Oct. 5, 1994

Related U.S. Application Data

[63] Continuation of Ser. No. 126,160, Sep. 24, 1993, abandoned.

[30] Foreign Application Priority Data

Mar. 19, 1993 [JP] Japan .................................. 5-060369
Apr. 23, 1993 [JP] Japan .................................. 5-097852

[51] Int. Cl.$^6$ .................................................. H01L 29/788
[52] U.S. Cl. .......................... 257/316; 257/317; 257/322
[58] Field of Search ................................. 257/317, 316, 257/403, 382, 322, 345; 365/185

[56] References Cited

U.S. PATENT DOCUMENTS

| | | | |
|---|---|---|---|
| 4,467,453 | 8/1984 | Chiu et al. | 257/316 |
| 4,630,085 | 12/1986 | Koyama | 257/315 |
| 4,663,645 | 5/1987 | Komori et al. | 257/316 |
| 4,697,198 | 9/1987 | Komori et al. | 257/345 |
| 4,763,177 | 8/1988 | Paterson | 257/315 |
| 4,804,637 | 2/1989 | Smayling et al. | 365/185 |
| 4,868,619 | 9/1989 | Mukherjee et al. | 257/316 |
| 4,972,371 | 11/1990 | Komori et al. | 257/322 |
| 5,119,165 | 6/1992 | Ando | 257/757 |
| 5,262,987 | 11/1993 | Kojima | 257/315 |
| 5,278,440 | 1/1994 | Shimoji | 257/317 |
| 5,381,028 | 1/1995 | Iwasa | 257/316 |

FOREIGN PATENT DOCUMENTS

| | | |
|---|---|---|
| 0369676A2 | 5/1990 | European Pat. Off. . |
| 0509696A2 | 10/1992 | European Pat. Off. . |
| 0517607A1 | 12/1992 | European Pat. Off. . |
| 0612107A1 | 8/1994 | European Pat. Off. . |
| 61-276375 | 12/1986 | Japan . |
| 2-23671 | 1/1990 | Japan . |
| 2-135782 | 5/1990 | Japan . |
| 3-52269 | 3/1991 | Japan . |
| 5-13776A | 1/1993 | Japan . |
| 5-29587A | 5/1993 | Japan . |
| 2226214 | 6/1990 | United Kingdom . |

OTHER PUBLICATIONS

H. Kume et al.: A Flash Erase EEPROm Cell with an Asymmetric Source and Drain Structure, IEDM 87, 1987, pp. 560–562.
J. Chen et al., "Subbreakdown Drain Leakage Current in MOSFET", IEEE Electron Device Letters, vol. EDL–8, No. 11, Nov. 1987, pp. 515–517.

(List continued on next page.)

*Primary Examiner*—Robert P. Limanek
*Attorney, Agent, or Firm*—Lowe, Price, LeBlanc & Becker

[57] ABSTRACT

A semiconductor memory device and a manufacturing method of the same can effectively prevent deterioration of endurance characteristic which may occur in a data erasing operation, and a drain disturb phenomenon which may occur in a data writing operation. In the semiconductor memory device, an N-type impurity layer 3 is formed on a main surface of a P-type silicon substrate 1 located in a channel region. Thereby, a high electric field is not applied to a boundary region between the N-type impurity layer 3 and an N-type source diffusion region 10 during erasing of data, so that generation of interband tunneling in this region is effectively prevented. Also in this semiconductor memory device, the drain diffusion region 9 has an offset structure in which no portion thereof overlaps the floating gate electrode 5. Therefore, an electric field, which is generated across the floating gate electrode 5 and the drain diffusion region 9 in an unselected cell during writing of data, is weakened, as compared with the prior art, and the drain disturb phenomenon due to F-N tunneling is effectively prevented.

16 Claims, 37 Drawing Sheets

OTHER PUBLICATIONS

N. Ajika et al., "A 5 Volt Only 16 Mbit Flash EEPROM Cell with a Simple Stacked Gate Structure", IEDM Tech. Dig. 1990, pp. 115–118.

T. Huano et al., "A MOS Transistor with Self–Aligned Polysilicon Source–Drain", IEEE Electron Device Letters, vol. EDL–7, No. 5, May 1986, 314–316.

M. Shimizu et al., "A Novel Polysilicon Source/Drain Transistor with Self–Aligned Silicidation", 1988 Symposium on VLSI Technology, May 1988, pp. 11–12.

S. Haddad et al., "Degredations Due to Hole Trapping in Flash Memory Cells", IEEE Electron Device Letters, vol. 10, No. 3, Mar. 1989, pp. 117–119.

SEMICONDUCTOR MEMORY DEVICE CAPABLE OF ELECTRICALLY ERASING AND WRITING INFORMATION

This application is a continuation of application Ser. No. 08/126,160 filed Sep. 24, 1993 now abandoned.

BACKGROUND OF THE INVENTION

1. Field of the Invention

The present invention relates to a semiconductor memory device capable of electrically erasing and writing information and a manufacturing method of the same, and in particular, to a device and a method for preventing possible deterioration of an endurance characteristic during an erasing operation of data as well as possible drain disturb phenomenon during a writing operation of data.

2. Description of the Background Art

As one of nonvolatile semiconductor memory devices, there has been known an EEPROM (Electrically Erasable and Programmable Read Only Memory) capable of freely programming data and capable of electrically writing and erasing data. Although the EEPROM has an advantage that both the writing and erasing operations can be executed electrically, it disadvantageously requires two transistors for each memory cell, and therefore integration to a higher degree is difficult. For this reason, there has been proposed a flash EEPROM including memory cells, each of which is formed of one transistor, and allowing electrical batch-erasing of written electric information charges, for example, in U.S. Pat. No. 4,868,619.

FIG. 57 is a block diagram showing a general structure of a flash EEPROM in the prior art. Referring to FIG. 57, the flash EEPROM includes a memory cell matrix 100, an X-address decoder 200, a Y-gate sense amplifier 300, a Y-address decoder 400, an address buffer 500, an I/O (input/output) buffer 600 and a control logic 700.

The memory cell matrix 100 includes a plurality of memory cells arranged in rows and columns. The X-address decoder 200 and Y-gate sense amplifier 300 are connected to the memory cell matrix 100 for selecting the rows and columns thereof. The Y-address decoder 400 is connected to the Y-gate sense amplifier 300 for amplifying selection information of column. The address buffer 500 is connected to the X-address decoder 200 and Y-address decoder 400, and temporarily stores the address information.

The Y-gate sense amplifier 300 is connected to the I/O buffer 600 for temporarily storing I/O data. The control logic 700 is connected to the address buffer 500 and I/O buffer 600 for controlling an operation of the EEPROM. The control logic 700 carries out the control based on a chip enable signal (/CE), an output enable signal (/OE) and a program signal (/PGM).

FIG. 58 is an equivalent circuit diagram showing a schematic structure of the memory cell matrix 100 shown in FIG. 57. Referring to FIG. 58, the memory cell matrix 100 includes a plurality of word lines $WL_1$, $WL_2$, ..., $WL_i$ extending in a row direction and a plurality of bit lines $BL_1$, $BL_2$, ..., $BL_i$ extending in a column direction and perpendicularly crossing the word lines. At crossings of the word lines and bit lines, there are disposed memory transistors $Q_{11}$, $Q_{12}$, ..., $Q_{ii}$ each having a floating gate electrode, respectively. Each memory transistor has a drain connected to the corresponding bit line, and a control gate electrode connected to the corresponding word line. A source of each memory transistor is connected to corresponding one of the source lines $SL_1$, $SL_2$ ..., $SL_i$. The source lines $SL_1$, $SL_2$, ..., $SL_i$ are connected to source lines $S_1$ and $S_2$ disposed at opposite sides.

FIG. 59 is a schematic plan showing a flash EEPROM of a stacked gate type (multilayered gate type) of the prior art. FIG. 60 is a cross section taken along line A—A in FIG. 59. Referring to FIGS. 59 and 60, a structure of the flash EEPROM in the prior art will be described below.

Referring to FIG. 59, control gate electrodes 137 are mutually connected to form word lines in a lateral direction (row direction). Bit lines 139 extend perpendicularly to the word lines 137. Each bit line 139 connects drain diffusion regions 132, which are aligned in a longitudinal direction (column direction), to each other. The bit lines 139 are electrically connected to the drain diffusion regions 132 through drain contacts 140. Referring to FIG. 60, the bit line 139 is formed extending over a smooth coat film 141. Referring to FIG. 59 again, source diffusion regions 133 are formed in regions which extend along the word lines 137 and are located between the word lines 137 and element isolating oxide films 130. Each drain diffusion region 132 is formed in a region between the word line 137 and element isolating oxide film 130.

Referring to FIG. 60, on a main surface of a P-type silicon substrate 131, there are formed the drain diffusion regions 132 and source diffusion regions 133 at opposite sides of channel regions with predetermined spaces between each other. On the channel regions, there are formed floating gate electrodes 135 with a thin oxide film 134 of about 100 Å in thickness therebetween. The control gate electrode 137 is formed on each floating gate electrode 135 with an interlayer insulating film 136 therebetween for electrically isolating them from each other. The floating gate electrode 135 and control gate electrode 137 are formed of polysilicon layers. A thermal oxide film 138 is formed by thermal oxidation of surfaces of the P-type silicon substrate 131, floating gate electrode 135 made of polysilicon layer and control gate electrode 137. The floating gate electrode 135 and control gate electrode 137 are covered with the smooth coat film 141 formed of an oxide film or the like.

An operation of the flash EEPROM will be described below with reference to FIG. 60.

In writing operation, a voltage $V_{D1}$ of about 6 to 8 V is applied to the drain diffusion region 132, and a voltage $V_{G1}$ of about 10 to 15 V is applied to the control gate electrode 137. The voltages $V_{D1}$ and $V_{G1}$ thus applied generate an avalanche breakdown phenomenon at the vicinity of the drain diffusion region 132 and oxide film 134. The avalanche breakdown phenomenon generates electrons having high energy. A part of the electrons are attracted and implanted into the floating gate 135 by an electric field caused by the voltage $V_{G1}$ applied to the control gate electrode 137. The electrons thus accumulated in the floating gate electrode 135 increases a threshold voltage $V_{TH}$ of the control gate transistor. The state where the threshold voltage $V_{TH}$ is higher than a predetermined value is a written state and is also referred to as a state of "0".

In an erasing operation, a voltage $V_S$ of about 10 to 12 V is applied to the source diffusion region 133. The control gate electrode 137 is maintained at the ground voltage, and the drain diffusion region 133 is maintained at the floating state. The electric field generated by the voltage $V_S$ applied to the source diffusion region 133 causes the electrons in the floating gate electrode 135 to pass through the thin oxide film 134 by virtue of an F-N (Fowler-Nordheim) tunneling phenomenon. Owing to the draw of electrons in the floating gate electrode 135 in this manner, the threshold voltage $V_{TH}$ of the control gate transistor decreases. This state where the threshold voltage $V_{TH}$ is lower than the predetermined value is an erased state, and is also referred to as a state of "1". Since the sources of transistors are mutually connected as shown in FIG. 59, batch erasing of all the memories is carried out by this erasing operation.

In reading operation, a voltage $V_{G2}$ of about 5 V is applied to the control gate electrode 137, and a voltage $V_{D2}$ of about 1 to 2 V is applied to the drain diffusion region 132. In this operation, the determination of "1" or "0" described above is carried out based on whether a current flows through the channel region of the control gate transistor or not, i.e., whether the control gate transistor is in the on-state or off-state. Thereby, information is read.

The conventional semiconductor memory device described above suffers from the drain disturb phenomenon caused in the data writing operation, as will be described below. FIG. 61 is a partial equivalent circuit diagram of a memory cell matrix 100 showing the drain disturb phenomenon. FIG. 62 is a cross section showing the drain disturb phenomenon caused by the F-N tunneling. FIG. 63 is a cross section showing the drain disturb phenomenon caused by interband tunneling.

Referring to FIG. 61, the flash EEPROM in the prior art includes the memory cells, each of which is formed of one transistor, and thus does not include a selection transistor, which is employed in a conventional EEPROM. Therefore, in the operation for Writing information, the write voltage of 6 to 8 V is applied to the drain diffusion regions (D) of all the memory transistors connected to the same bit lines ($BL_1$). More specifically, the cell selected for writing information receives at its drain diffusion region (D) the voltage of 6 to 8 V through the bit line $BL_1$, and also receives at its control gate electrode (C) the voltage of 10 to 15 V through the word line $WL_1$. During this application of voltages, the voltage of 6 to 8 V is applied to the drain diffusion regions (D) of unselected cells through the bit line $BL_1$. The unselected cells receiving at their drain diffusion regions (D) the voltage of 6 to 8 V also receives at their control gate electrodes (C) the voltage of 0 V. When the unselected cell is in the written state, electrons have been accumulated in the floating gate electrode of the unselected cell, and thus the floating gate electrode is maintained at a potential of about −3 V. When the unselected cell maintained in this state receives the voltage of 6 to 8 V and the voltage of 0 V (unselected state) at its drain diffusion region (D) and control gate electrode (C), respectively, a high electric field, which may attain 10 MV/cm, generates between the floating gate electrode and drain diffusion region. Thereby, the drain disturb phenomena occurs due to the F-N tunneling and interband tunneling.

Referring to FIG. 62, when the high electric field attaining 10 MV/cm is generated between the floating gate electrode 135 and drain diffusion region 132, electrons implanted into the floating gate electrode 135 are drawn to the drain diffusion region 132 due to the F-N tunneling. This results in undesired erasing in the unselected cell. This is a so-called "drain disturb phenomenon" by the F-N tunneling.

Referring to FIG. 63, the high electric field generated between the floating gate electrode 135 and drain diffusion region 132 causes the interband tunneling, which generates holes. The holes thus generated are implanted into the floating gate electrode 135, resulting in the same state as that where electrons are drawn. Consequently, contents in the unselected cell are erased. This is the drain disturb phenomenon by the interband tunneling.

The drain disturb phenomenon causes destruction of written data in a certain probability, resulting in reduction of reliability of elements.

The conventional flash EEPROM further suffers from a problem that an endurance characteristic may deteriorate in a data erasing operation, as will be described below. FIG. 64 is a cross section showing deterioration of the endurance characteristic which is caused in the data erasing operation. Referring to FIG. 64, in the erasing operation of the conventional flash EEPROM, the control gate electrode 137 receives a voltage of 0 V, and the source diffusion region 133 receives a voltage of about 10 to 12 V. During this operation, the interband tunneling occurs at the vicinity of source diffusion regions 133, and thus holes are generated. The holes thus generated are trapped by the oxide film 134 located under the floating gate electrode 135, resulting in deterioration of the film property of oxide film 134. The deterioration of film property of oxide film 134 impedes the draw of electron from the floating gate electrode 135 in the data erasing operation. This phenomenon is referred to as "deterioration of the endurance characteristic", and is disclosed, e.g., in IEEE ELECTRON DEVICE LETTERS, Vol. 10, No. 3, March 1989, pp. 117–119. Further, in the conventional flash EEPROM, the source of each memory cell transistor is connected to the source lines $SL_1$, $SL_2$, . . . , as shown in FIG. 58. In the prior art, the source diffusion regions 133 are used as the source lines $SL_1$, $SL_2$, . . . . In other words, the source diffusion regions 133 are formed to be common to the plurality of memory cell transistors for forming the source lines $SL_1$, $SL_2$, . . . .

However, the source lines $SL_1$, $SL_2$, . . . thus formed by the source diffusion regions 133 cause a disadvantage that the source lines $SL_1$, $SL_2$, . . . have a large resistance in the case where the size of source diffusion region 133 is reduced in accordance with miniaturization. This results in delay of data signals.

As described above, the conventional flash EEPROM suffers from generation of the drain disturb phenomenon in the data writing operation, and also suffers from deterioration of the endurance characteristic in the data erasing operation. Further, miniaturization of elements unpreferably increases resistances of the source diffusion regions 133 forming the source lines $SL_1$, $SL_2$, . . . .

SUMMARY OF THE INVENTION

An object of the invention is to provide a semiconductor memory device in which reliability of elements is improved.

Another object of the invention is to provide a semiconductor memory device which can effectively prevent a drain disturb phenomenon generated in a data writing operation as well as deterioration of an endurance characteristic in a data erasing operation.

Still another object of the invention is to provide a semiconductor memory device which can effectively prevent deterioration of an endurance characteristic in a data erasing operation, and allows miniaturization of elements.

Yet another object of the invention is to provide a semiconductor memory device which can prevent a punchthrough phenomenon as far as possible, and can effectively prevent deterioration of an endurance characteristic in a data erasing operation.

Further object of the invention is to provide a semiconductor memory device which can effectively prevent a drain disturb phenomenon, which may be caused by interband tunneling, and deterioration of an endurance characteristic.

A further object of the invention is to provide a semiconductor memory device in which a source region forming a source line has a reduced resistance.

A still further object of the invention to effectively prevent a drain disturb phenomenon and deterioration of an endurance characteristic.

It is also an object of the invention to provide a manufacturing method of a semiconductor memory device for easily manufacturing a semiconductor memory device which can effectively prevent a-drain disturb phenomenon and deterioration of an endurance characteristic.

Yet a further object of the invention is to provide a manufacturing method of a semiconductor memory device for easily manufacturing a semiconductor memory device which can prevent a punch-through phenomenon as far as possible and can effectively prevent deterioration of an endurance characteristic.

A still further object of the invention is to provide a manufacturing method of a semiconductor memory device for easily manufacturing a semiconductor memory device in which a resistance of a source region forming a source line can be effectively reduced.

According to an aspect of the invention, a stacked gate type semiconductor memory device which has a charge storage electrode and a control electrode and is capable of electrically writing and erasing information, includes a semiconductor substrate of a first conductivity type having a main surface, first and second impurity regions of a second conductivity type, which are formed on the main surface of the semiconductor substrate and are located at opposite sides of a channel region with a predetermined space between each other, at least one of the first and second impurity regions being formed without overlapping the charge storage electrode located on the channel region, and a third impurity region of the second conductivity type formed on the main surface of the semiconductor substrate located in the channel region.

As described above, the first and second impurity regions are formed on the main surface of the semiconductor substrate and are located at opposite sides of the channel region of the first conductivity type with the predetermined space between each other, and the third impurity region of the second conductivity type is formed on the main surface of the semiconductor substrate located in the channel region. Therefore, a high electric field is not applied to a boundary region between the third impurity region and the source region, i.e., first or second impurity region in data erasing operation, so that an interband tunneling in the boundary region can be effectively prevented. Therefore, the band tunneling itself, which may be caused in the data erasing operation, is suppressed as compared with the prior art, and the interband tunneling occurs at a position under the third impurity region, i.e., a position remote from a first dielectric film. As a result, holes generated by the interband tunneling in the data erasing operation can be effectively prevented from being trapped in the first dielectric film. Thereby, a film property of the first dielectric film is not deteriorated in the data erasing operation, and such a disadvantage can also be prevented that draw of electrons from the charge storage electrode is impeded. The third impurity region suppresses the interband tunneling which may occur between the third impurity region and the drain region, i.e., first or second impurity region in an unselected cell during the writing of data, so that the drain disturb phenomenon, which may be caused by the interband tunneling in the unselected cell during writing of data, can be suppressed. Further, at least one of the first and second impurity regions is formed not to overlap the charge storage electrode. This reduces an electric field between the charge storage electrode and the drain region formed of first or second impurity region in the unselected cell during writing of data as compared with the prior art, so that the drain disturb phenomenon, which may be caused by the F-N tunneling, can be effectively prevented. Since the charge storage electrode does not overlap the first or second impurity region forming the drain region, the electric field in the unselected cell does not concentrate at a position immediately under the charge storage electrode, and holes caused by the interband tunneling are not located immediately under the charge storage electrode. This prevents introduction of the holes generated by the interband tunneling into the charge storage electrode, and thus effectively prevents the drain disturb phenomenon, which may be caused by the interband tunneling.

According to another aspect of the invention, a semiconductor memory device of a stacked gate type capable of electrically writing and erasing information includes a semiconductor substrate of a first conductivity type having a main surface, first and second impurity regions of a second conductivity type, which are formed on the main surface of the semiconductor substrate and are located at opposite sides of a channel region with a predetermined space between each other, a third impurity region of the second conductivity type formed on the main surface of the semiconductor substrate located in the channel region, a fourth impurity region of the first conductivity type formed under the third impurity region and having a junction surface to the semiconductor substrate at a depth smaller than a depth of a junction surface between the first and second impurity regions and the semiconductor substrate, a charge storage electrode formed on the third impurity region with a first dielectric film therebetween, and a control electrode formed on the charge storage electrode with a second dielectric film therebetween.

As described above, the first and second impurity regions of the second conductivity type having a predetermined junction depth is formed on the main surface of the semiconductor substrate of the first conductivity type and is located at the opposite sides of the channel region with the predetermined space between each other, and the third impurity region of the second conductivity type is formed on the main surface of the semiconductor substrate located in the channel region. Therefore, similarly to the semiconductor memory device of the aspect of the invention described above, such a disadvantage can be prevented that draw of electrons from the charge storage electrode is impeded, and it is possible to suppress the disturb phenomenon, which may be caused by the interband tunneling generated in the unselected cell during writing of data. The fourth impurity region of the first conductivity type is formed at the region of the semiconductor substrate located in the channel region and is located under the third impurity region of the second conductivity type. Therefore, even in a case that the channel region, which is formed owing to the existence of the third impurity region, is located under the third impurity region and thereby the electric field from the charge accumulation electrode to the channel region is weakened, the avalanche phenomenon is promoted by increasing a concentration of impurity in the fourth impurity region, so that reduction of a writing efficiency in the data writing operation can be effectively prevented. Since the fourth impurity region is formed at a depth smaller than that of junction between the first and second impurity regions, the depth of the third impurity region is reduced in proportion thereto. This effectively prevents weakening of the electric field applied from the charge storage electrode to the channel region located under the third impurity region. Therefore, a so-called "punch-through phenomenon", which makes the control from the charge storage electrode impossible and caused due to miniaturization of elements, can be significantly prevented. That is, in the semiconductor memory device according to this aspect of the invention, the phenomenon, which impedes draw of electrons from the charge storage electrode in the data erasing operation, (i.e., deterioration of an endurance characteristic) can be effectively prevented, while significantly preventing generation of the punch-through phenomenon.

According to still another aspect of the invention, a semiconductor memory device includes a semiconductor substrate of a first conductivity type having a main surface, source and drain regions of a second conductivity type, which are formed on the main surface of the semiconductor substrate and are located at opposite sides of a channel region with a predetermined space between each other, a source conductive layer formed on and in contact with the source region, a charge storage electrode formed at least on the channel region with a first dielectric film therebetween, and a control electrode formed on the charge storage electrode with a second dielectric film therebetween.

Preferably, the main surface of the semiconductor substrate located in the channel region is formed to have an irregular or uneven shape. Also, an impurity region of the second conductivity type is preferably formed on the main surface of the semiconductor substrate located in the channel region.

Since the source conductive layer is formed on and in contact with the source region, increase of resistance of the source region, which is formed commonly to respective memory transistors, is effectively prevented even if the size of source region is reduced in accordance with miniaturization of elements.

In the case where the main surface of the semiconductor substrate located in the channel region has the irregularity or unevenness, the convex portion forming the irregularity promotes concentration of an electric field thereat, resulting in increase of a vertical electric field applied to the channel region. This facilitates jump of electrons into the charge storage electrode in the writing operation, and also facilitates draw of electrons from the charge storage electrode in the erasing operation. As a result, the writing and erasing efficiencies are improved.

In the case where the impurity region of the second conductivity type is formed on the main surface of the semiconductor substrate located in the channel region, a high electric field is not applied to a boundary region between the impurity region and the source region during erasing of data, so that generation of interband tunneling in this region is effectively prevented. Thereby, the interband tunneling itself which occurs during erasing of data is suppressed as compared with the prior art, and the interband tunneling occurs at a location under the impurity region, i.e., a position remote from the first dielectric film. As a result, holes which are generated due to the interband tunneling in the data erasing operation are effectively prevented from being trapped by the first dielectric film.

According to yet another aspect of the invention, a semiconductor memory device includes a semiconductor substrate of a first conductivity type having a main surface, source and drain regions of a second conductivity type, which are formed on the main surface of the semiconductor substrate and are located at opposite sides of a channel region with a predetermined space between each other, a source conductive layer formed on and in contact with the source region, a first dielectric film formed on and in contact with at least the channel region and the source conductive layer, a charge storage electrode formed on the first dielectric film, and a control electrode formed on the charge storage electrode with a second dielectric film therebetween. The source region does not overlap a portion of the charge storage electrode located above the first dielectric film on the channel region.

Further, a drain conductive layer is preferably formed on and in contact with the drain region. The first dielectric film is formed on and in contact with the drain conductive layer. The charge storage electrode is formed on and in contact with the drain conductive layer with the first dielectric film therebetween. The drain region does not overlap a portion of the charge storage electrode located above the first dielectric film on the channel region.

Since the source conductive layer is formed on and in contact with the source region, increase of resistance of the source region, which is formed commonly to respective transistors, is effectively prevented even if the size of source region is reduced in accordance with miniaturization of elements. The first dielectric film is formed on the source conductive layer, and the charge storage electrode is formed on the first dielectric film. Therefore, electrons are drawn from overlapping portions of the charge storage electrode and source conductive layer during erasing of data. Since an area of the overlapping portions can be freely determined, it can be increased for obtaining a good erasing characteristic. At the same time, the source region does not overlap a portion of the charge storage electrode located above the first dielectric film on the channel region. Therefore, the electric field does not concentrate at a location immediately under the charge storage electrode on the channel region, so that holes which generate due to the interband tunneling are not located immediately under the charge storage electrode on the channel region. Thereby, the holes which are generated due to the interband tunneling in the data erasing operation are effectively prevented from being trapped by the first dielectric film.

Further, such a structure may be employed that the drain conductive layer is formed on and in contact with the drain region, the charge storage electrode is formed on the drain conductive layer with the first dielectric film therebetween, and the drain region does not overlap the portion of the charge storage electrode located above the first dielectric film on the channel region. This achieves the following operation. Writing of data is carried out by an F-N current at the overlapping portions of the drain conductive layer and charge storage electrode. Since an area of the overlapping portions can be freely determined, the area can be increased for obtaining a good writing characteristic. At the same time, the drain region does not overlap the portion of the charge storage electrode located above the first dielectric film on the channel region, so that the electric field in the unselected cell does not concentrate at a position immediately under the portion of the charge storage electrode located on the channel region, and the holes generated by the interband tunneling are not located immediately under the charge storage electrode. Thereby, the holes generated by the interband tunneling are prevented from being introduced into the charge storage electrode, and the drain disturb phenomenon, which may be caused by the interband tunneling, is effectively prevented. Also, the electric field between the charge storage electrode and drain region located above the channel region is weakened, so that the drain disturb phenomenon, which may be caused by F-N tunneling, can be prevented.

According to a further aspect of the invention, a semiconductor memory device includes a semiconductor substrate of a first conductivity type having a main surface, source and drain regions of a second conductivity type, which are formed on the main surface of the semiconductor substrate and are located at opposite sides of a channel region with a predetermined space between each other, a drain conductive layer formed on and in contact with the drain region, a first dielectric film formed on and in contact with the channel region and the drain conductive layer, a charge storage electrode formed on the first dielectric film, and a control electrode formed on the charge storage electrode with a second dielectric film therebetween. The drain region is formed not to overlap a portion of the charge storage electrode located above the first dielectric film on the channel region.

As described above, the drain conductive layer is formed on and in contact with the drain region, and the charge storage electrode is formed on the drain region with the first dielectric film therebetween. Therefore, writing of data is carried out by an F-N current in overlapping portions of the drain conductive layer and charge storage electrode. Since an area of the overlapping portions can be freely determined, the area of the overlapping portions can be increased for obtaining a good writing characteristic. At the same time, the drain region does not overlap the portion of the charge storage electrode located above the first dielectric film on the channel region, so that the electric field in the unselected cell does not concentrate at a position immediately under the charge storage electrode, and the holes generated by the interband tunneling are not located immediately under the charge storage electrode. Thereby, the holes generated by the interband tunneling are prevented from being introduced into the charge storage electrode, and the drain disturb phenomenon, which may be caused by the interband tunneling, is effectively prevented. Also, the electric field between the charge storage electrode and drain region located above the channel region is weakened, so that the drain disturb phenomenon, which may be caused by F-N tunneling, can be prevented.

Also according to a further aspect of the invention, a manufacturing method of a semiconductor memory device includes the steps of forming a first impurity region by introducing impurity of a second conductivity type onto a main surface of a semiconductor substrate of a first conductivity type, forming a charge storage electrode on a predetermined region of the main surface of the semiconductor substrate with a first dielectric film therebetween, forming a control electrode on the charge storage electrode with a second dielectric film therebetween, forming a side wall insulating film on side walls of the charge storage electrode and the control electrode, and forming second and third impurity regions, at least one of which does not overlap the charge storage electrode, by introducing impurity of the second conductivity type into the semiconductor substrate, using the control electrode and the side wall insulating film as a mask.

As described above, the side wall insulating film is formed on the side walls of the charge storage electrode and the control electrode, and at least one of the second and third impurity regions is formed by introducing the impurity of the second conductivity type into the semiconductor substrate, using the control electrode and the side wall insulating film as a mask. Therefore, at least one of the second and third impurity regions is easily formed without overlapping the charge storage electrode. Thereby, an electric field between the charge storage electrode and the drain region, i.e., second or third impurity region in the unselected cell is weakened in the data writing operation as compared with the prior art, and thus a drain disturb phenomenon, which may be caused by F-N tunneling, can be effectively prevented. Further, the electric field in the unselected cell does not concentrate at a position immediately under the charge storage electrode, so that holes generated by the interband tunneling are not located at the position immediately under the charge storage electrode. This prevents implantation of holes generated by the interband tunneling into the charge storage electrode, and thereby effectively prevents the drain disturb phenomenon which may be caused by the interband tunneling. Since the first impurity region is formed by introduction of impurity of the second conductivity type onto the main surface of the semiconductor substrate of the first conductivity type, a high electric field is not applied to a boundary region between the first impurity region located at the channel region and the source region, i.e., the second or third impurity region in the data erasing operation, and thus generation of the interband tunneling at this region can be effectively prevented. Thereby, the interband tunneling itself generated in the data erasing operation is suppressed, compared with the prior art, and the interband tunneling is generated at a position under the third impurity region, i.e., at a position remote from the first dielectric film. This effectively prevents holes generated by the interband tunneling in the data erasing operation from being trapped by the first dielectric film. Thereby, the film property of the first dielectric film is not deteriorated in the data erasing operation, and such a disadvantage that draw of electrons from the charge storage electrode is suppressed is not caused. Further, the first impurity region suppresses the interband tunneling which occurs at the boundary region between the first impurity cell and the drain region, i.e., second or third impurity region in the unselected cell during writing of data, so that the drain disturb phenomenon due to the interband tunneling which occurs in the unselected cell during writing of data is suppressed.

According to a still further aspect of the invention, a manufacturing method of a semiconductor memory device includes the steps of forming a first impurity region by introducing impurity of a second conductivity type onto a main surface of a semiconductor substrate of a first conductivity type, forming a second impurity region under the first impurity region by introducing impurity of the first conductivity type into a region under the first impurity region, forming a charge storage electrode on a predetermined region of the main surface of the semiconductor substrate with a first dielectric film therebetween, forming a control electrode on the charge storage electrode with a second dielectric film therebetween, and forming third and fourth impurity regions by introducing impurity of the second conductivity type into the semiconductor substrate, using the control electrode as a mask. The step of forming the second impurity region includes the step of controlling the introduction of said second impurity so that a junction surface between the second impurity region and the semiconductor substrate is located at a depth smaller than that of a junction surface between the semiconductor substrate and the third and fourth impurity regions.

Since the first impurity region is formed by the introduction of the impurity of the second conductivity type onto the main surface of the semiconductor substrate of the first conductivity type, such a disadvantage does not occur that draw of electrons from the charge storage electrode is suppressed, and the drain disturb phenomenon caused by the interband tunneling which occurs in an unselected cell during writing of data can be suppressed. Further, the second impurity region covering the first impurity region is formed by introducing the impurity of the first conductivity type into the region deeper than a region in which the first impurity region is formed. Therefore, even in such a case that, an electric field to the channel region from the charge storage electrode is weakened due to existence of the first impurity region under which the channel region is located, an avalanche phenomenon can be promoted by increasing the concentration of impurity in the second impurity region, and thus reduction of a writing efficiency in the data writing operation can be effectively prevented. The second impurity region is located at a depth smaller than the depth of junction between the third and fourth impurity regions each forming a source or drain region. In proportion to this, the first impurity region is located at a shallower position, which effectively prevents reduction of intensity of the electric field from the charge storage electrode to the channel region located under the first impurity region, and thus the so-called punch-through phenomenon which makes the control from the charge storage electrode impossible, can be effectively prevented.

According to a further aspect of the invention, a manufacturing method of a semiconductor memory device includes the steps of forming source and drain regions of a second conductivity type on a main surface of a semiconductor substrate of a first conductivity type, the source and drain regions being located at opposite sides of a channel region with a predetermined space between each other, forming a source conductive layer on and in contact with a region in which the source region is formed, forming a charge storage electrode at least on the channel region with a first dielectric film therebetween, and forming a control electrode on the charge storage electrode with a second dielectric film therebetween.

Preferably, the channel region is provided with an irregular surface.

Since the source conductive layer is formed on and in contact with the region in which the source region is formed, a semiconductor can be easily manufactured in which the increase of resistance of the source region is effectively prevented even if the size of source region is reduced in accordance with miniaturization of elements.

In the case where the channel region has the irregular surface, a convex portion in the irregular surface promotes concentration of an electric field thereat, resulting in increase of a vertical electric field in the channel region. This facilitates draw of electrons from the charge storage electrode in the data erasing operation, and also facilitates introduction of electrons into the charge storage electrode in the data writing operation. As a result, a semiconductor device having good writing and erasing efficiencies can be easily manufactured.

According to still further aspect of the invention, a manufacturing method of a semiconductor memory device includes the steps of forming source and drain regions of a second conductivity type on a main surface of a semiconductor substrate of a first conductivity type, the source and drain regions being located at opposite sides of a channel region with a predetermined space between each other, forming a source conductive layer located on and in contact with a region in which the source region is formed, forming a drain conductive layer located on and in contact with a region in which the drain region is formed, forming a first dielectric film on and in contact with the channel region, the source conductive layer and the drain conductive layer, forming a charge storage electrode on the first dielectric film, and forming a control electrode on the charge storage electrode with a second dielectric film therebetween. The step of forming the source and drain regions includes the step of forming the source region and the drain region so that neither of them has a portion overlapping a portion of the charge storage electrode located on the first dielectric film on the channel region.

Since the source conductive layer is formed on and in contact with the region in which the source region is formed, increase of resistance of the source region is effectively prevented even if the size of source region is reduced in accordance with miniaturization of elements. Since the charge storage electrode is formed on the source conductive layer with the first dielectric film therebetween, the erasing operation is carried out at overlapping portions of the source conductive layer and charge storage electrode. At the same time, since the source region has a so-called offset structure, holes which are generated at the vicinity of the source region due to the interband tunneling are not located immediately under the charge storage electrode on the channel region. This prevents the holes generated by the interband tunneling from being introduced into the first dielectric film. The drain conductive layer is formed on the region in which the drain region is formed, and the charge storage electrode is formed on the drain conductive layer with the first dielectric film therebetween. Therefore, the writing operation is carried out at overlapping portions of the drain conductive layer and charge storage electrode, using an F-N current. At the same time, since the drain conductive layer also has a so-called offset structure, the electric field in the unselected cell does not concentrate at the position immediately under the charge storage electrode on the channel region, and the holes generated by the interband tunneling are not located immediately under the charge storage electrode on the channel region. Thereby, the holes generated by the interband tunneling are prevented from being implanted into the charge storage electrode, and thus the drain disturb phenomenon, which may be caused by the interband tunneling, is effectively prevented. Since the electric field between the drain region and charge storage electrode on the channel region is weakened, the drain disturb phenomenon, which may be caused by the F-N tunneling, is prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
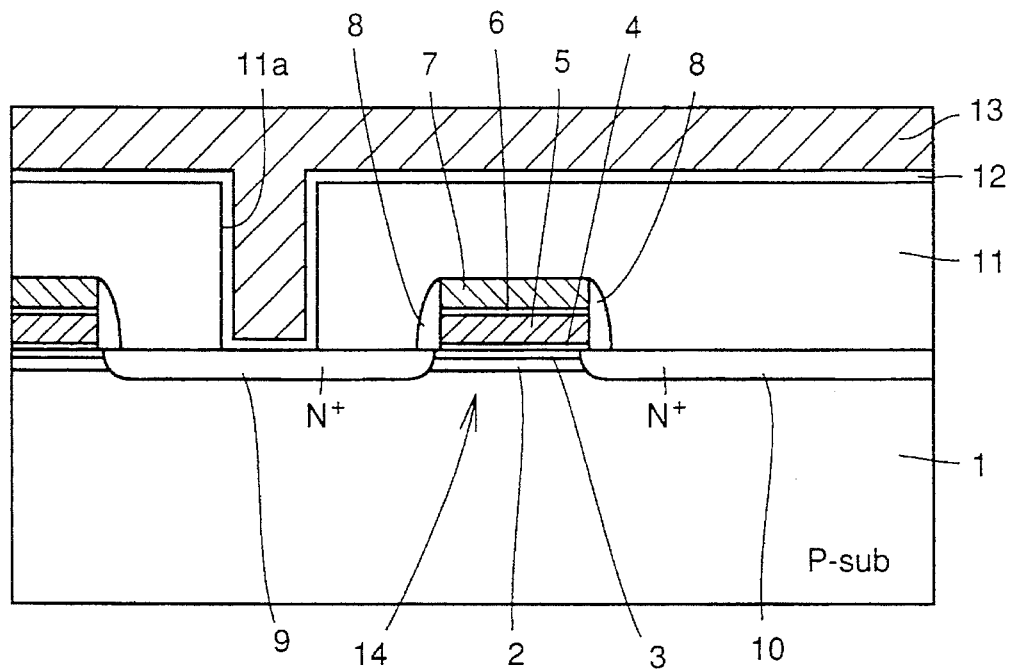
FIG. 1 is a cross section showing a flash EEPROM of a stacked gate type according to a first embodiment of the invention.

Embodiments of the invention will be described below with reference to the drawings.

Embodiment 1

A structure of a flash EEPROM of a first embodiment will be described below with reference to FIGS. 1 and 2.

The flash EEPROM of the first embodiment includes a P-type silicon substrate 1, as well as a drain diffusion region 9 of an N-type and a source diffusion region 10 of an N-type, which are formed on predetermined regions of a main surface of the P-type silicon substrate 1 and are located at opposite sides of a channel region 14 with a predetermined space between each other. An N-type impurity layer 3 is formed on the main surface of the P-type silicon substrate 1 located in the channel region 14. Under the N-type impurity layer 3, there is formed a P-type impurity layer 2 having a junction surface at a depth smaller than that of a junction surface between the drain diffusion region 9 and source diffusion region 10. A floating gate electrode 5 is formed on the N-type impurity layer 3 with an oxide film 4 therebetween. A control gate electrode 7 is formed on the floating gate electrode 5 with an interlayer insulating film 6 therebetween. Side wall oxide films 8 are formed on the opposite side walls of the floating gate electrode 5 and control gate electrode 7. On the drain diffusion region 9, there is formed an interlayer insulating film 11 covering the whole surface. The interlayer insulating film 11 is provided with a contact hole 11a and has a flattened or smoothened upper surface. A titanium alloy film 12 made of TiN extends over the surface of the interlayer insulating film 11. The titanium alloy film 12 has a portion which is located in the contact hole 11a and is electrically connected to the drain diffusion region 9. An aluminium alloy interconnection layer 13 is formed on the titanium alloy film 12.

The oxide film 4 has a thickness of about 100 Å. The floating gate electrode 5 is formed of a polysilicon layer and has a thickness of about 1000 Å. The interlayer insulating film 6 is a multilayer film formed of an oxide film and a nitride film, and has a thickness of about 200 Å. The control gate electrode 7 is formed of a polysilicon layer, and has a thickness of about 2500 Å. The flattened interlayer insulating film 11 is a multilayer film formed of a non-doped oxide film and a PSG or BPSG film, or is a multilayer film formed of a non-doped oxide film, a nitride film and a PSG or BPSG film. The interlayer insulating film 11 has a thickness of about 5000 to 15000 Å. A size of opening of the contact hole 11a is about 0.6 to 1.5 µm. The titanium alloy film 12 is about 500 Å in thickness, and the aluminium alloy interconnection layer 13 is about 10000 Å in thickness. The titanium alloy film 12 and aluminium alloy interconnection layer 13 form a bit line.

In the first embodiment, the drain diffusion region 9 does not overlap the floating gate electrode 5, and in other words, has a so-called offset structure. As described above, the N-type impurity layer 3 is formed on the surface region of the channel region 14, and the P-type impurity layer 2 having a depth smaller than that of the drain diffusion region 9 and source diffusion region 10 is formed under the N-type impurity layer 3. The structure in this first embodiment described above can achieve following effects.

In the first embodiment, the N-type impurity layer 3 of the same conductivity type as the source diffusion region 10 is formed in the surface region of the channel region 14, whereby a high electric field is not applied to a boundary region between the N-type impurity layer 3 and N-type source diffusion region 10 in the data erasing operation. This effectively prevents generation of the interband tunneling in this region. As a result, the interband tunneling itself which occurs in the data erasing operation is suppressed as compared with the prior art. Owing to the existence of the N-type impurity layer 3, the region receiving the high electric field moves to the boundary between the N-type source diffusion region 10 and the P-type impurity layer 2 under the N-type impurity layer 3. Thereby, the interband tunneling occurs at a position under the N-type impurity layer 3, so that a distance from the position of generation of the interband tunneling to the oxide film 4 increases as compared with the prior art. As a result, holes generated by the interband tunneling in the data erasing operation can be effectively prevented from being trapped by the oxide film 4. Thereby, deterioration of the film property of the oxide film 4 is prevented in the data erasing operation, and such a disadvantage that draw of electrons from the floating gate electrode 5 is impeded does not occur. Thus, deterioration of the endurance characteristic in the data erasing operation can be effectively prevented. The existence of the N-type impurity layer 3 prevents generation of the interband tunneling at the boundary region between the drain diffusion region 9 and the N-type impurity layer 3 in an unselected cell during writing of data. This suppresses the drain disturb phenomenon caused by the interband tunneling which generates in the unselected cell during writing of data.

Further, in this first embodiment, formation of the P-type impurity layer 2 immediately under the N-type impurity layer 3 prevents reduction of the writing characteristic. That is, owing to existence of the N-type impurity layer 3, the formed channel is located under the N-type impurity layer 3, so that the intensity of electric field to the channel from the floating gate electrode 5 may be reduced as compared with the prior art, which may reduce a writing efficiency. In this embodiment, however, the N-type impurity layer 3 is covered with the P-type impurity layer 2 having a high concentration of impurity, so that a higher electric field is generated at the boundary region between the P-type impurity layer 2 and drain diffusion region 9. Thereby, the avalanche phenomenon is promoted, and the writing efficiency is improved. As a result, reduction of the writing efficiency, which may be caused by the provision of N-type impurity layer 3, can be effectively prevented.

In the first embodiment, the P-type impurity layer 2 is formed at a depth smaller than that of the junction between the drain diffusion region 9 and source diffusion region 10, so that the depth of N-type impurity layer 3 from the surface of P-type silicon substrate 1 is reduced. The depth of N-type impurity layer 3 can be controlled to some extent by changing the depth of P-type impurity layer 2 formed under the N-type impurity layer 3, and the depth of N-type impurity layer 3 can be reduced in proportion to reduction of the depth of P-type impurity layer 2. As described above, by reducing the depth of N-type impurity layer 3, the channel formed under the N-type impurity layer 3 can be formed as close as possible to the floating gate electrode 5, and thus weakening of the electric field applied from the floating gate electrode 5 to the channel can be effectively prevented. As a result, a possible phenomenon in which control from the floating gate electrode 5 cannot be allowed, i.e., so-called punch-through phenomenon caused in accordance with miniaturization of elements can be significantly prevented. That is, in the first embodiment, deterioration of the endurance characteristic, which may be caused in the data erasing operation, can be effectively prevented, while significantly preventing the punch-through phenomenon.

In this first embodiment, the drain diffusion region 9 has the so-called offset structure in which it does not overlap the floating gate electrode 5. This can effectively prevent the drain disturb phenomenon which may occur in an unselected cell during writing of data. More specifically, owing to formation of the drain diffusion region 9 not overlapping the floating gate electrode 5, the electric field, which is generated between the floating gate electrode 5 and drain diffusion region 9 in the unselected cell during the writing of data, is weakened as compared with the prior art, so that the possible drain disturb phenomenon caused by the F-N tunneling can be effectively prevented. Owing to formation of the drain diffusion region 9 not overlapping the floating gate electrode 5, the electric field in the unselected cell during the erasing of data does not concentrate at a position immediately under the floating gate electrode 5, so that holes generated by the interband tunneling are not located immediately under the floating gate electrode 5. Thereby, the holes generated by the interband tunneling are prevented from being introduced into the floating gate electrode 5, and thus the drain disturb phenomenon which may be caused by the interband tunneling can be effectively prevented.

In the flash EEPROM according to the first embodiment, as described above, it is possible to prevent deterioration of the endurance characteristic, which may occur in the data erasing operation, and the drain disturb phenomenon, which may occur in the data writing operation, and thus miniaturization of elements is allowed. For these reasons, the flash EEPROM can have an improved reliability.

Then, an operation of the flash EEPROM of the first embodiment will be described below with reference to FIG. 2.

First, in the writing operation, a voltage of $V_{D1}$ of about 6 to 8 V is applied to the drain diffusion region 9, and a voltage $V_{G1}$ of about 10 to 15 V is applied to the control gate electrode 7. Owing to the application of voltages $V_{D1}$ and $V_{G1}$, a high electric field is generated near the boundary region between the drain diffusion region 9 and P-type impurity layer 2. This high electric field generates the avalanche breakdown phenomenon, whereby electrons having a high energy is generated. A part of the electrons are attracted to the floating gate electrode 5 by electric charges caused by the voltage $V_{G1}$ applied to the control gate electrode 7, and are introduced thereinto. Owing to this accumulation of electrons in the floating gate electrode 5, a threshold voltage $V_{TH}$ of the control gate transistor increases. The state where the threshold voltage $V_{TH}$ is higher than a predetermined value is a written state, and is referred to as a state of "0".

In the erasing operation, a voltage $V_S$ of about 10 to 12 V is applied to the source diffusion region 10. The control gate electrode 7 is maintained at the ground potential, and the drain diffusion region 9 is maintained in the floating state. Owing to the electric field generated by the voltage $V_S$ applied to the source diffusion region 10, electrons in the floating gate electrode 5 pass through the thin oxide film 4 by virtue of the F-N tunnel phenomenon. This draw of electrons in the floating gate electrode 5 reduces the threshold voltage $V_{TH}$ of control gate transistor. The state where the threshold voltage $V_{TH}$ is lower than a predetermined value is an erased state, and is also referred to as a state of "1". Although a high voltage is applied to the source diffusion region 10 in the erasing operation, the high electric field is not generated across the N-type impurity layer 3 and N-type source diffusion region 10, because the N-type impurity layer 3 is formed on the surface of channel region in this embodiment. This embodiment, therefore, can effectively prevent deterioration of the endurance characteristic, which may occur during erasing of data in the prior art.

Further, in the reading operation, a voltage $V_{G2}$ of about 5 V is applied to the control gate electrode 7, and a voltage $V_{D2}$ of about 1 to 2 V is applied to the drain diffusion region 9. In this operation, "1" or "0" described above is determined based on whether a current flows through the channel region of the control gate transistor or not, i.e., whether the control gate transistor is in the on-state or off-state. Thereby, information is read.

A manufacturing process of a flash EEPROM of the first embodiment will be described below with reference to FIG. 1 and FIGS. 3–13.

Figure 3:
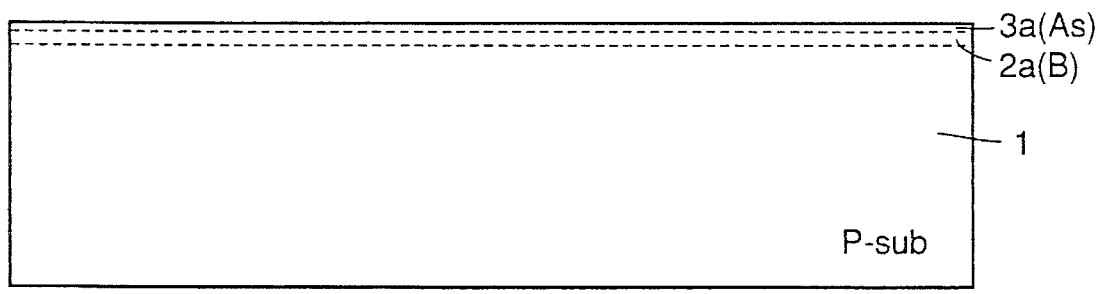
FIGS. 3–13 are cross sections showing first to eleventh steps of a manufacturing process of the flash EEPROM of the first embodiment shown in FIG. 1.

First, as shown in FIG. 3, a well region and an element isolating oxide film (both not shown) are formed in predetermined regions on the main surface of P-type silicon substrate 1. Then, N-type impurity, i.e., arsenic (As) is ion-implanted under implanting conditions of 10 KeV and not more than $10^{12}/cm^2$, and P-type impurity, i.e., boron (B) is ion-implanted under conditions of 50 KeV and not more than $10^{13}/cm^2$. Thereby, P-type and N-type impurity layers 2a and 3a are formed. Formation of the N-type impurity layer 3a allows formation of memory cells of a buried channel type, which will be described later. The P-type impurity layer 2a is formed at a depth smaller than those of the drain diffusion region 9 and source diffusion region 10, which will be specified later.

Figure 4:
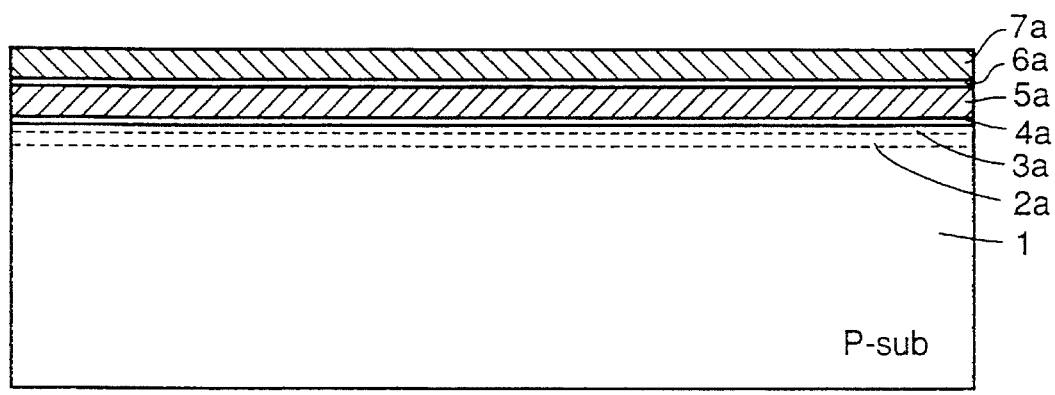

As shown in FIG. 4, an oxide layer 4a having a thickness of about 100 Å is formed on the whole surface, and then a first polysilicon layer 5a is formed at a thickness of about 1000 Å on the oxide layer 4a. An interlayer insulating layer 6a made of a multilayer film of oxide film and nitride film is formed to have a thickness of about 200 Å on the first polysilicon layer 5a, and then a second polysilicon layer 7a is formed to have a thickness of about 2500 Å on the interlayer insulating layer 6a.

Figure 5:
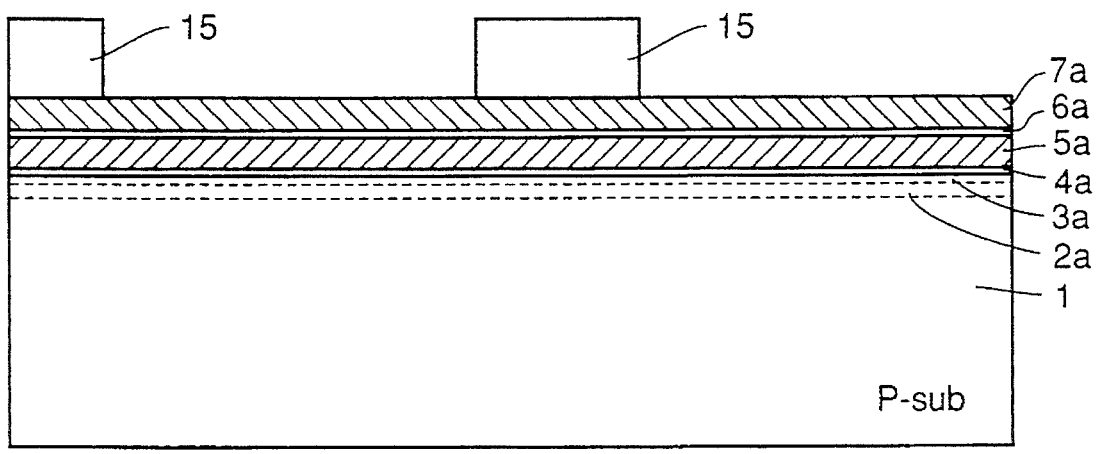
Figure 6:
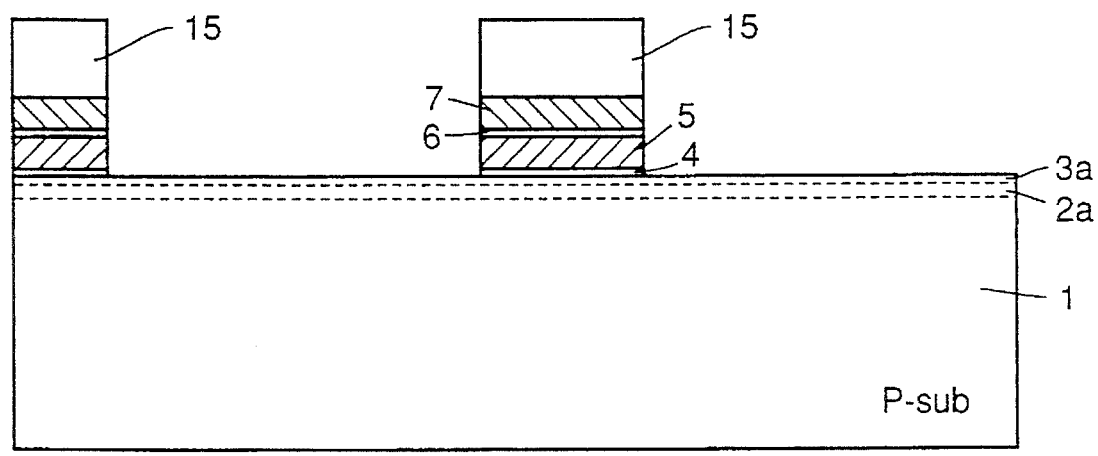

Then, as shown in FIG. 5, a resist 15 is formed in a predetermined region on the second polysilicon layer 7a. By carrying out anisotropic etching using the resist 15 as a mask, the second polysilicon layer 7a, interlayer insulating layer 6a, first polysilicon layer 5a and oxide layer 4a are patterned. Thereby, the control gate electrode 7, interlayer insulating film 6, floating gate electrode 5 and oxide film 4 are formed, as shown in FIG. 6. Thereafter, the resist 15 is removed.

Figure 7:
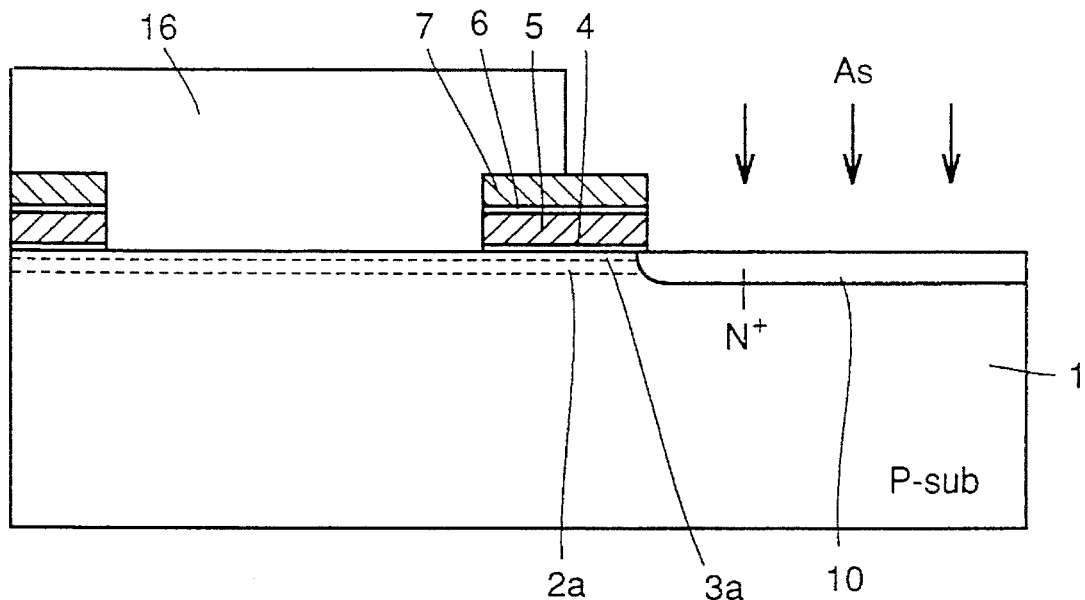

Then, as shown in FIG. 7, a resist 16 is formed to cover a region which will form the drain diffusion region of the memory cell. The resist 16 and control gate electrode 7 are used as a mask, and arsenic (As) is ion-implanted into the main surface of P-type silicon substrate 1 under conditions of 35 KeV and $1\times10^{15}/cm^2$. Thereby, the source diffusion region 10 is formed. Thereafter, the resist 16 is removed.

Figure 8:
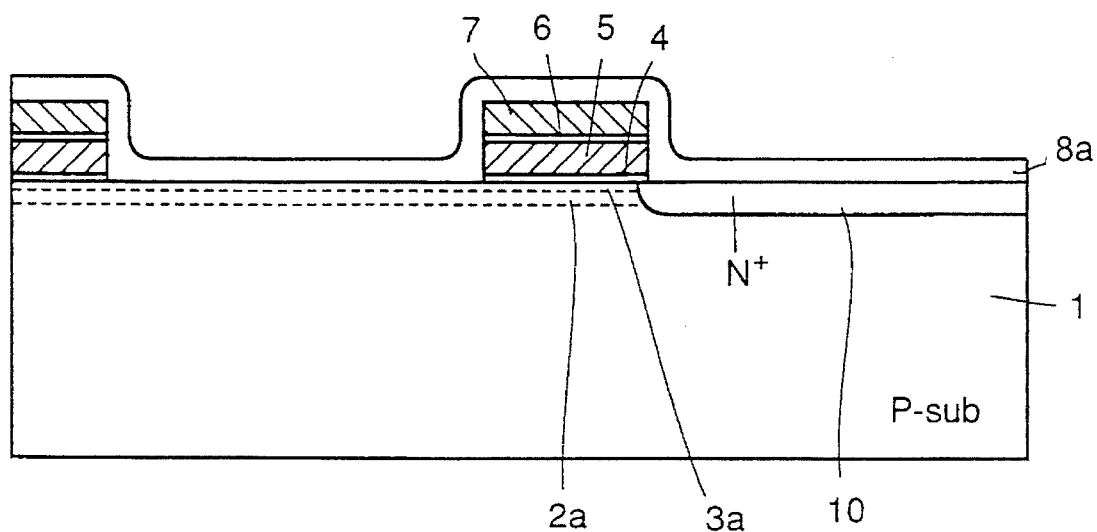
Figure 9:
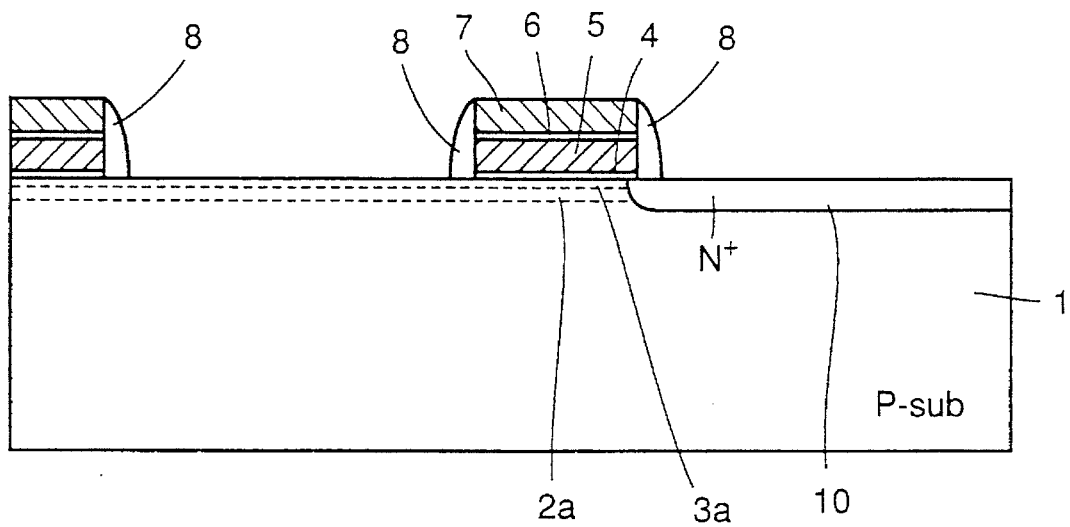

After forming an oxide layer 8a of about 2000 Å in thickness on the entire surface, as shown in FIG. 8, anisotropic reactive ion etching is carried out. Thereby, the side wall oxide films 8 are formed as shown in FIG. 9. The side wall oxide film 8 thus formed is 2000 Å in length in a direction along the main surface of the P-type silicon substrate 1. Thus, the length of the side wall oxide film 8 in the direction along the main surface of P-type silicon substrate 1 is nearly equal to the thickness of oxide layer 8a (see FIG. 8). Therefore, adjustment of the thickness of oxide film layer 8 enables easy control of the length of the side wall oxide film 8 in the direction along the main surface of P-type silicon substrate 1.

Figure 10:
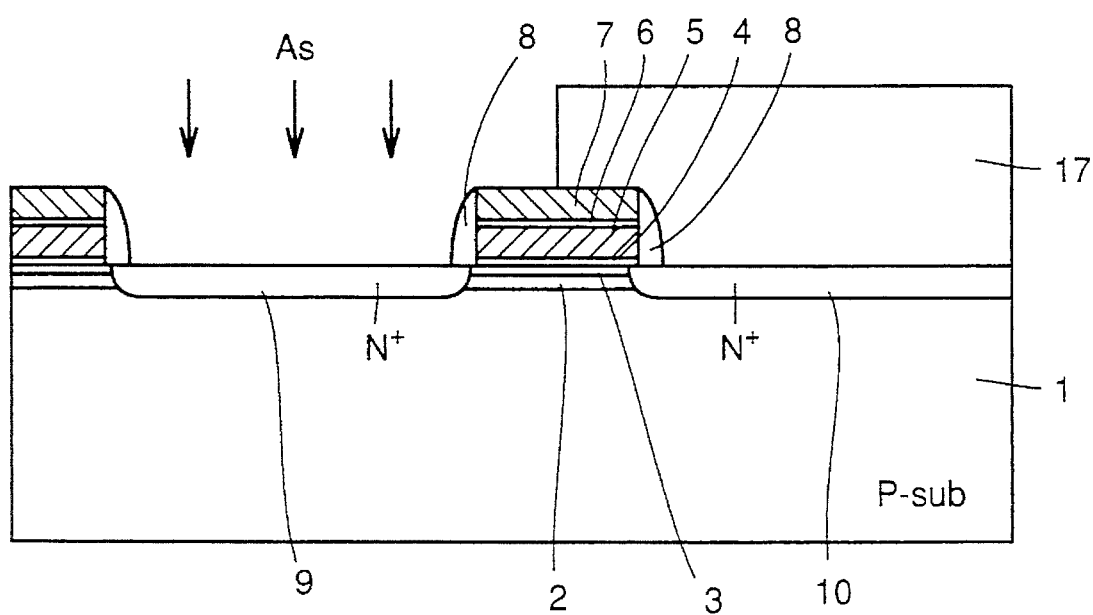

Then, as shown in FIG. 10, the source diffusion region 10 is covered with a resist 17. Using the resist 17, control gate electrode 7 and side wall oxide films 8 as a mask, arsenic (As) is ion-implanted into the P-type silicon substrate 1 under the conditions of 35 KeV and $5\times10^{15}/cm^2$. Thereby, the drain diffusion region 9 is formed. Since the drain diffusion region 9 is formed using the side wall oxide films 8 as a mask, the drain diffusion region 9 is located at a position not overlapping the floating gate electrode 5 in a plan view. Thus, the memory cell transistor having an offset structure in the drain diffusion region 9 side is formed. The amount of offset of the drain diffusion region 9 can be easily controlled by adjusting, for example, the length of side wall oxide films 8 in the direction along the main surface of the silicon substrate 1. Owing to the formation of the drain diffusion region 9, the memory cell transistor of a so-called buried channel type is completed in which the N-type impurity layer 3 is formed in the surface region of the channel region. The P-type impurity layer 2 covering the N-type impurity layer 3 is formed at a depth smaller than the depth of junction between the drain diffusion region 9 and source diffusion region 10, as described before. After forming the drain diffusion region 9 in this manner, the resist 17 is removed.

Figure 11:
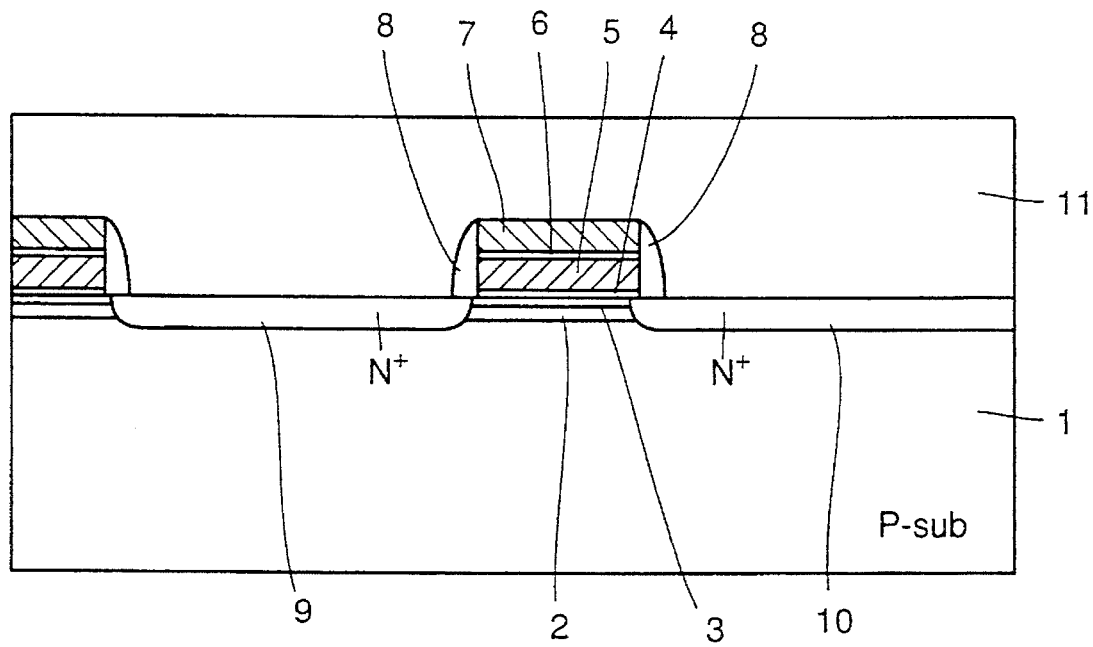

As shown in FIG. 11, a CVD method or the like is used to form the interlayer insulating film 11 of about 5000 to 15000 Å in thickness, and then a heat treatment is carried out by a reflow method under the thermal conditions of 800° to 1000° C. for flattening or smoothening the surface thereof. The interlayer insulating film 11 is a multilayer film formed of a non-doped oxide film and a PSG or BPSG film, or is a multilayer film formed of a non-doped oxide film, nitride film and a PSG or BPSG film.

Figure 12:
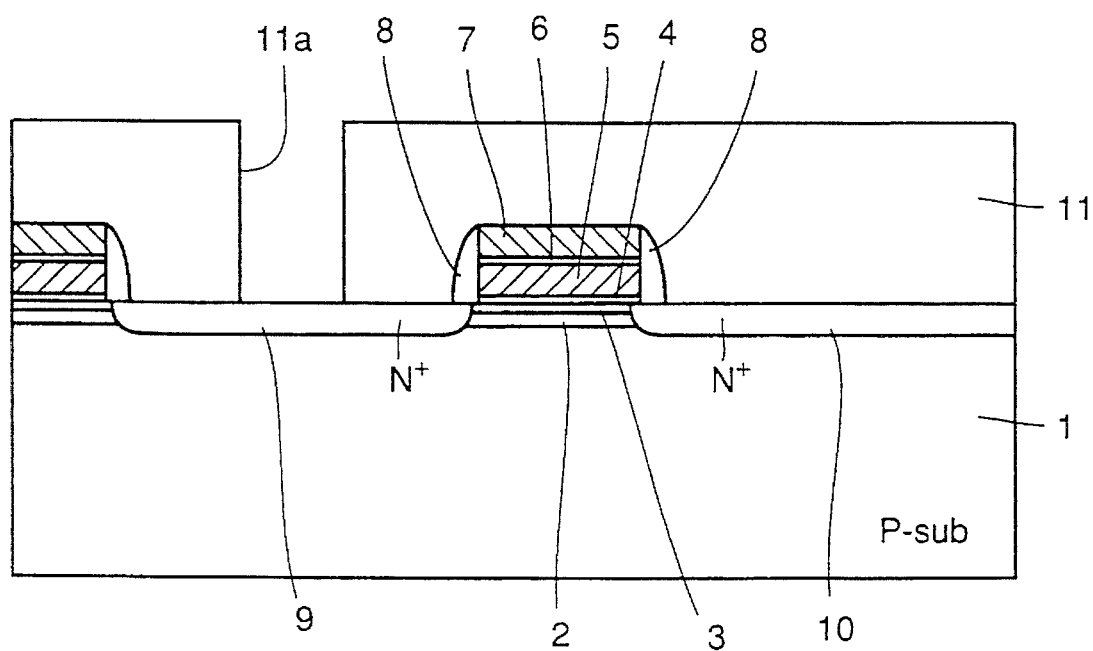

Then, as shown in FIG. 12, the contact hole 11a having the size of opening of about 0.6 to 1.5 µm is formed at a region in the interlayer insulating film 11 located on the drain diffusion region 9.

Figure 13:
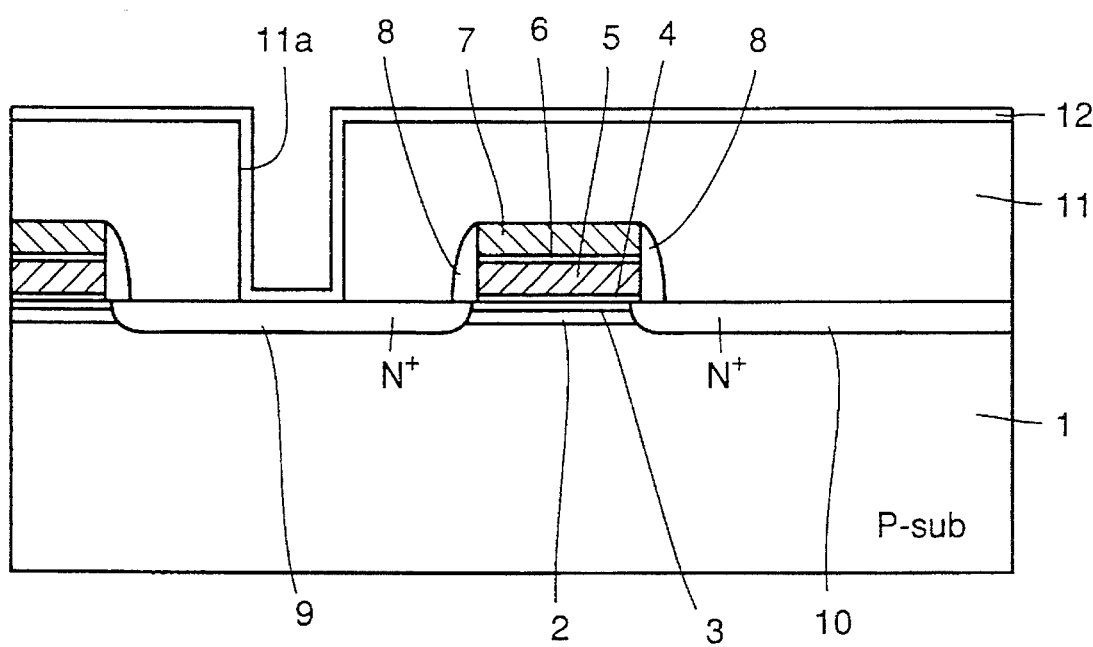

As shown in FIG. 13, the titanium alloy film 12 made of TiN film and having a thickness of about 500 Å is formed. The titanium alloy film 12 extends over the surface of the interlayer insulating film 11, and has a portion which is located in the contact hole 11a and is electrically connected to the drain diffusion region 9.

Finally, as shown in FIG. 1, a sputtering method or the like is used to form the aluminium alloy film 13 of about 10000 Å in thickness on the titanium alloy film 12. With photolithography and dry etching technique, the titanium alloy film 12 and aluminium alloy film 13 are patterned. Thereby, the bit line which is formed of the titanium alloy film 12 and aluminium alloy film 13 and is electrically connected to the drain diffusion region 9 is formed. In this manner, the flash EEPROM of the first embodiment is completed.

Embodiment 2

Figure 2:
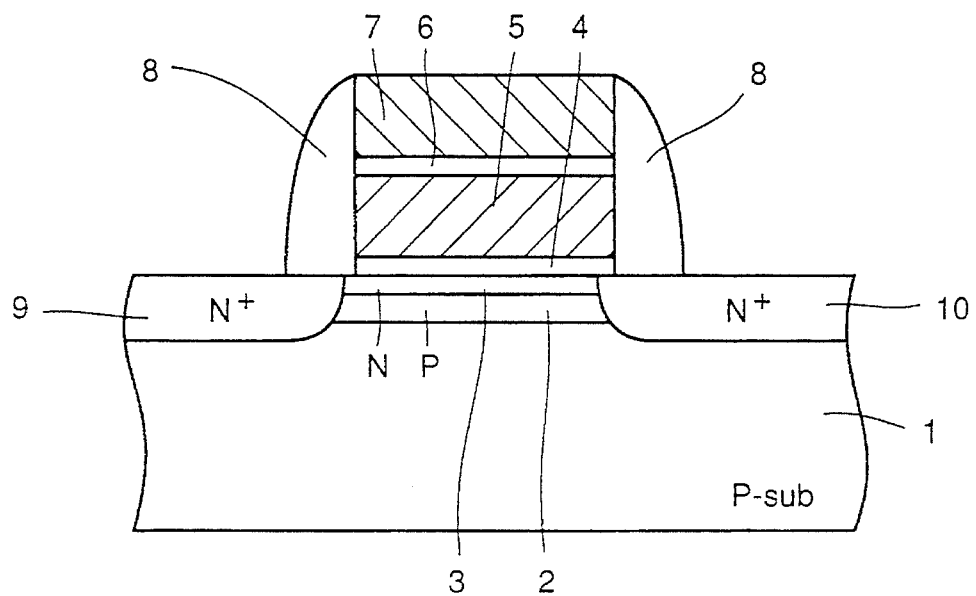
FIG. 2 is a cross section showing a memory cell part of the flash EEPROM of the first embodiment shown in FIG. 1.
Figure 14:
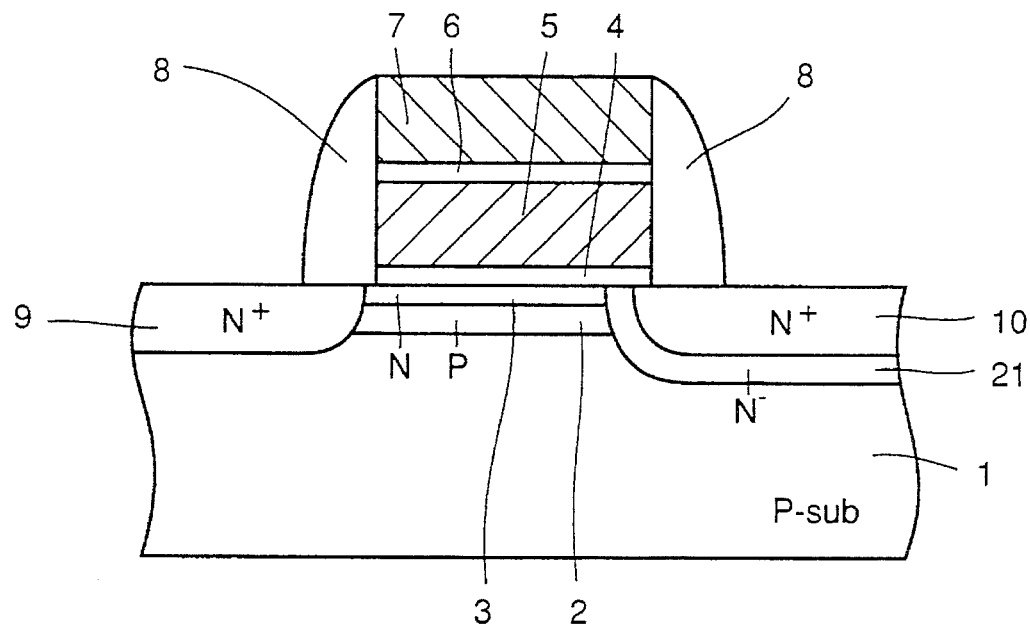
FIG. 14 is a cross section showing a memory cell part of a flash EEPROM of a stacked gate type according to a second embodiment of the invention.

Referring to FIG. 14, a flash EEPROM of a second embodiment has basically the same structure as the flash EEPROM of the first embodiment shown in FIGS. 1 and 2. The second embodiment further includes an $N^-$ impurity diffusion region 21 covering the source diffusion region 10.

This achieves an effect that the interband tunneling which occurs near the source diffusion layer 10 in the data erasing operation can be further suppressed, in addition to the effect already described with reference to the first embodiment. More specifically, since the N⁻ impurity diffusion region 21 is formed at all the boundary regions between the N-type source diffusion region 10 and P-type impurity layer 2 and between the N-type source diffusion region 10 and P-type silicon substrate 1, the concentration of electric field at the boundary regions can be suppressed. This can further suppress the interband tunneling which occurs near the source diffusion region 10 in the data erasing operation. This enables more effective prevention of deterioration of the endurance characteristic, i.e., a phenomenon in which holes generated by the interband tunneling are trapped by the oxide film 4 and thereby draw of electrons from the floating gate electrode 5 becomes difficult.

Figure 15:
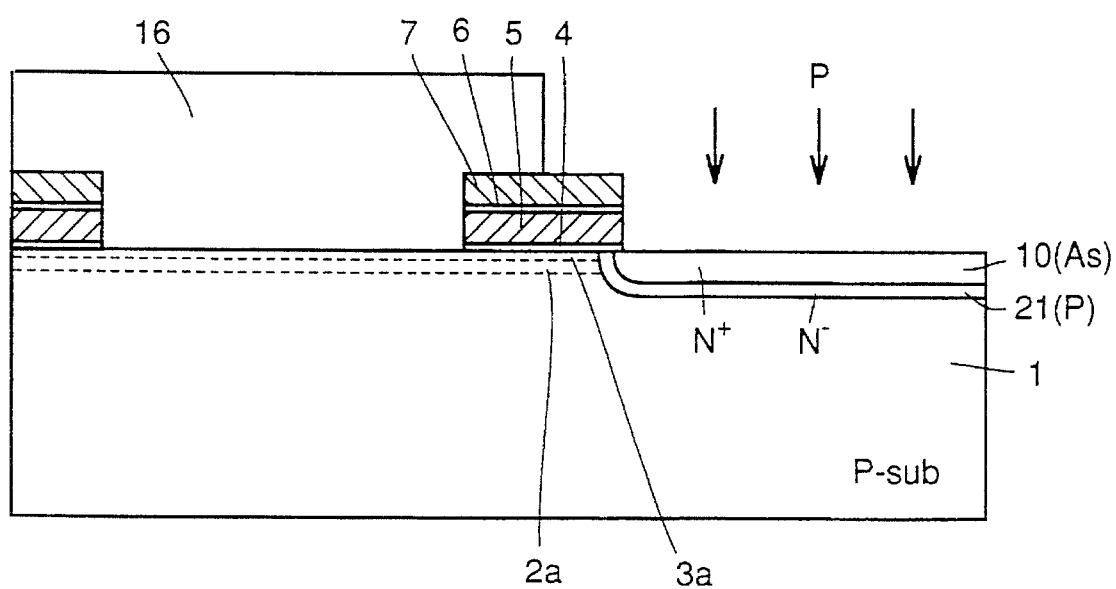
FIG. 15 is a cross section showing a manufacturing process of the flash EEPROM of the second embodiment shown in FIG. 14.

Referring to FIG. 15, in a manufacturing process of the flash EEPROM of the second embodiment, steps before formation of the source diffusion region 10 are the same as those in the manufacturing process of the flash EEPROM of the first embodiment shown in FIGS. 3–7. After the formation of the source diffusion region 10, the same resist 16 is used as a mask, and phosphorus (P) is ion-implanted under conditions of 50 KeV and 5×10$^{14}$/cm$^2$. Thereby, the N⁻ impurity diffusion layer 21 is formed. Then, the manufacturing process similar to that of the first embodiment shown in FIGS. 8–13 are carried out for completing the flash EEPROM of the second embodiment.

Embodiment 3

Figure 16:
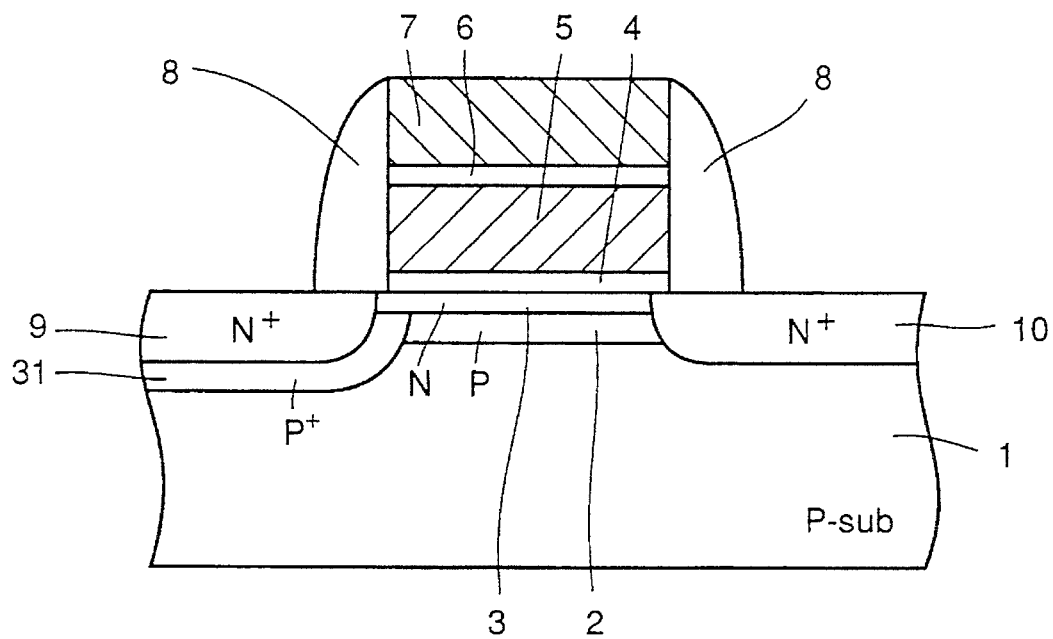
FIG. 16 is a cross section showing a memory cell part of a flash EEPROM of a stacked gate type according to a third embodiment of the invention.

Referring to FIG. 16, a flash EEPROM of a third embodiment has basically the same structure as the flash EEPROM of the first embodiment shown in FIGS. 1 and 2. This third embodiment further includes a P⁺ impurity diffusion layer 31 covering the drain diffusion region 9. This achieves an effect that the writing efficiency in the data writing operation can be further improved. More specifically, since all the junction regions of the N-type drain diffusion region 9 are covered with the P⁺ impurity diffusion layer 31, a high electric field tends to occur easily at the boundary region between the drain diffusion region 9 and P⁺ impurity diffusion layer 31 in the data writing operation, which promotes the avalanche phenomenon. This results in increase of amount of electrons generated by the avalanche phenomenon, and thus electrons thus generated can easily flow into the floating gate electrode 5 in the data writing operation. Further, owing to the effect described in connection with the first embodiment, the high electric field region is not formed on the surface of the P-type silicon substrate 1, so that the drain disturb phenomenon can be prevented. Therefore, the writing efficiency can be further improved, as compared with the flash EEPROM of the first embodiment shown in FIGS. 1 and 2.

Figure 17:
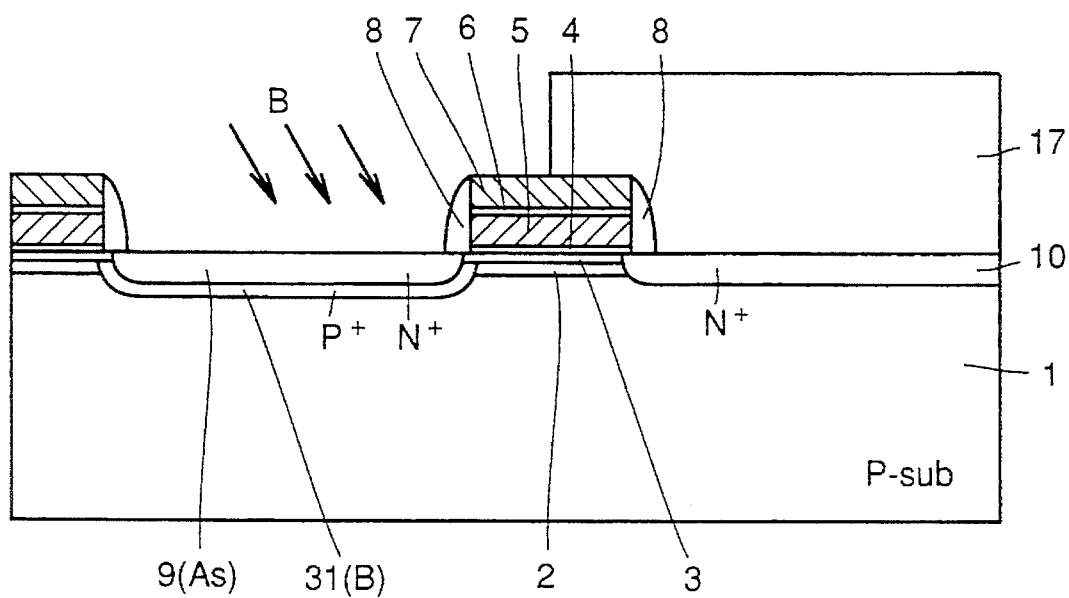
FIG. 17 is a cross section showing a manufacturing process of the flash EEPROM of the third embodiment shown in FIG. 16.

Referring to FIG. 17, in a manufacturing process of the flash EEPROM of the third embodiment, steps before formation of the drain diffusion region 9 are the same as those in the manufacturing process of the flash EEPROM of the first embodiment shown in FIGS. 3–10. After the formation of the drain diffusion region 9, the same resist 17 is used as a mask, and the P⁺ impurity diffusion layer 31 is formed. More specifically, using the resist 17 as a mask, boron (B) is ion-implanted into the P-type silicon substrate 1 under conditions of 45°, 50 KeV and not more than 1×10$^{13}$/cm$^2$ by an oblique rotary ion implanting method to form the P⁺ impurity diffusion layer 31. Then, the manufacturing process similar to that of the first embodiment shown in FIGS. 11–13 are carried out for completing the flash EEPROM of the third embodiment.

Embodiment 4

Figure 18:
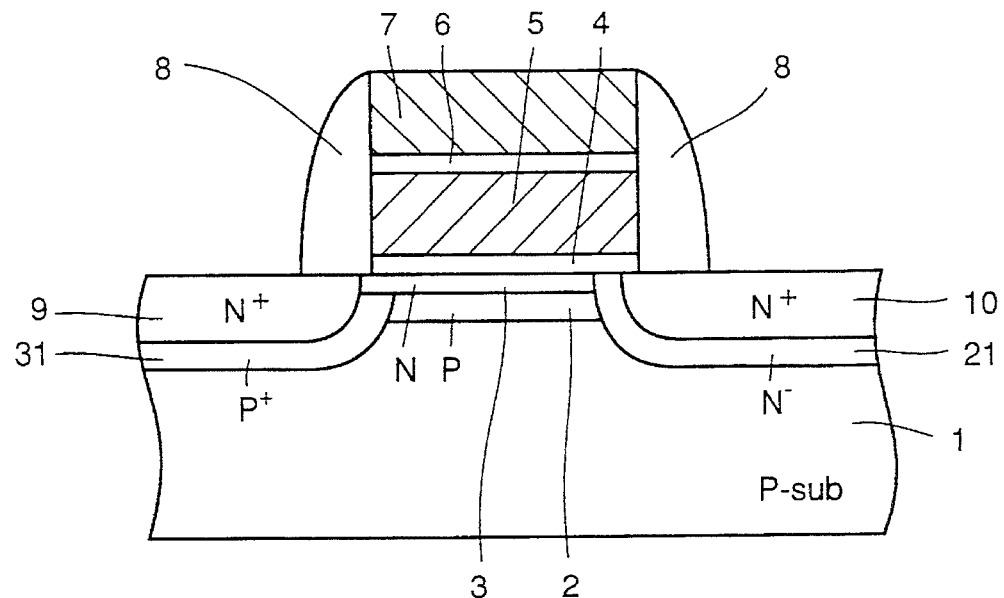
FIG. 18 is a cross section showing a memory cell part of a flash EEPROM of a stacked gate type according to a fourth embodiment of the invention.

Referring to FIG. 18, a flash EEPROM of a fourth embodiment has a structure basically corresponding to combination of the flash EEPROMs of the second and third embodiments shown in FIGS. 14 and 16. More specifically, the fourth embodiment includes the N⁻ impurity diffusion layer 21 covering the source diffusion region 10 and also includes the P⁺ impurity diffusion layer 31 covering the drain diffusion region 9. Thereby, the fourth embodiment can achieve both the effects described in connection with the second and third embodiments, in addition to the effect described in connection with the first embodiment. More specifically, the N⁻ impurity diffusion layer 21 can suppress the interband tunneling which occurs near the source diffusion region 10 in the data writing operation, and the P⁺ impurity diffusion layer 31 can promote the avalanche phenomenon in the data writing operation. Thereby, it is possible to prevent deterioration of the endurance characteristic which occurs in the data erasing operation and to improve the writing efficiency in the data writing operation to a higher extent.

Figure 19:
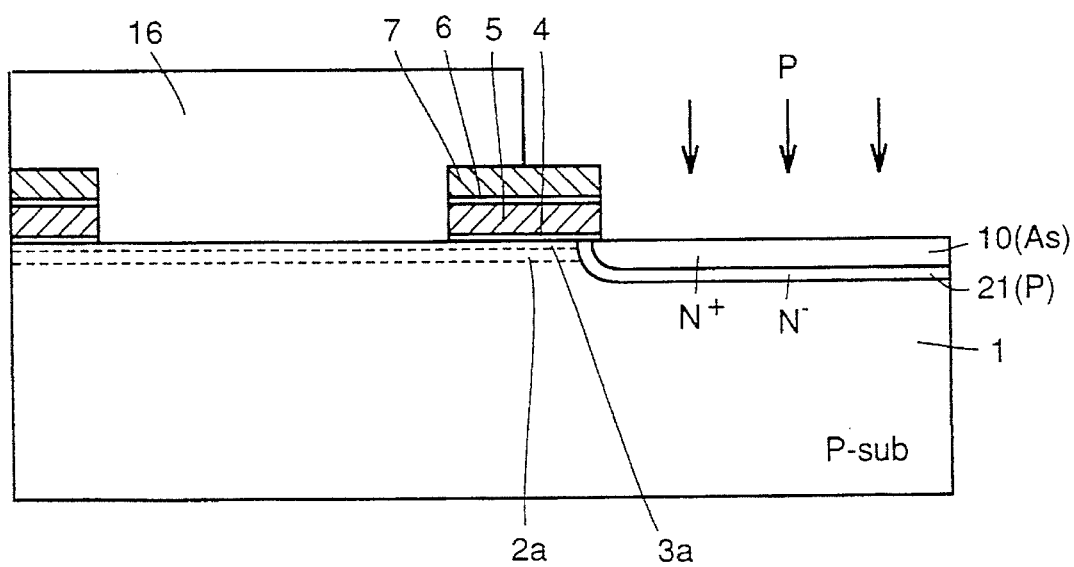
FIGS. 19 and 20 are cross sections showing first and second steps of a manufacturing process of the flash EEPROM of the fourth embodiment shown in FIG. 18.
Figure 20:
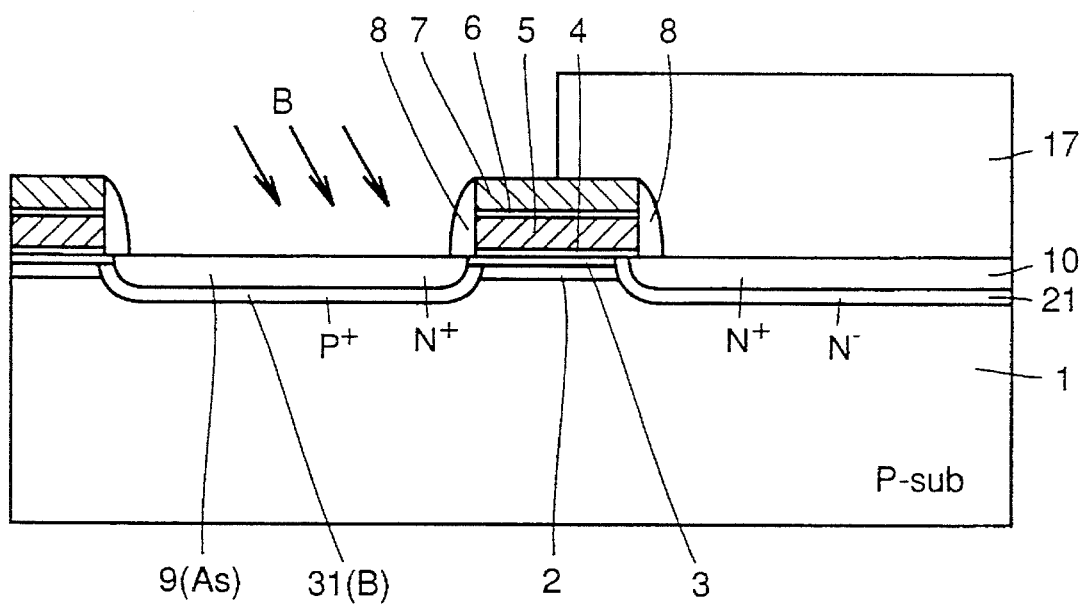

Referring to FIG. 19, in a manufacturing process of the flash EEPROM of the fourth embodiment, steps before formation of the source diffusion region 10 are the same as those in the manufacturing process of the flash EEPROM of the first embodiment shown in FIGS. 3–7. After the formation of the source diffusion region 10, the same resist 16 is used as a mask, and phosphorus (P) is ion-implanted into the P-type silicon substrate 1 under conditions of 50 KeV and 5×10$^{14}$/cm$^2$ to form the N⁻ impurity diffusion region 21. Thereafter, the drain diffusion region 9 is formed through the manufacturing process similar to that of the first embodiment shown in FIGS. 8–10. Then, as shown in FIG. 20, using the same resist 17 as a mask, boron (B) is ion-implanted into the P-type silicon substrate 1 under conditions of 45°, 50 KeV and not more than 1×10$^{13}$/cm$^2$ by an oblique rotary ion implanting method to form the P⁺ impurity diffusion layer 31. Then, the manufacturing process similar to that of the first embodiment shown in FIGS. 11–13 are carried out for completing the flash EEPROM of the fourth embodiment.

Embodiment 5

Figure 21:
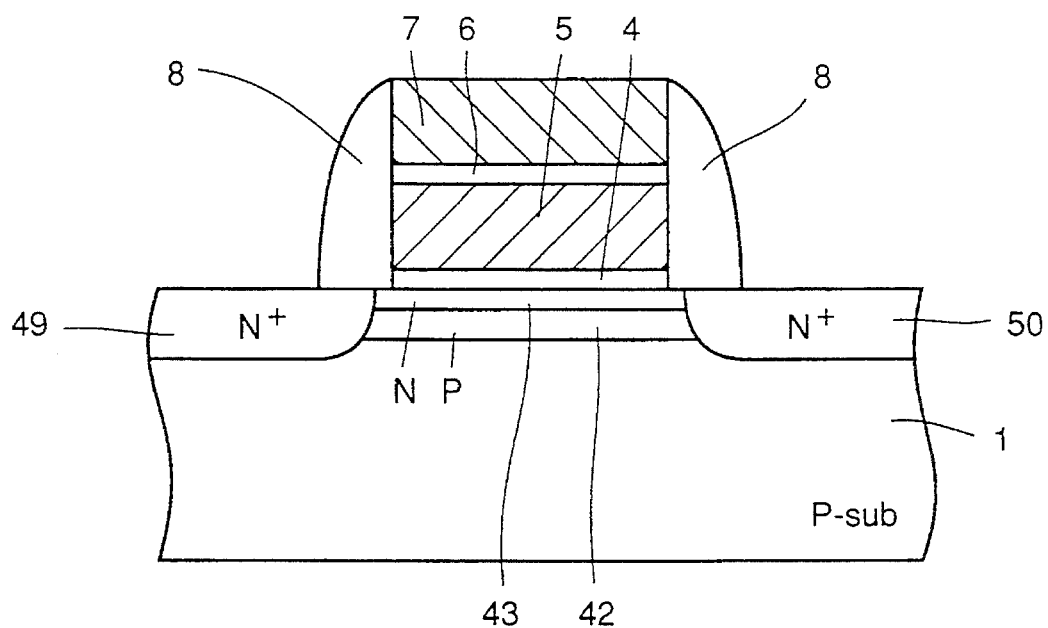
FIG. 21 is a cross section showing a memory cell part of a flash EEPROM of a stacked gate type according to a fifth embodiment of the invention.

Referring to FIG. 21, a fifth embodiment differs from the first embodiment shown in FIG. 2 in that not only a drain diffusion region 49 but also a source diffusion region 50 has an offset structure. Thereby, an effect that the manufacturing process is facilitated can be obtained as will be described later, in addition to the effect already described in connection with the first embodiment.

Figure 22:
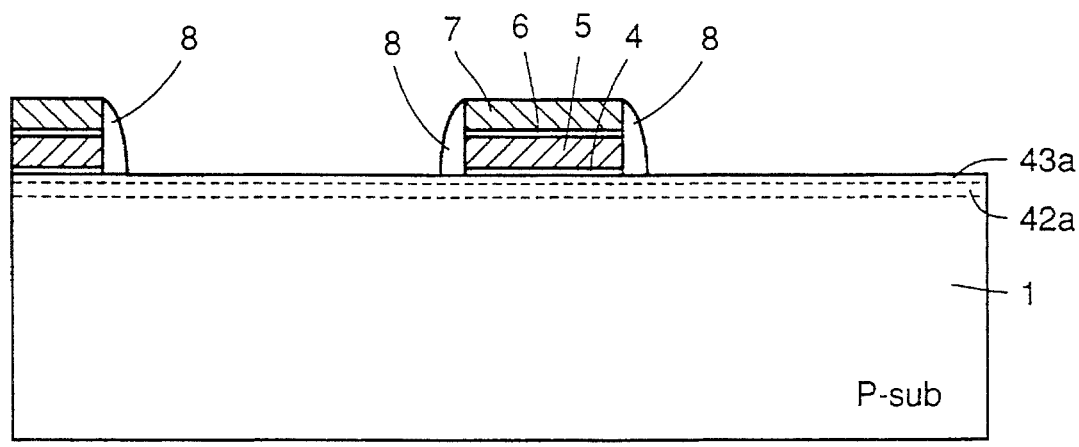
FIGS. 22 and 23 are cross sections showing first and second steps of a manufacturing process of the flash EEPROM of the fifth embodiment shown in FIG. 21.
Figure 23:
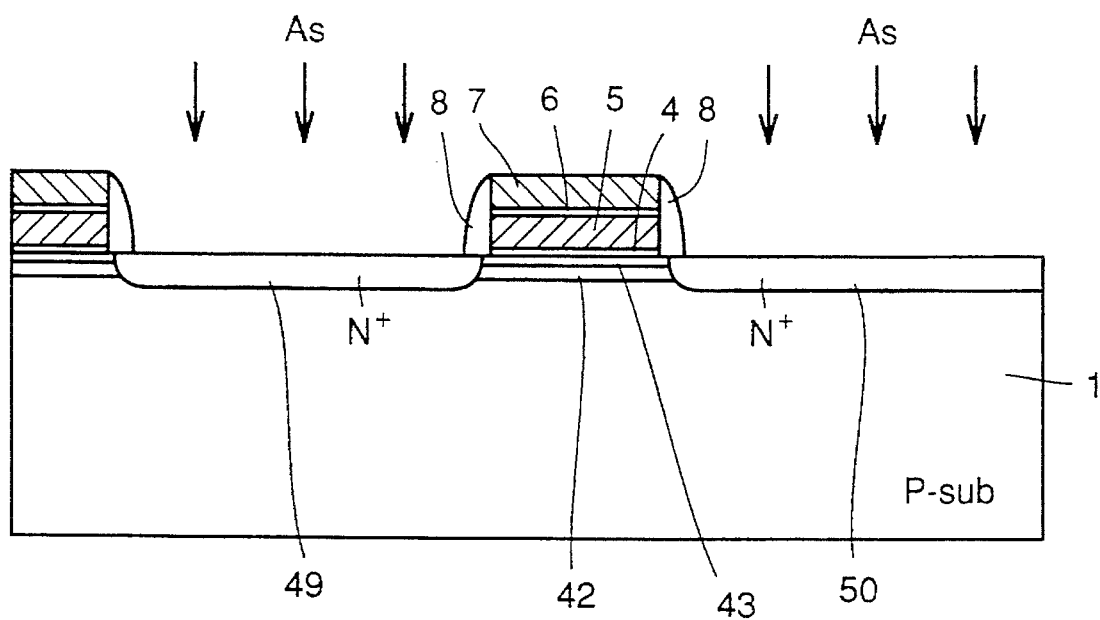

Referring to FIG. 22, in the manufacturing process of the fifth embodiment, the oxide film 4, floating gate electrode 5, interlayer insulating film 6 and control gate electrode 7 are formed through the manufacturing process similar to that of the first embodiment shown in FIGS. 3–6. Thereafter, the side wall oxide films 8 are formed on the opposite side walls of the control gate electrode 7 and floating gate electrode 5 through a manufacturing process similar to the manufacturing process shown in FIGS. 8 and 9. Then, as shown in FIG. 23, the control gate electrode 7 and side wall oxide film 8 are used as a mask, and arsenic (As) is ion-implanted into the P-type silicon substrate 1 under the conditions of 35 KeV and $5 \times 10^{15}/cm^2$ for simultaneously forming the drain diffusion region 49 and source diffusion region 50. In this fifth embodiment, since the drain diffusion region 49 and source diffusion region 50 are formed in the same manufacturing step, the manufacturing process can be simplified. Further, during the formation of the drain and source diffusion regions 49 and 50 in this fifth embodiment, it is not necessary to form the resist on the gate electrode 5 and the drain or source diffusion region, which is required in the first to fourth embodiments. For this reason, such a disadvantage does not occur that the resist cannot be formed due to limitation of shift of mask in the case where the floating gate electrode 5 has a short gate length in accordance with miniaturization of elements. As described above, the flash EEPROM of the fifth embodiment has the structure suitable to miniaturization of elements. Thereafter, the flash EEPROM of the fifth embodiment is completed through the manufacturing process similar to the manufacturing process of the first embodiment shown in FIG. 11–13.

Embodiment 6

Figure 24:
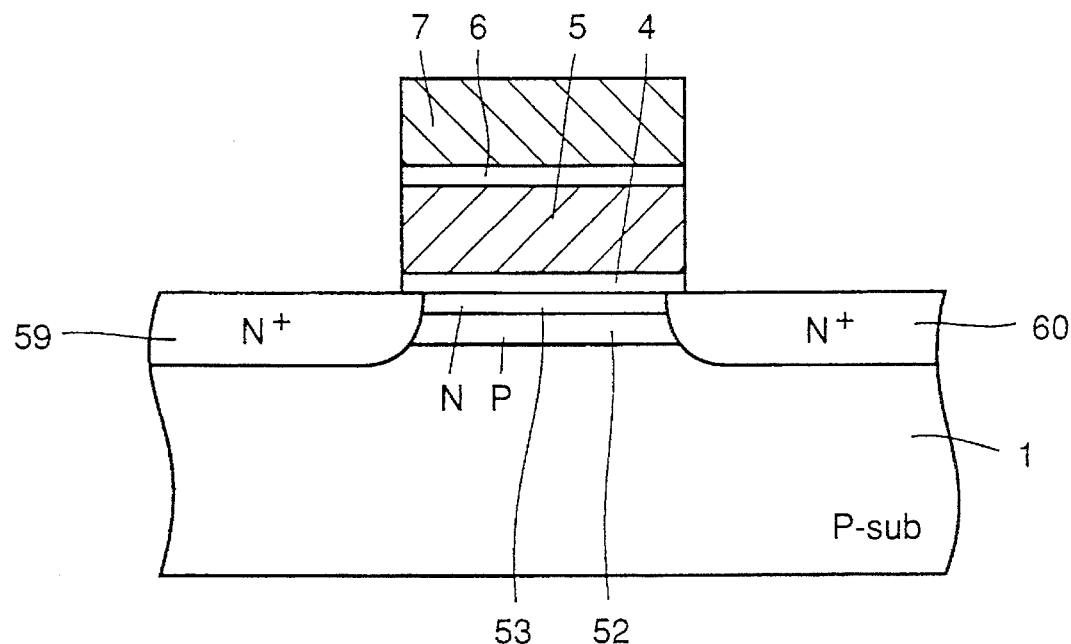
FIG. 24 is a cross section showing a memory cell part of a flash EEPROM of a stacked gate type according to a sixth embodiment of the invention.

Referring to FIG. 24, a flash EEPROM of a sixth embodiment has a structure different from that of the flash EEPROM of the first embodiment shown in FIG. 2 in that a drain diffusion region 59 does not has an offset structure and a side wall. Therefore, the sixth embodiment cannot effectively prevent the drain disturb phenomenon to an extent similar to that by the first embodiment. However, the sixth embodiment has the structure suitable to miniaturization, which is similar to the fifth embodiment, and can further simplify the manufacturing process, compared with the fifth embodiment. The manufacturing process in the sixth embodiment will be described below.

Figure 25:
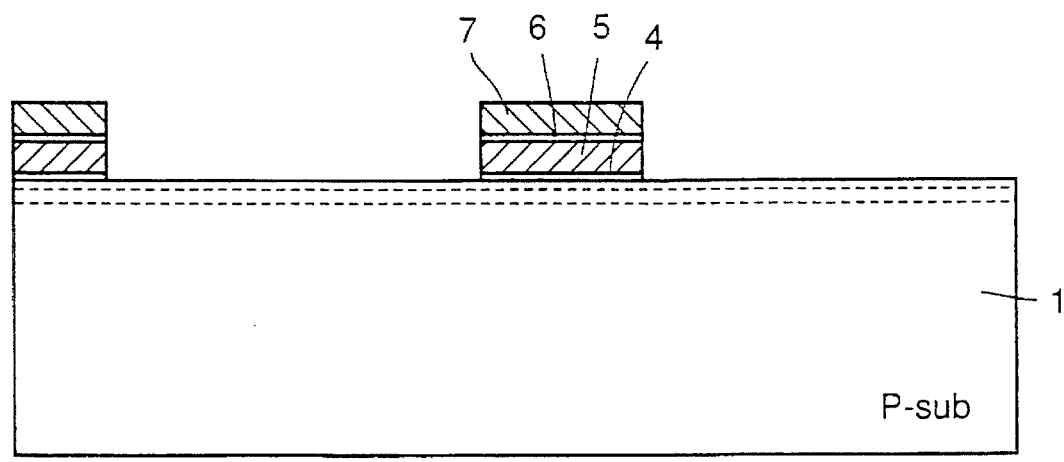
FIGS. 25 and 26 are cross sections showing first and second steps of a manufacturing process of the flash EEPROM of the sixth embodiment shown in FIG. 24.
Figure 26:
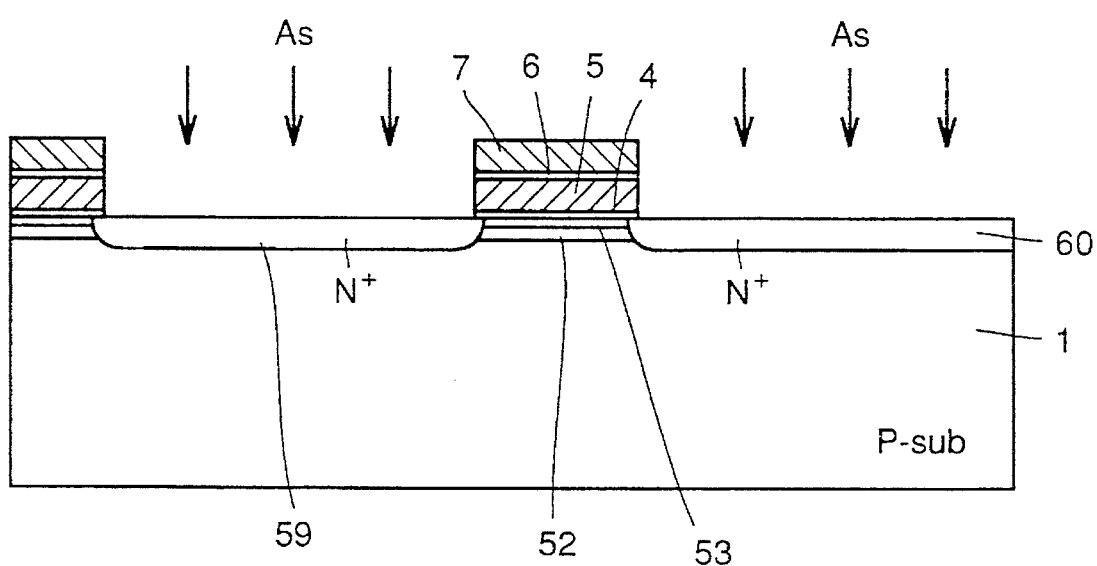

Referring to FIG. 25, the sixth embodiment employs the manufacturing process similar to that in the first embodiment shown in FIGS. 3–6 for forming the oxide film 4, floating gate electrode 5, interlayer insulating film 6 and control gate electrode 7. Thereafter, as shown in FIG. 26, the control gate electrode 7 is used as a mask, and arsenic (As) is ion-implanted into the P-type silicon substrate 1 under the conditions of 35 KeV and $5 \times 10^{15}/cm^2$ for simultaneously forming the drain diffusion region 59 and source diffusion region 60. In the sixth embodiment, the drain diffusion region 59 and source diffusion region 60 can be formed in the same step as described above, so that the manufacturing process can be simplified. Since neither the drain diffusion region 59 nor source diffusion region 60 employs the offset structure, it is not necessary to use the side wall oxide films as a mask for forming them. Therefore, the steps for forming the side wall oxide films can be eliminated, and thus the manufacturing process can be further simplified. After the manufacturing process shown in FIG. 26, the flash EEPROM of the sixth embodiment is completed through the manufacturing process similar to that of the first embodiment shown in FIGS. 11–13.

Embodiment 7

Figure 27:
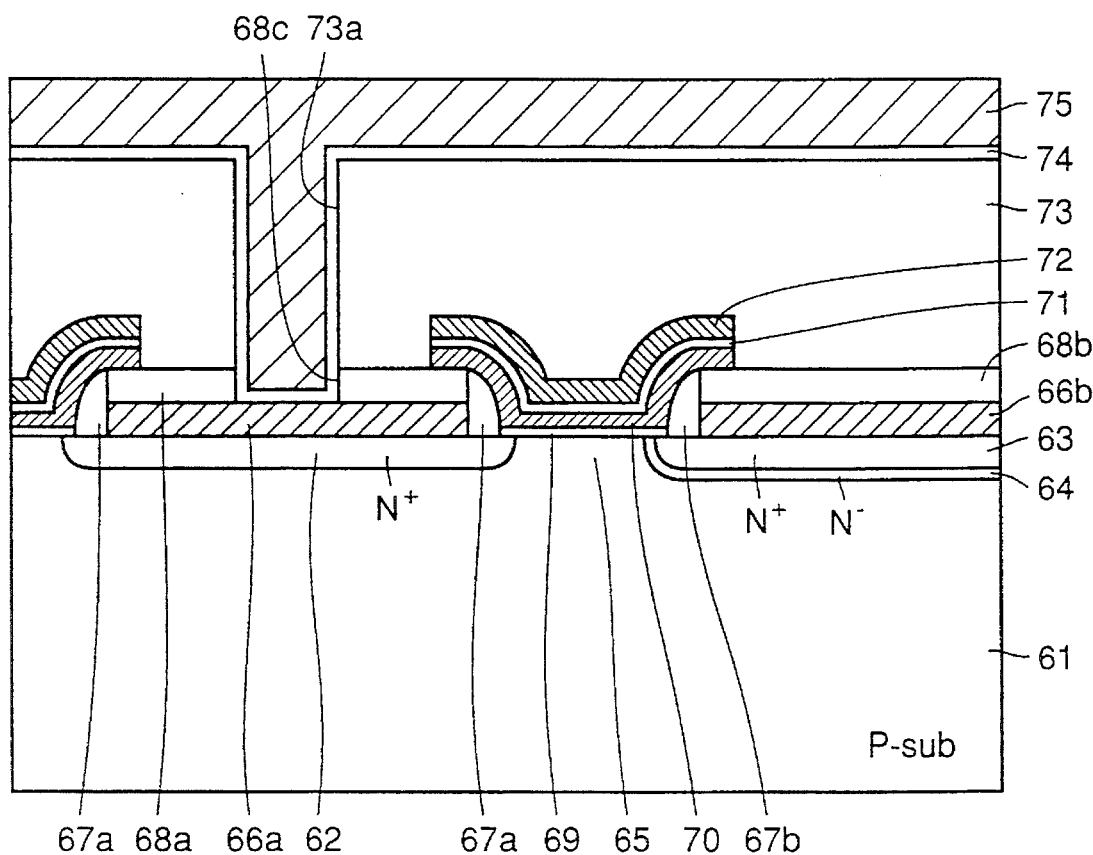
FIG. 27 is a cross section showing a memory cell part of a flash EEPROM of a seventh embodiment of the invention.

FIG. 27 is a cross section showing a memory cell part of a flash EEPROM of a seventh embodiment of the invention. Referring to FIG. 27, the flash EEPROM of the seventh embodiment includes an $N^+$-type drain diffusion region 62 and an $N^+$-type source diffusion region 63, which are formed on a main surface of a P-type silicon substrate 61 and are located at opposite sides of a channel region 65 with a predetermined space between each other. The $N^+$-type source diffusion region 63 is covered with an $N^-$-type source diffusion region 64. On the drain diffusion region 62, there is formed a drain conductive layer 66a having a thickness of about 500 to 2000 Å and made of a polysilicon layer containing N-type impurity doped thereinto. On the upper surface of the drain conductive layer 66a, there is formed an interlayer insulating film 68a made of a silicon oxide film and having a thickness of about 2000 Å. Side wall oxide films 67a made of silicon oxide films are formed on opposite side walls of the drain conductive layer 66a and interlayer insulating film 68a.

On the source diffusion region 63, there is formed a source conductive layer 66b having a thickness of about 500 to 2000 Å and made of a polysilicon layer containing N-type impurity doped thereinto. On the upper surface of the source conductive layer 66b, there is formed an interlayer insulating film 68b made of a silicon oxide film and having a thickness of about 2000 Å. Side wall oxide films 67b made of silicon oxide films are formed on opposite side walls of the source conductive layer 66b and interlayer insulating film 68b. An oxide film 69 of about 100 Å in thickness is formed on the channel region 65. A floating gate electrode 70 made of a polysilicon layer and having a thickness of about 1500 Å is formed on the oxide film 69, side wall oxide films 67a and 67b, and interlayer insulating films 68a and 68b. On the floating gate electrode 70, there is formed a multilayer film 71 having a thickness of about 200 Å and made of oxide and nitride films. On the multilayer film 71, there is formed a control gate electrode 72 made of a polysilicon layer and having a thickness of about 1500 Å.

There is formed an interlayer insulating film 73 of about 5000 to 15000 Å in thickness covering the entire surface and having a flattened upper surface. The interlayer insulating films 73 and 68a are provided with contact holes 73a and 68c, respectively. A titanium alloy film 74 (TiN film) of about 500 Å in thickness extends over the upper surface of the interlayer insulating film 73 and is electrically connected to the drain conductive layer in the contact holes 73c and 68c. An aluminium alloy interconnection layer 75 of about 10000 Å in thickness extends over the titanium alloy film 74 on the interlayer insulating film 73, and fills a region surrounded by the titanium alloy film 74 which is located in the contact holes 68c and 73a.

In this seventh embodiment, the source diffusion conductive layer 66b is in contact with the surface of the source diffusion region 63 forming the common source region of the plurality of memory transistors. Thereby, increase of resistance of the common source region 63 of the plurality of memory transistors can be effectively prevented even in the case where the size of source diffusion region 63 is reduced in accordance with the high integration of the semiconductor device. Consequently, delay of data signals can be prevented.

Instead of the polysilicon layer described above, the source conductive layer 66b may be formed of multiple layers of polycide, i.e., a tungsten silicide layer and a polysilicon layer, or may be formed of silicide of the polysilicon layer. In these structures, the resistance of the source diffusion region 63 can be further reduced.

FIGS. 28–37 are cross sections showing a manufacturing process of the flash EEPROM of the seventh embodiment shown in FIG. 27. Referring to FIGS. 27–37, the manufacturing process of the flash EEPROM of the seventh embodiment will be described below.

Figure 28:
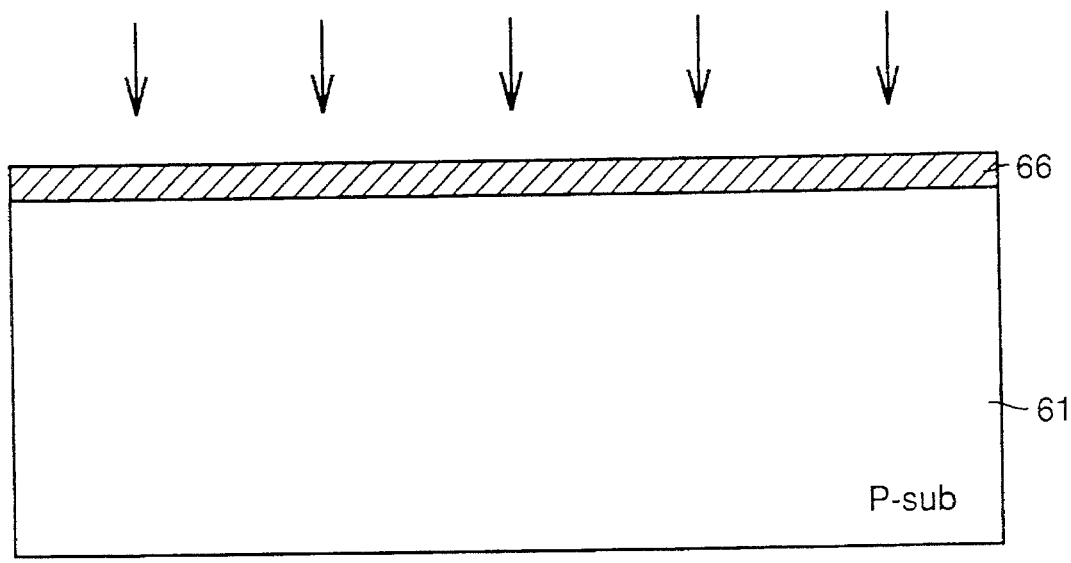
FIGS. 28–37 are cross sections showing first to tenth steps of a manufacturing process of the flash EEPROM of the seventh embodiment shown in FIG. 27.

First, as shown in FIG. 28, a well region and an element isolating oxide film (both not shown) are formed in predetermined regions on the main surface of P-type silicon substrate 61. Then, the polysilicon layer 66 of about 500 to 2000 Å in thickness is formed on the P-type silicon substrate 61 by the CVD method. Arsenic is ion-implanted into the polysilicon layer 66 under conditions of 50 KeV and $4 \times 10^{15}/\text{cm}^2$.

Figure 29:
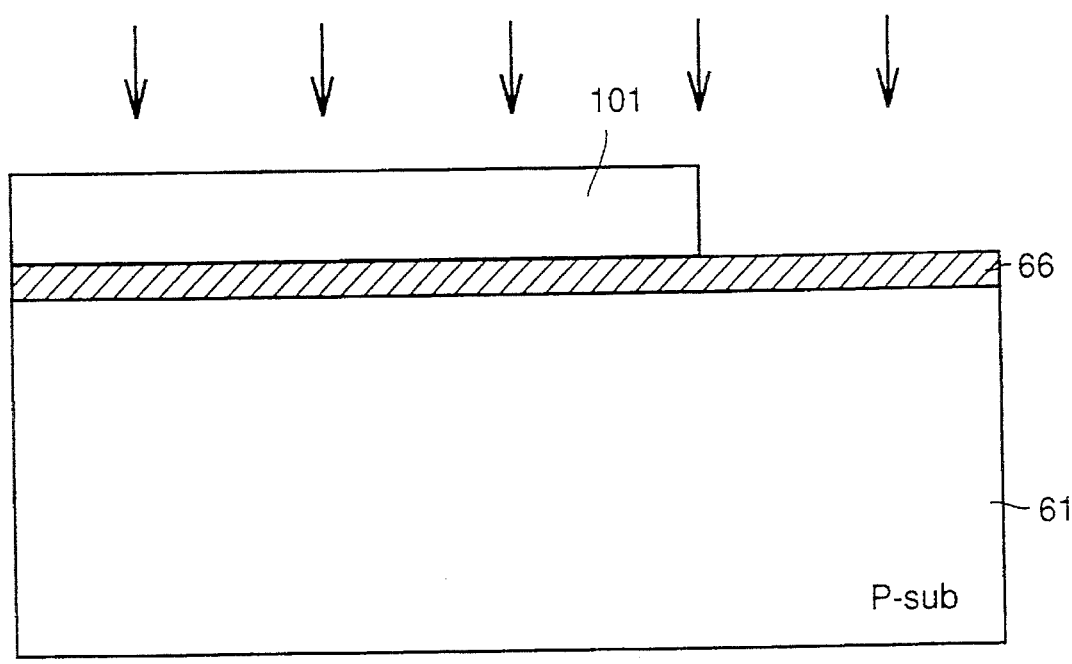

As shown in FIG. 29, photolithography is used to form a resist 101 on the polysilicon layer 66 located above the regions which will be the channel region and drain diffusion region. Using the resist 101 as a mask, phosphorus is ion-implanted into the polysilicon layer 66 under conditions of 50 KeV and not more than $10^{14}/\text{cm}^2$. Thereafter, the resist 101 is removed.

Figure 30:
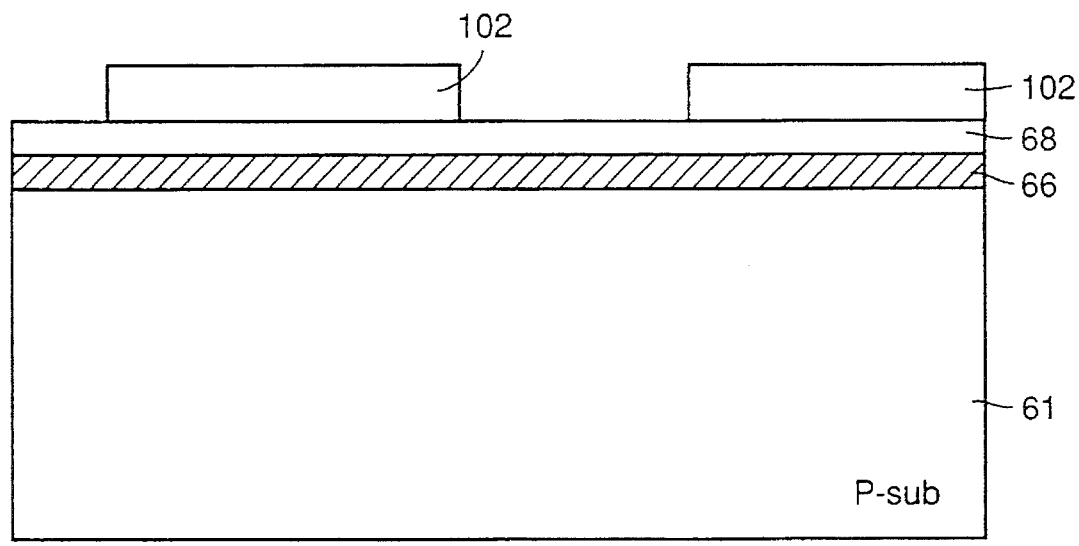
Figure 31:
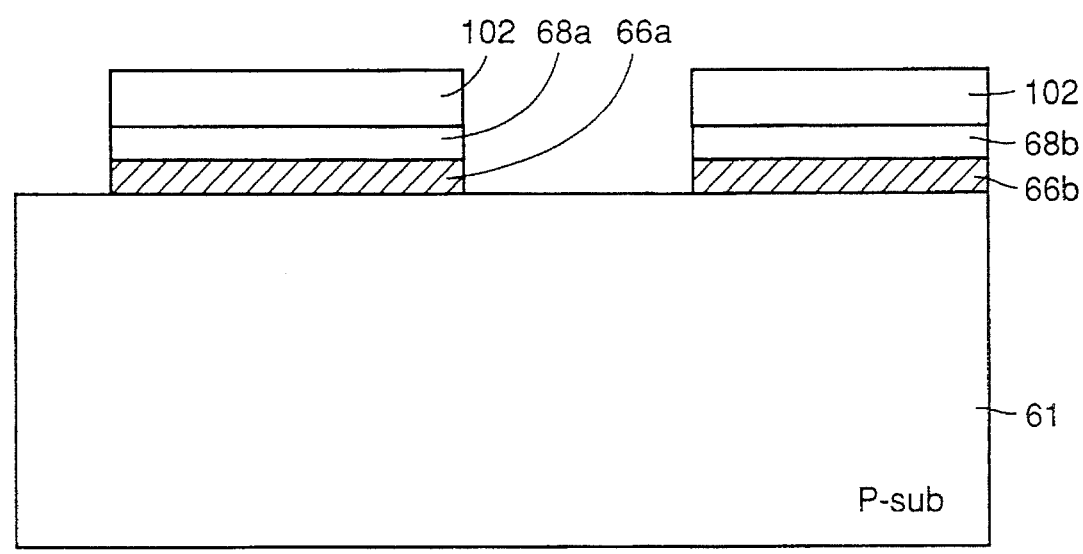

As shown in FIG. 30, the silicon oxide film 68 of about 2000 Å in thickness is deposited on the polysilicon layer 66 by the CVD method. A resist 102 is formed in a predetermined region on the silicon oxide film 68. Using the resist 102 as a mask, anisotropic etching is carried out for patterning the silicon oxide film 68 and polysilicon layer 66. Thereby, the drain conductive layer 66a, source conductive layer 66b and interlayer insulating films 68a and 68 shown in FIG. 31 are completed. Thereafter, the resist 102 is removed.

Figure 32:
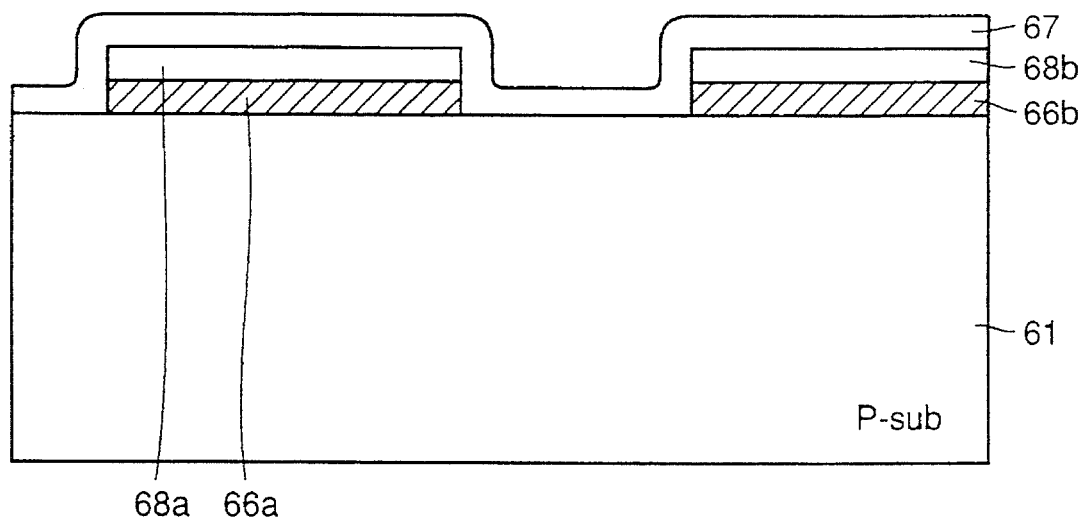
Figure 33:
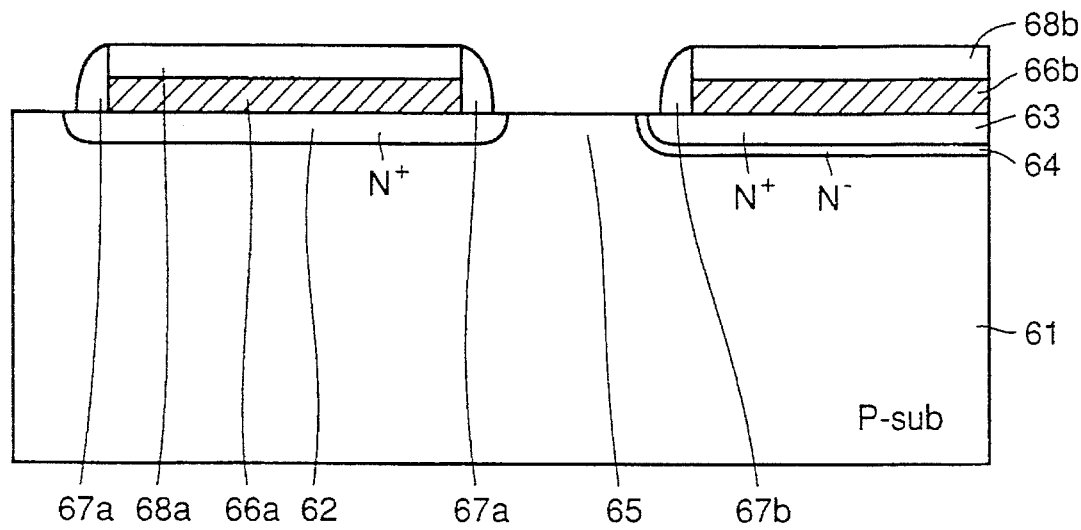

As shown in FIG. 32, the polysilicon oxide film 67 of about 1000 Å in thickness is formed on the whole surface, and then reactive ion etching (anisotropic etching) is applied to the silicon oxide film 67, whereby the side wall oxide films 67a and 67b are formed, as shown in FIG. 33. Thereafter, heat treatment is carried out for diffusing the arsenic and phosphorus from the source conductive layer 66b and diffusing the arsenic from the drain conductive layer 66a. Thereby, the $N^+$-type source diffusion region 63, $N^-$-type source diffusion region 64 and $N^+$-type drain diffusion region 62 are formed. The source diffusion regions 63 and 64 as well as the drain diffusion region 62 are provided with side surfaces protruded beyond the side wall oxide films 67a and 67b toward the channel region 65

Figure 34:
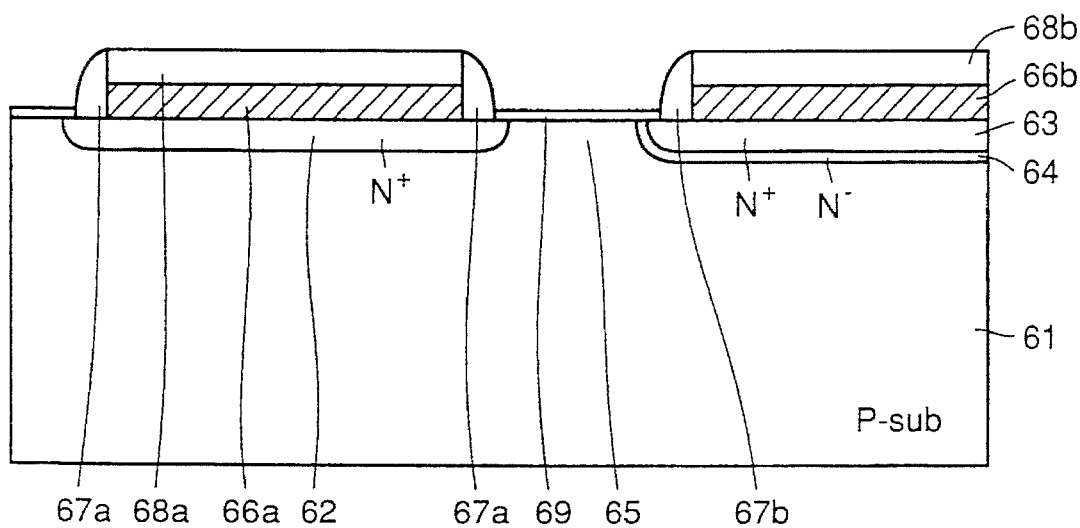

Then, as shown in FIG. 34, the oxide film 69 of about 100 Å in thickness is formed on the main surface of the P-type silicon substrate 61 located in the channel region 65.

Figure 35:
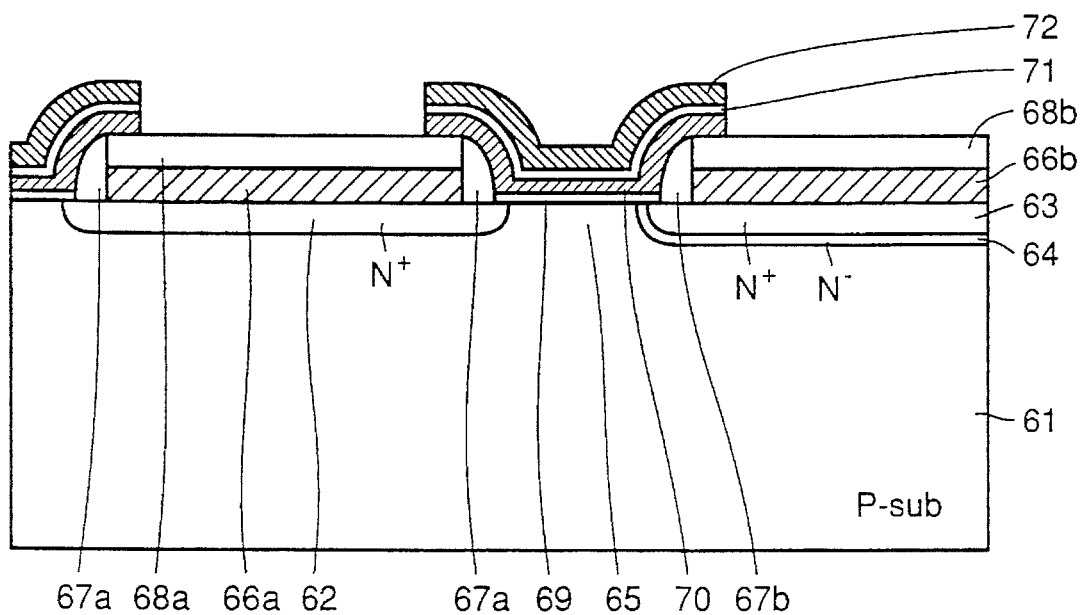

As shown in FIG. 35, the CVD method is used to form a polysilicon layer (not shown) of about 1500 Å in thickness on the entire surface by the CVD method, and then a multilayer film layer (not shown) of an oxide film and a nitride film having a total thickness of about 200 Å is formed on the polysilicon layer. Then, a polysilicon layer (not shown) of about 1500 Å in thickness is formed on the multilayer film. These polysilicon layer and multilayer film are patterned to provide the floating gate electrode 70 made of the polysilicon layer, the multilayer film 71 made of the oxide and nitride films and the control gate electrode 72 made of the polysilicon layer. In this step, the floating gate electrode 70 is formed to extend over the side wall oxide films 67a and 67b and the interlayer insulating films 68a and 68b.

Figure 36:
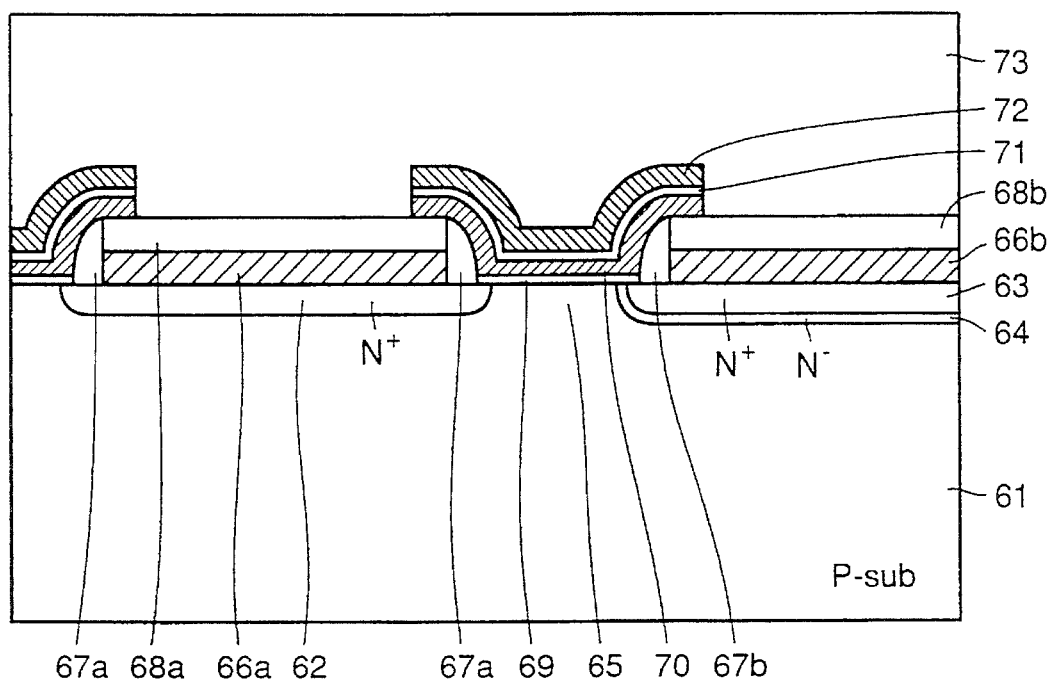

As shown in FIG. 36, the interlayer insulating film 73 of about 5000 to 15000 Å in thickness is formed on the whole surface by the CVD method or the like. This interlayer insulating film 73 is formed of, e.g., a multilayer film including a PSG film or a BPSG film and a non-doped oxide film. The interlayer insulating film 73 is subjected to the heat treatment under thermal conditions of 800° to 1000° C. for flattening the upper surface thereof.

Figure 37:
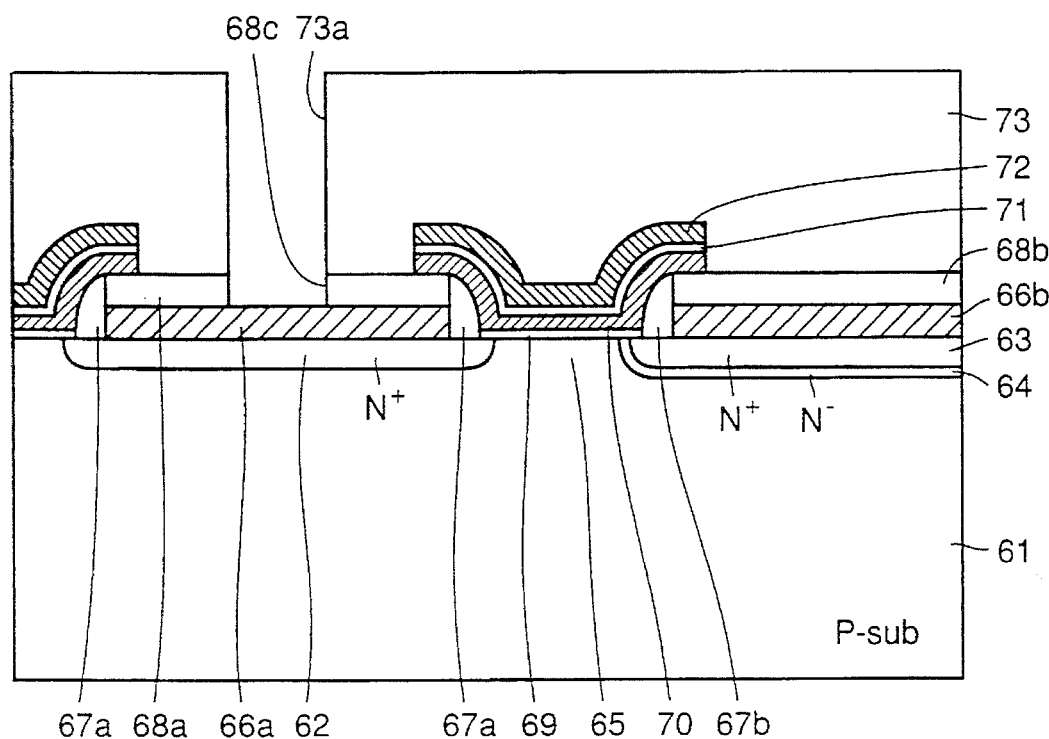

As shown in FIG. 37, the contact holes 68c and 73a are formed in the interlayer insulating films 68a and 73 located above the drain conductive layer 66a. The contact holes 68c and 73a have an opening size of about 0.6 to 1.5 μm.

Finally, as shown in FIG. 27, the TiN film 74 is formed to the thickness of about 500 Å which is electrically connected in the contact holes 68c and 73a to the drain conductive layer 66a and extends over the upper surface of the interlayer insulating film 73,. Further, the aluminium alloy film 75 of about 10000 Å in thickness is formed on the TiN film 74. In this manner, the flash EEPROM of the seventh embodiment of the invention is completed.

Embodiment 8

Figure 38:
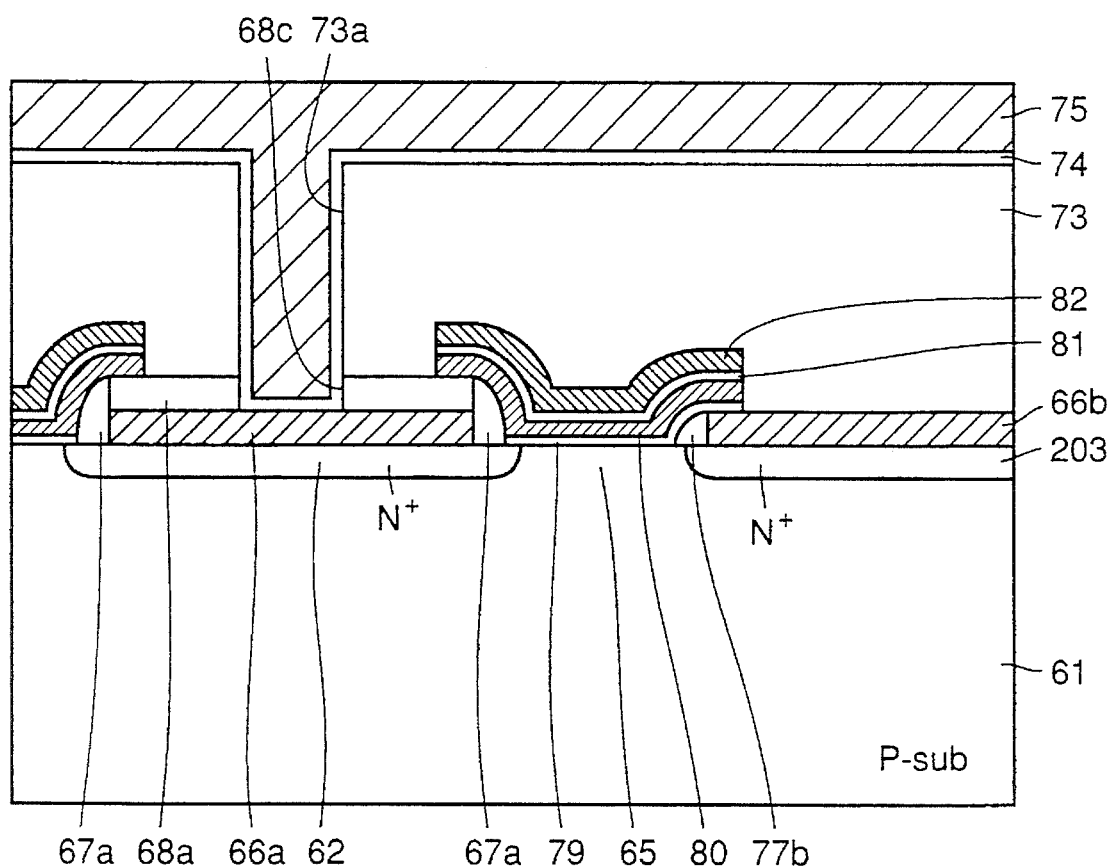
FIG. 38 is a cross section showing a memory cell part of a flash EEPROM of an eighth embodiment of the invention.

FIG. 38 is a cross section showing a memory cell part of a flash EEPROM of an eighth embodiment of the invention. Referring to FIG. 38, the flash EEPROM of the eighth embodiment differs form the seventh embodiment shown in FIG. 27 in that an oxide film 79 formed on the channel region is located also on and in contact with the source conductive layer 66b. Over the source conductive layer 66b, there are formed a floating gate electrode 80, a multilayer film 81 and a control gate electrode 82 with the oxide film 79 therebetween.

Further, this eighth embodiment is provided with an $N^+$-type source diffusion region 203 of a so-called offset structure. More specifically, the source diffusion region 203 is formed without protruding beyond the side wall oxide film 77b toward the channel region 65.

In the eighth embodiment thus structured, electrons can be drawn from a portion of the floating gate electrode overlapping the source conductive layer 66b toward the source conductive layer 66b. More specifically, by applying 0 V to the control gate electrode 82 in the data erasing operation and applying a high voltage of 10 to 12 V to the source conductive layer 66b, electrons can be drawn from the floating gate electrode 80 through the oxide film 79 to the source conductive layer 66b. Since the erasing operation is carried out between the source conductive layer 66b and the floating gate electrode 80, it is not necessary to overlap the source diffusion region 203 and the floating gate electrode 80 with each other, which is required in the prior art. In the eighth embodiment, therefore, the source diffusion region 203 can have the so-called offset structure. Owing to the offset structure of the source diffusion region 203, the interband tunneling occurring at the vicinity of the source diffusion region 203 is not located at a position immediately under the floating gate electrode 80 located on the channel region 65. Thereby, holes generated by the interband tunneling are prevented from being introduced into the oxide film 79 in the channel region 65. As a result, deterioration of the endurance characteristic, which may occur in the data erasing operation, can be effectively prevented.

Consequently, a good erasing characteristic can be easily obtained by increasing an area of overlapping portions of the floating gate electrode 80 and source conductive layer 66b.

In this eighth embodiment, the source conductive layer 66b is formed on the source diffusion region 203, which is similar to the seventh embodiment, so that increase of resistance of the source diffusion region 203 can be effectively prevented even if the size of source diffusion region 203 is reduced in accordance with miniaturization of elements.

Embodiment 9

Figure 39:
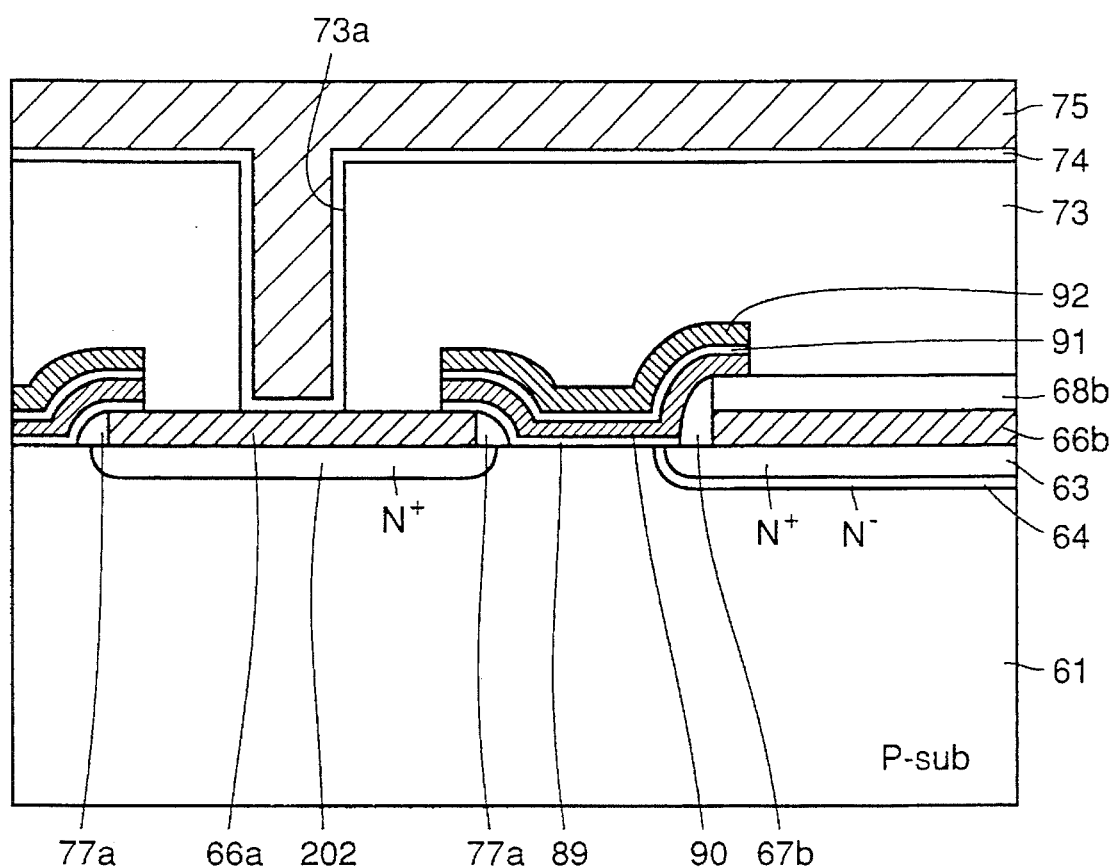
FIG. 39 is a cross section showing a memory cell part of a flash EEPROM of a ninth embodiment of the invention.

FIG. 39 is a cross section showing a memory cell part of a flash EEPROM of a ninth embodiment of the invention. Referring to FIG. 39, the flash EEPROM of the ninth embodiment includes an oxide film 89 of about 100 Å in thickness, which is formed on the channel region 65 and is also located on and in contact with the drain conductive layer 66a. Over the drain conductive layer 66a, there are formed a floating gate electrode 90, a multilayer film 91 and a control gate electrode 92 with the oxide film 89 therebetween. There is also formed a drain diffusion region 202 having a so-called offset structure.

In the ninth embodiment, the floating gate electrode 90 and drain conductive layer 66a overlap each other with the oxide film 89 therebetween, so that the data writing operation can be carried out in the overlapping portions of the drain conductive layer 66a and floating gate electrode 90. More specifically, by applying a voltage of about 10 to 15 V to the control gate electrode 92 and by applying a voltage of about 6 to 8 V to the drain conductive layer 66a, electrons are implanted by the F-N current from the drain conductive layer 66a toward the floating gate electrode 90. In the ninth embodiment, as described above, the writing operation is carried out in the overlapping portions of the drain conductive layer 66a and floating gate electrode 90, so that it is not necessary to overlap the drain diffusion layer 202 with the floating gate electrode 90 located on the channel region 65, which is required in the prior art. More specifically, it is not necessary to make an end of the drain diffusion region 202, which is located near the channel region 65b, protruded beyond the side wall oxide film 77a toward the channel region 65. Owing to the offset structure of the drain diffusion region 202 described above, the electric field in the unselected cell does not concentrate at a position immediately below the floating gate electrode 90 located on the channel region 65 in the data writing operation. Thereby, holes generated by the interband tunneling are not located immediately under the floating gate electrode 90 in the channel region 65. As a result, holes generated by the interband tunneling are prevented form being introduced into the floating gate electrode 90, an thus the drain disturb phenomenon, which may be caused by the interband tunneling, can be effectively prevented. Also owing to the offset structure of the drain diffusion region 202, an electric field between the floating gate electrode 90 on the channel region 65 and the drain diffusion region 202 is weakened. Thereby, the drain disturb phenomenon, which may be caused by F-N tunneling, can be effectively prevented.

This ninth embodiment also has an advantage that a good writing efficiency can be obtained by increasing an area of overlapping portions of the drain conductive layer 66a and floating gate electrode 90.

Also in this ninth embodiment, since the source conductive layer 66b is formed on the source diffusion region 63, which is similar to the seventh and eighth embodiments, increase of resistance of the source diffusion region 63 can be prevented even if the size of source diffusion region 63 is reduced in accordance with miniaturization.

Embodiment 10

Figure 40:
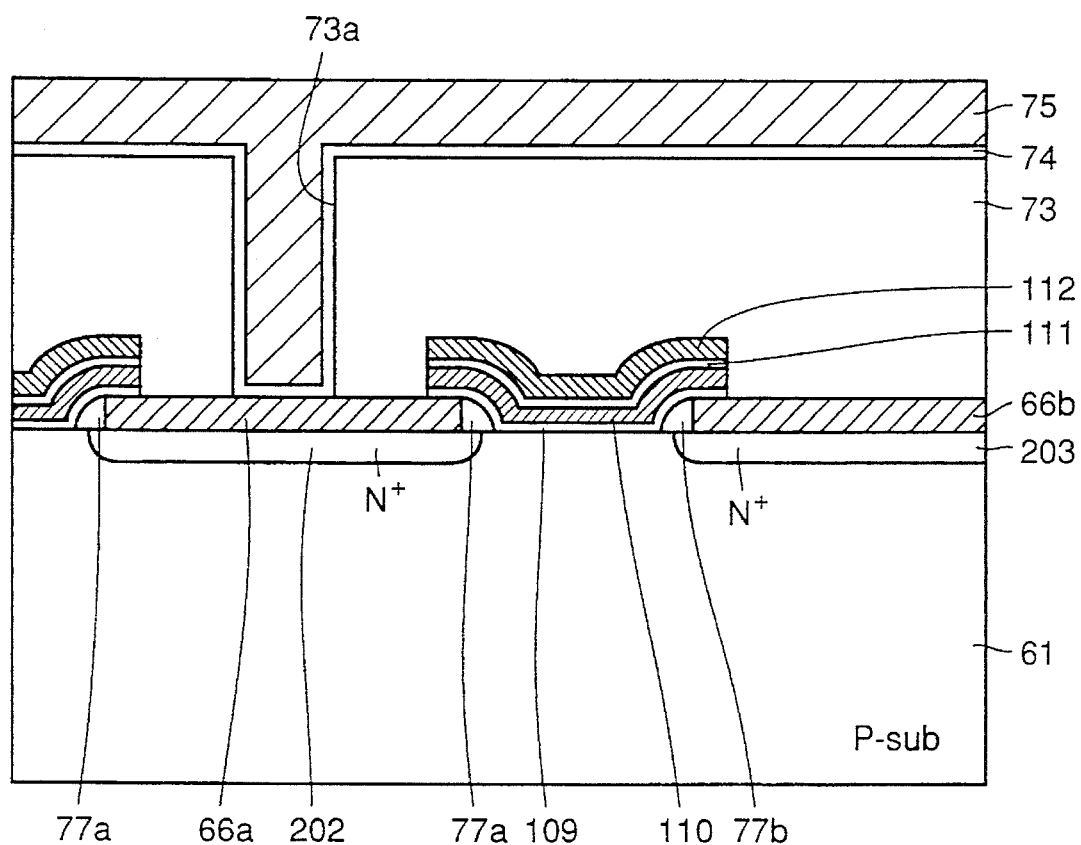
FIG. 40 is a cross section showing a memory cell part of a flash EEPROM of a tenth embodiment of the invention.

FIG. 40 is a cross section showing a memory cell part of a flash EEPROM of a tenth embodiment of the invention. Referring to FIG. 40, the flash EEPROM of the tenth embodiment has a structure corresponding to combination of the eighth and ninth embodiments described before.

Thus, an oxide film 109 of about 100 Å in thickness located on the channel region 65 is also formed on and in contact with the drain conductive layer 66a and source conductive layer 66b. Over the drain conductive layer 66a and source conductive layer 66, there are formed a floating gate electrode 110, a multilayer film 111 and a control gate electrode 112 with the oxide film 109 therebetween. Both the drain diffusion region 202 and source diffusion region 203 have the offset structures.

Owing to the structure described above, the tenth embodiment can achieve both the advantages obtained by the eighth and ninth embodiments. More specifically, owing to the offset structure of the source diffusion region 203, holes generated by the interband tunneling can be effectively prevented from being implanted into the oxide film 109 on the channel region 65, so that deterioration of the endurance characteristic, which may be caused in the data erasing operation, can be suppressed. Further, owing to the offset structure of the drain diffusion region 202, holes, which are generated in the unselected cell due to the interband tunneling in the data writing operation, can be effectively prevented from being implanted into the charge storage electrode, and the electric field between the floating gate electrode 110 on the channel region 65 and the drain diffusion region 202 can be weakened. As a result, it is possible to effectively prevent the drain disturb phenomenon, which may be caused by the interband tunneling, and the drain disturb phenomenon, which may be caused by the F-N tunneling. Further, by forming the source conductive layer 66b on the source diffusion region 203, increase of resistance of the source diffusion region 203 can be suppressed even if the size of source diffusion region 203 is reduced in accordance with miniaturization of elements. Thereby, it is possible to prevent delay of signals, which may be caused by the increase of resistance.

FIGS. 41–46 are cross sections showing a manufacturing process of the flash EEPROM of the tenth embodiment. The manufacturing process of the flash EEPROM of the tenth embodiment will be described below with reference to FIGS. 40–46.

Figure 41:
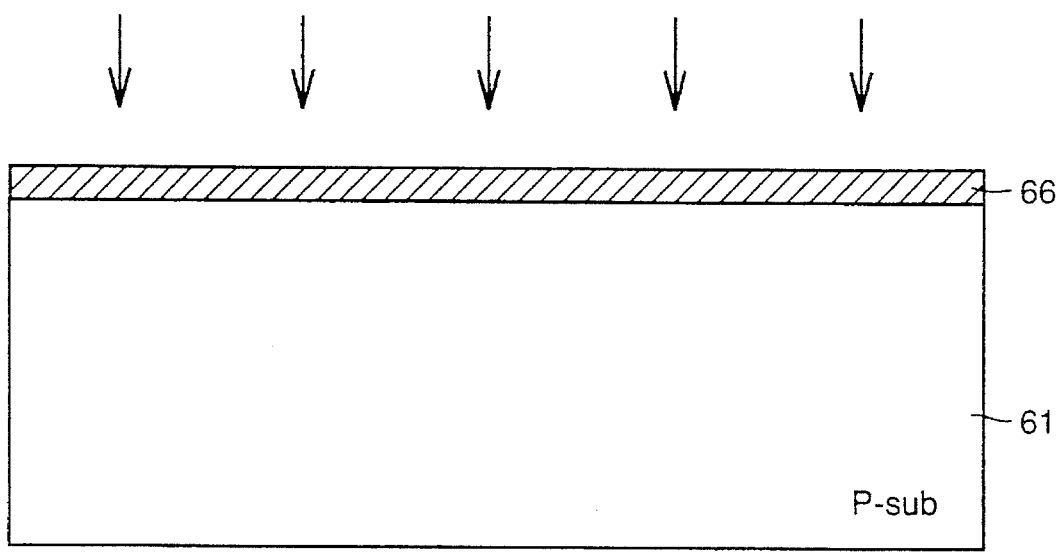
FIGS. 41–46 are cross sections showing first to sixth steps of a manufacturing process of the flash EEPROM of the tenth embodiment shown in FIG. 40.

First, as shown in FIG. 41, a well region and an element isolating oxide film (both not shown) are formed on predetermined regions on the main surface of the P-type silicon substrate 61. The polysilicon layer 66 of about 500 to 2000 Å in thickness is formed on the main surface of the P-type silicon substrate 65 by the CVD method. Arsenic is implanted into the polysilicon layer 66 under the conditions of 50 KeV and $4\times10^{15}/cm^2$.

Figure 42:
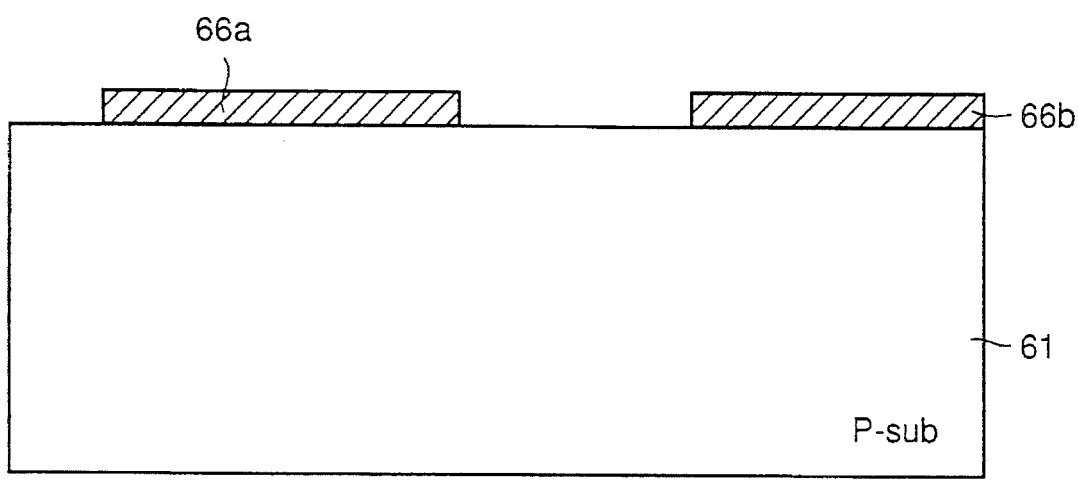

Then, as shown in FIG. 42, photolithography and anisotropic etching technique are used for patterning the polysilicon layer 66 (see FIG. 41) to form the drain conductive layer 66a and source conductive layer 66b.

Figure 43:
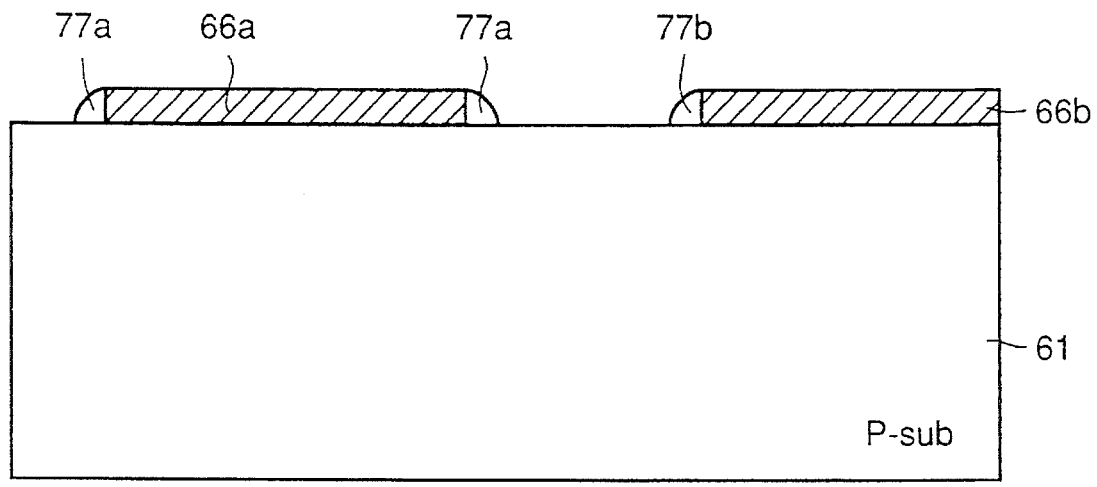

As shown in FIG. 43, an oxide film (not shown) of about 1000 Å in thickness is formed on the entire surface by the CVD method, and then reactive etching is carried out to form the side wall oxide films 77a and 77b.

Figure 44:
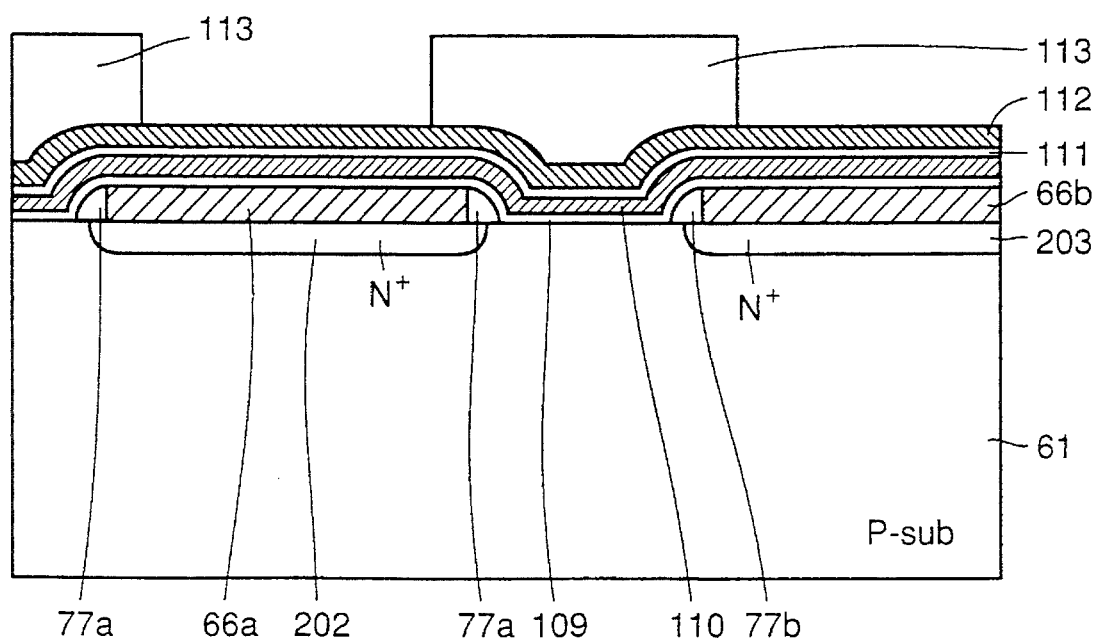

As shown in FIG. 44, a heat treatment is carried out to diffuse arsenic from the drain conductive layer 66a and source conductive layer 66b, whereby the drain diffusion region 202 and source diffusion region 203 are formed in such a state that ends thereof near the channel region 65 do not protrude beyond the side wall oxide films 77a and 77b. Thus, the drain diffusion region 202 and source diffusion region 203 have the so-called offset structures. This can be easily achieved by controlling, e.g., conditions for heat treatment.

Figure 45:
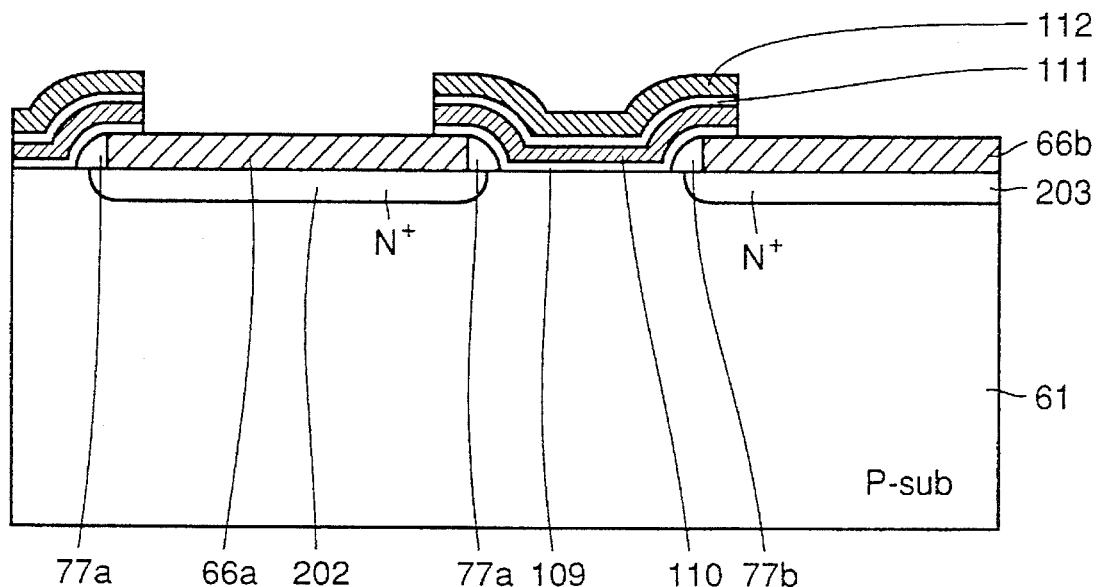

Then, an oxide layer 109a of about 100 Å in thickness, a polysilicon layer 110a of about 1500 Å in thickness, a multilayer film 111a made of oxide and nitride films, and a polysilicon layer 112a of about 1500 Å in thickness are sequentially formed on the entire surface. A resist 113 is formed on a predetermined region on the polysilicon layer 112a. Using the resist 113 as a mask, anisotropic etching is carried out for patterning the polysilicon layer 112a, multilayer film 111a, polysilicon layer 110a and oxide layer 109a. Thereby, the oxide film 109, floating gate electrode 110, multilayer film 111 and control gate electrode 112 are formed as shown in FIG. 45.

Figure 46:
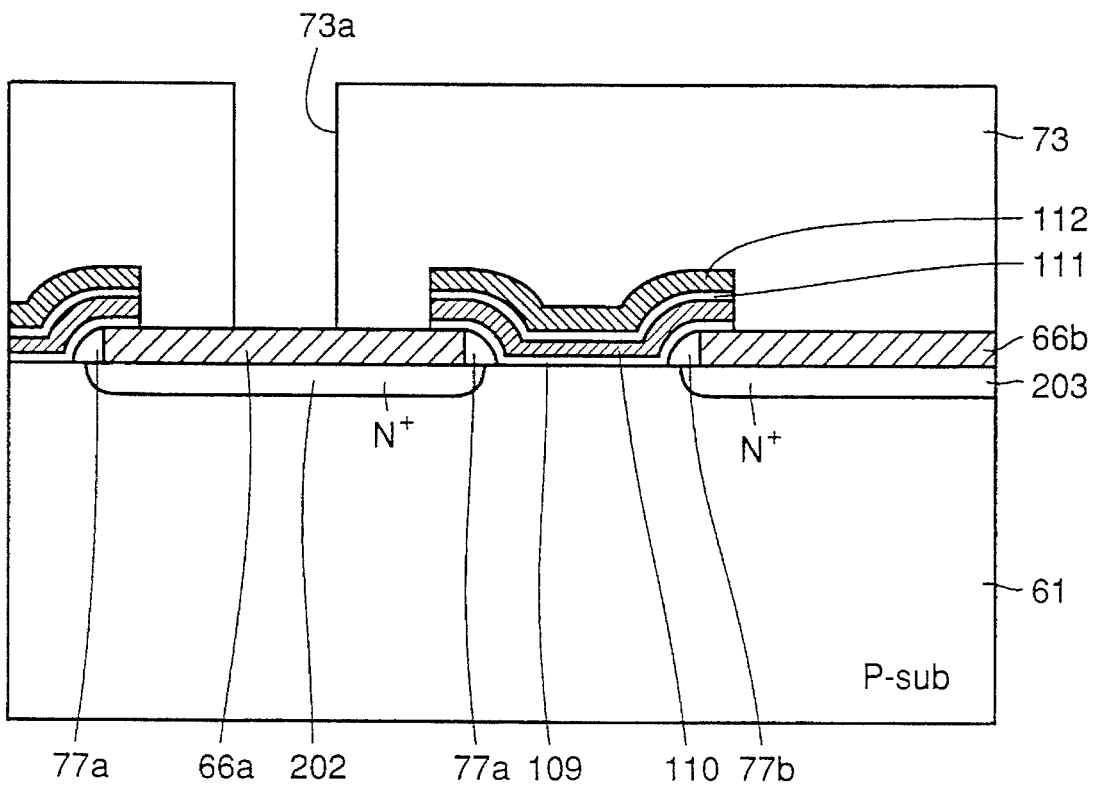

As shown in FIG. 46, the interlayer insulating film 73 having a flattened surface is formed at the thickness of about 5000 to 15000 Å on the whole surface, and then the contact hole 73a is formed.

Finally, as shown in FIG. 40, the TiN film 74 of about 500 Å in thickness and the aluminium alloy interconnection layer 75 of about 10000 Å in thickness are formed. In this manner, the flash EEPROM of the tenth embodiment is completed.

Embodiment 11

Figure 47:
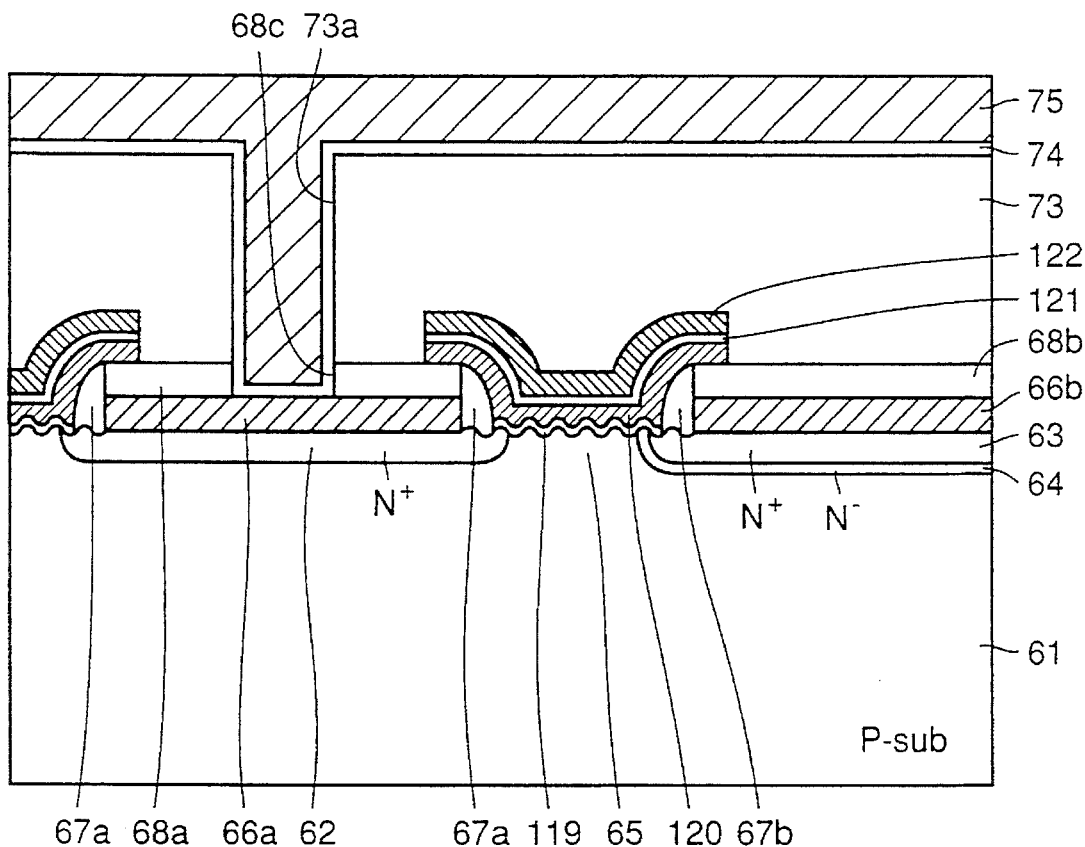
FIG. 47 is a cross section showing a memory cell part of a flash EEPROM of an eleventh embodiment of the invention.

FIG. 47 is a cross section showing a memory cell part of a flash EEPROM of an eleventh embodiment of the invention. Referring to FIG. 47, the flash EEPROM of the eleventh embodiment has basically the same structure as that of the flash EEPROM of the seventh embodiment. In the eleventh embodiment, however, the channel region 65 includes a surface region 65a having irregularity or unevenness. The irregularity (i.e., surface roughness) is in the range of about 200 to 300 Å. The irregularity of the surface region 65a of the channel region 65 promotes concentration of the electric field at convex portions forming the irregularity, and thus increases a vertical electric field. This facilitates draw of electrons from the floating gate electrode 120 in the erasing operation, and facilitates jump of electrons into the floating gate electrode 120 in the writing operation. As a result, the writing and erasing efficiencies can be improved.

Figure 48:
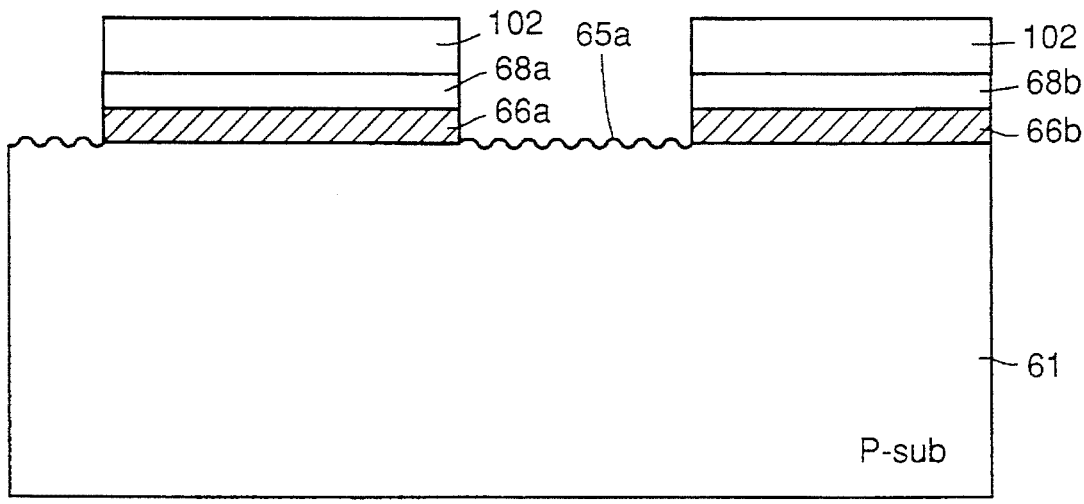
FIG. 48 is a cross section showing a manufacturing process of a flash EEPROM of the eleventh embodiment of the invention shown in FIG. 47.

FIG. 48 is a cross section showing a manufacturing process of the flash EEPROM of the eleventh embodiment shown in FIG. 47. Referring to FIG. 48, the irregularity of the surface region 65a of the channel region 65 is formed when the drain conductive layer 66a and source conductive layer 66b are patterned by etching them with the resist 102 used as the mask. More specifically, the drain and source conductive layers 66a and 66b are over-etched with the resist used as the mask for intentionally etching the surface region 65a of the channel region 65. Thereby, the irregularity can be easily formed. As an example of a manner for forming the irregularity, other than the overetching, the surface region 65a of the channel region 65 may be exposed to plasma. Thus, the surface region 65a of the channel region 65 is exposed to plasma. More specifically, the surface region 65a of channel region 65 is exposed to $O_2$ plasma or $CF_4$ plasma at 800 W for about ten minutes, whereby the irregularity having a surface roughness of about 200 to 300 Å can be easily formed.

Embodiment 12

Figure 49:
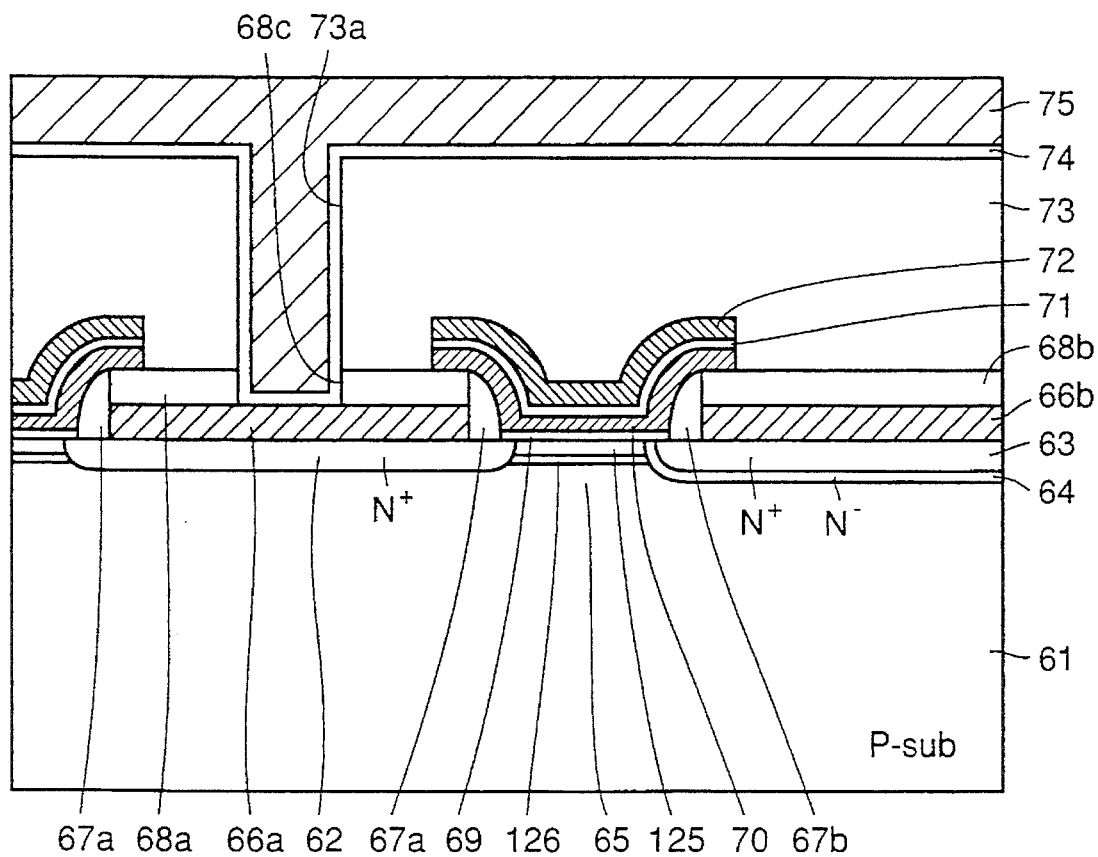
FIG. 49 is a cross section showing a memory cell part of a flash EEPROM of a twelfth embodiment of the invention.

FIG. 49 is a cross section showing a memory cell part of a flash EEPROM of a twelfth embodiment of the invention. Referring to FIG. 49, the twelfth embodiment has basically the same structure as the flash EEPROM of the seventh embodiment shown in FIG. 27. In addition thereto, the twelfth embodiment includes an N-type impurity layer 125 formed on the surface region of the channel region 65, and a P-type impurity layer 126 formed under the N-type impurity layer 125. Owing to this structure, a high electric field is not applied to the boundary region between the N-type impurity layer 125 and the N⁻-type source diffusion region 64, and thus generation of the interband tunneling in this boundary is effectively prevented. This suppresses the interband tunneling itself, which occurs in the data erasing operation, compared with the prior art.

Owing to the existence of N-type impurity layer 125, the region receiving the high electric field moves to the boundary region between the P-type impurity layer 126 under the N-type impurity layer 125 and the N⁻-type source diffusion region 64. Thereby, the interband tunneling occurs at the position under the N-type impurity layer 125, so that a distance from the position of generation of interband tunneling to the oxide film 69 increases, as compared with the prior art.

As a result, holes generated by the interband tunneling in the data erasing operation is effectively prevented from being trapped by the oxide film 69. Therefore, the quality of the oxide film 69 does not deteriorate in the data erasing operation, and such a disadvantage is also prevented that the draw of electrons from the floating gate electrode 70 is impeded. Thus, deterioration of the endurance characteristic in the data erasing operation can be effectively prevented.

Formation of the P-type impurity layer 126 under the N-type impurity layer 125 can effectively prevent reduction of the writing characteristic. More specifically, by forming the P-type impurity layer 126 covering the N-type impurity layer 125, and increasing the concentration of impurity in the P-type impurity layer 126, a high electric field can be generated in the boundary region between the P-type impurity layer 126 and the drain diffusion region 62. This promotes the avalanche phenomenon, and thus can improve the writing efficiency. Consequently, it is possible to effectively prevent reduction of the writing efficiency, which may be caused by provision of the N-type impurity layer 125.

Further, in the twelfth embodiment, since the source conductive layer 66b is formed on the source diffusion region 63, which is similar to the seventh to eleventh embodiments, increase of resistance of the source diffusion region 63 can be effectively prevented even if the size of source diffusion region 63 is reduced in accordance with miniaturization of elements.

FIGS. 50–56 are cross sections showing a manufacturing process of the flash EEPROM of the twelfth embodiment shown in FIG. 49. Referring to FIGS. 49–56, the manufacturing process of the flash EEPROM of the twelfth embodiment will be described below.

Figure 50:
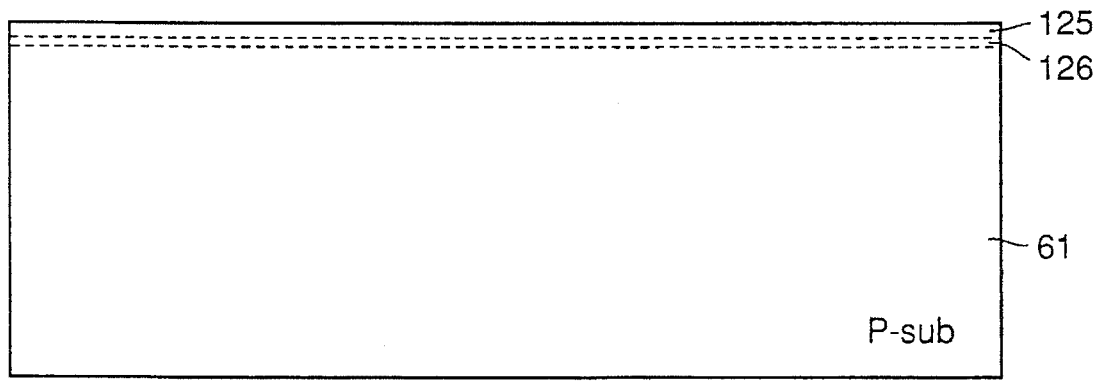
FIGS. 50–56 are cross sections showing first to seventh steps of a manufacturing process of the flash EEPROM of the twelfth embodiment shown in FIG. 49.

First, as shown in FIG. 50, a well region and an element isolating oxide film (both not shown) are formed on predetermined regions on the main surface of the P-type silicon substrate 61. Channel implantation is carried out for forming the buried channel. More specifically, arsenic is ion-implanted under the conditions of 10 KeV and not more than $10^{12}/cm^2$, and boron is ion-implanted under the conditions of 50 KeV and not more than $10^{13}/cm^2$.

Figure 51:
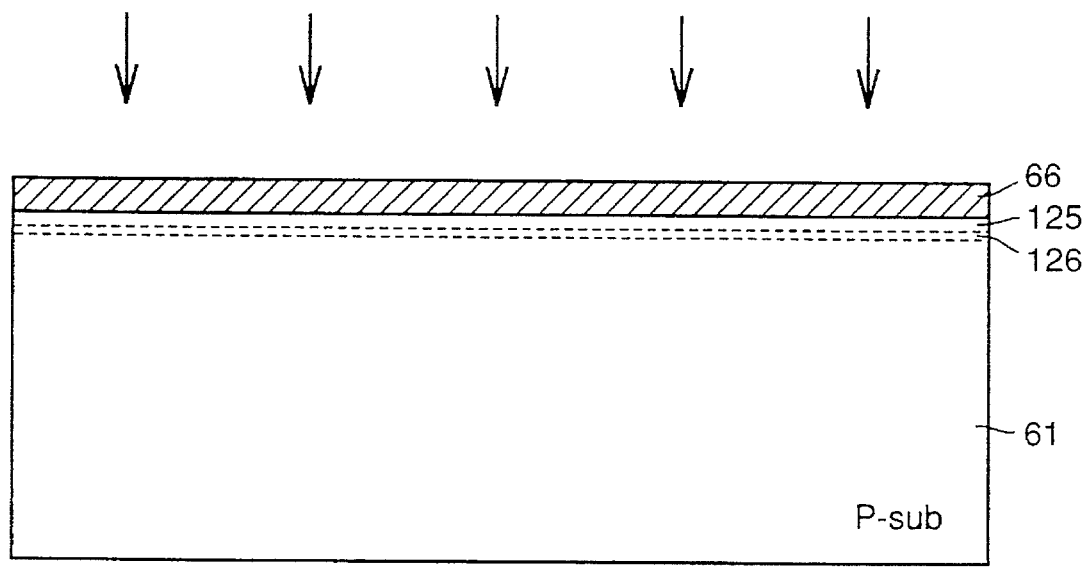

As shown in FIG. 51, the CVD method is used to form the polysilicon layer 66 having a thickness of about 500 to 2000 Å. Arsenic is ion-implanted into the polysilicon layer 66 under the conditions of 50 KeV and $4 \times 10^{15}/cm^2$.

Figure 52:
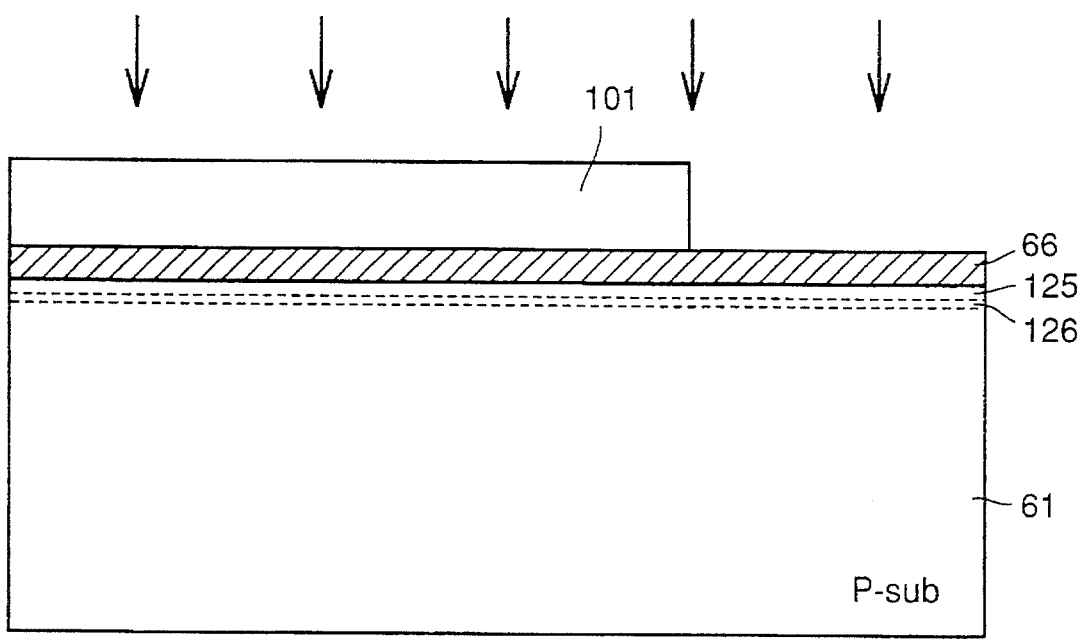

As shown in FIG. 52, the resist 101 covering regions which will form the channel region and drain diffusion region is formed on the polysilicon layer 66. Using the resist 101 as a mask, phosphorus is implanted into the polysilicon layer 66 under the conditions of 50 KeV and not more than $10^{14}/cm^2$. Thereafter, the resist 101 is removed.

Figure 53:
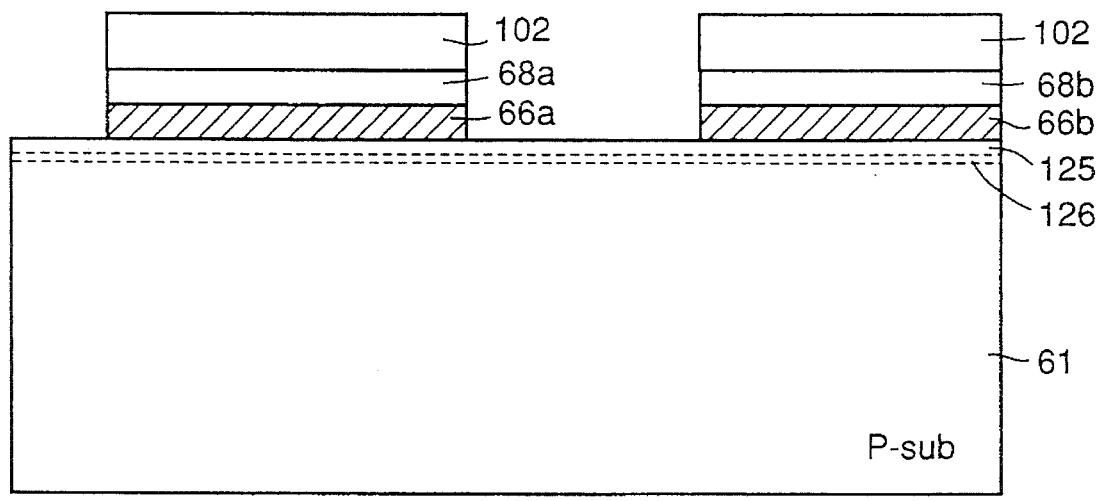

As shown in FIG. 53, a silicon oxide layer (not shown) having a thickness of about 2000 Å is formed on the entire surface of the polysilicon layer 66 (see FIG. 52), and then the resist 102 is formed in a predetermined region on the silicon oxide layer. Using the resist 102 as a mask, anisotropic etching is carried out on the silicon oxide layer and polysilicon layer 66, whereby the drain conductive layer 66a, source conductive layer 66b and interlayer insulating films 68a and 68b are formed. Thereafter, the resist 102 is removed.

Figure 54:
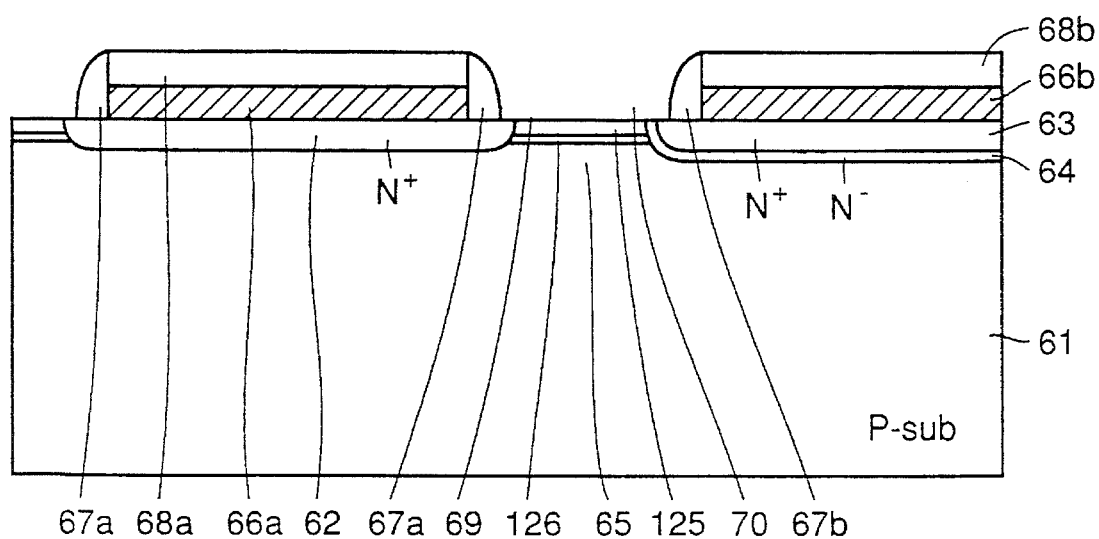

As shown in FIG. 54, a silicon oxide layer (not shown) of about 1000 Å in thickness is formed on the whole surface, and then anisotropic etching is carried out on the silicon oxide layer for forming the side wall oxide films 67a and 67b. Then, heat treatment is carried out for diffusing arsenic from the drain conductive layer 66a and for diffusing arsenic and phosphorus from the source conductive layer 66b. Thereby, the $N^+$-type drain diffusion region 62, $N^+$-type source diffusion region 63 and $N^-$-type source diffusion region 64 are formed. Simultaneously with this, the ions implanted into the process already described with reference to FIG. 50 are activated, and thus the $N^+$-type impurity layer 125 and P-type impurity layer 126 are activated.

Figure 55:
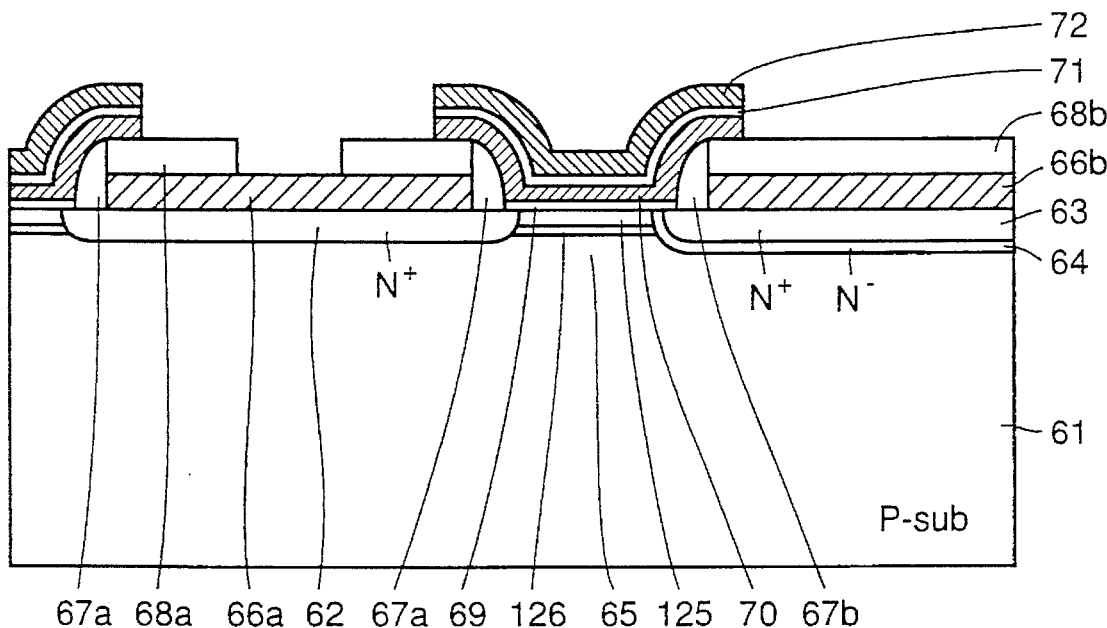

As shown in FIG. 55, the oxide film 69 of about 100 Å in thickness is formed on the channel region. A polysilicon layer is provided for forming the floating gate electrode 70 extending over and along the oxide film 69, side wall oxide films 67a and 67b and the interlayer insulating films 68a and 68. On the floating gate electrode 70 is provided the multilayer film 71 having a thickness of about 200 Å and formed of the nitride and oxide films.

Figure 56:
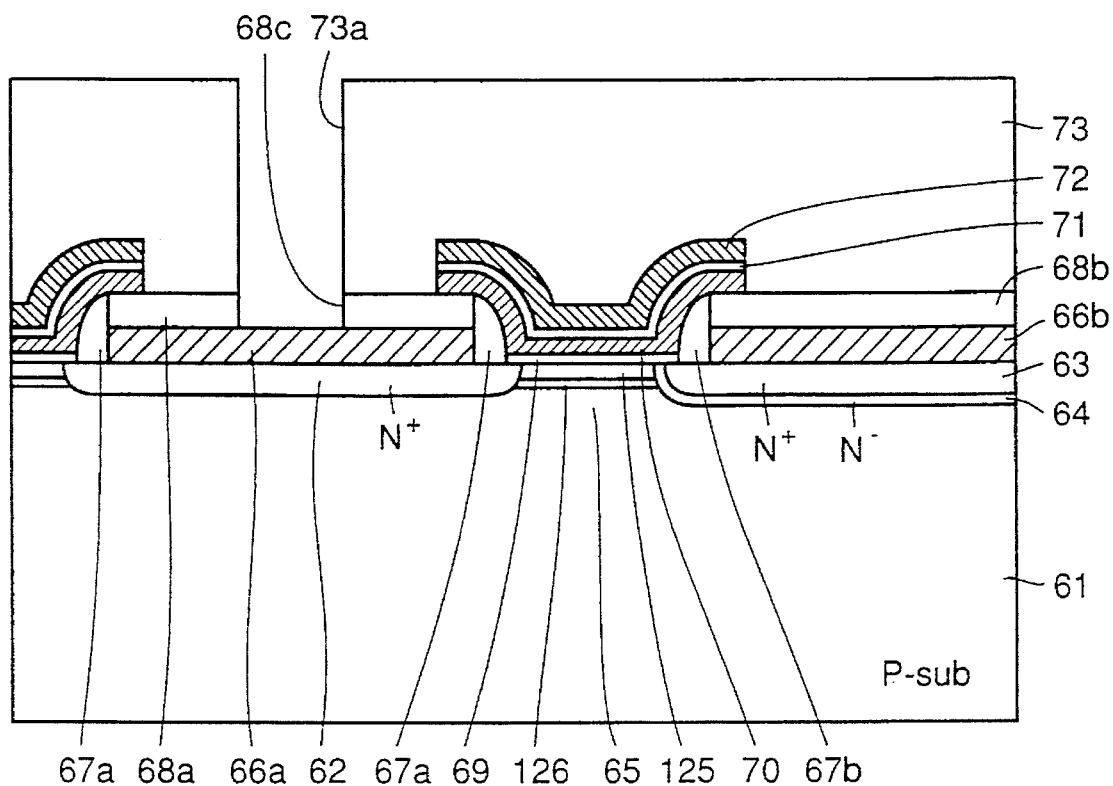
Figure 57:
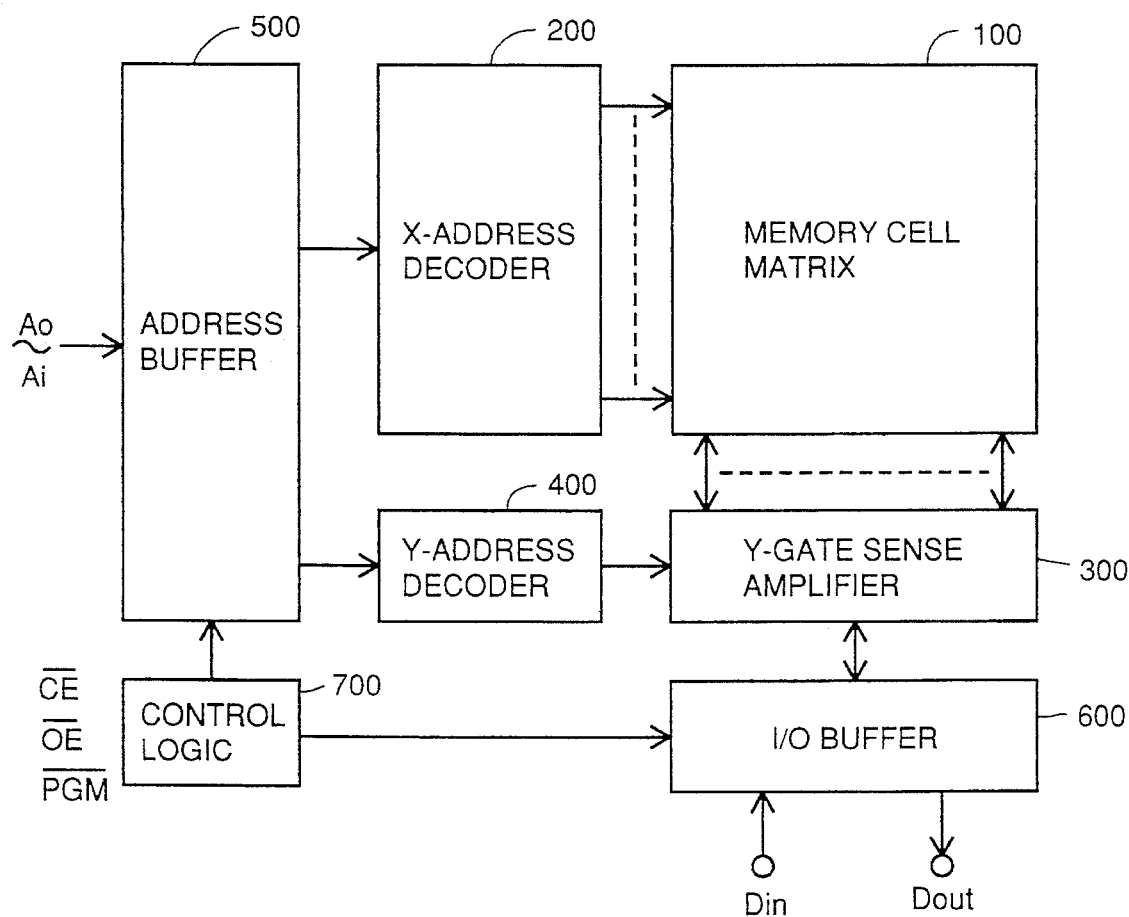
FIG. 57 is a block diagram showing a general structure of a flash EEPROM in the prior art.
Figure 58:
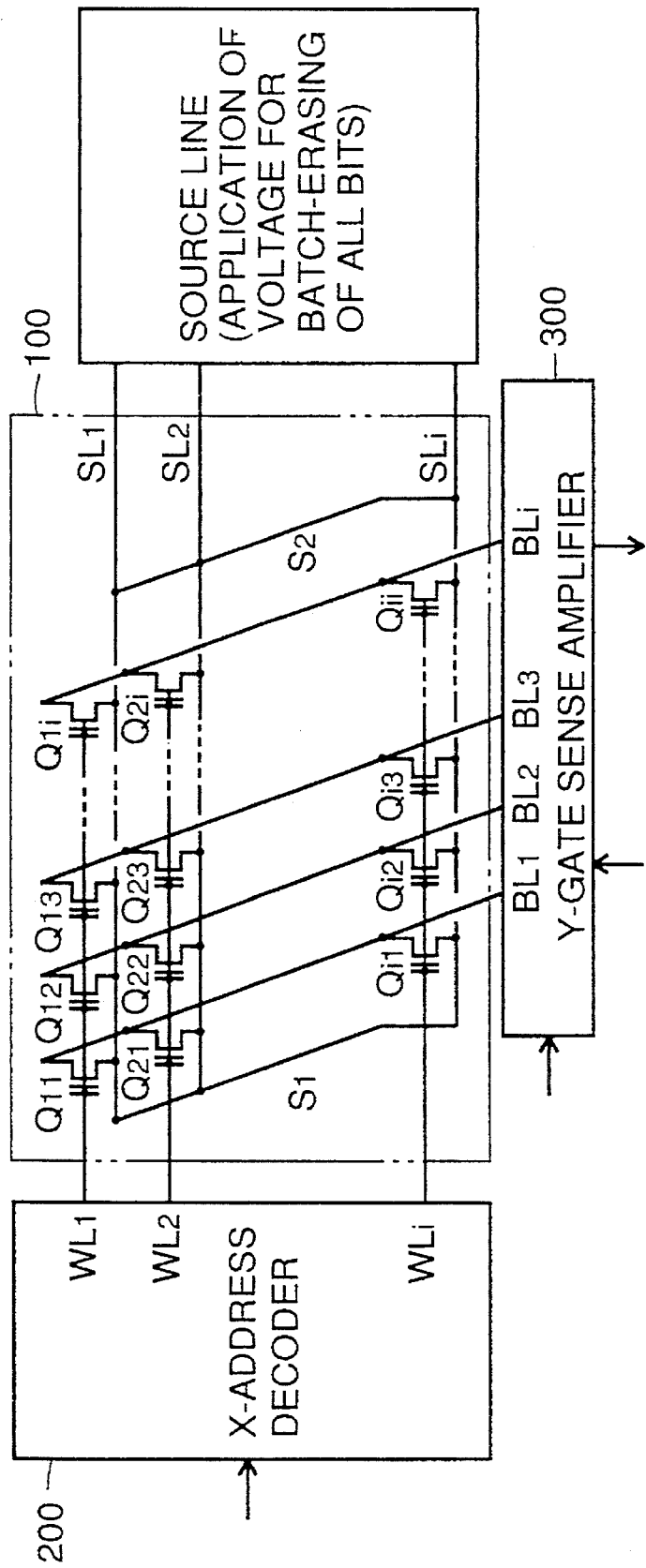
FIG. 58 is an equivalent circuit diagram showing a schematic structure of a memory cell matrix shown in FIG. 57.
Figure 59:
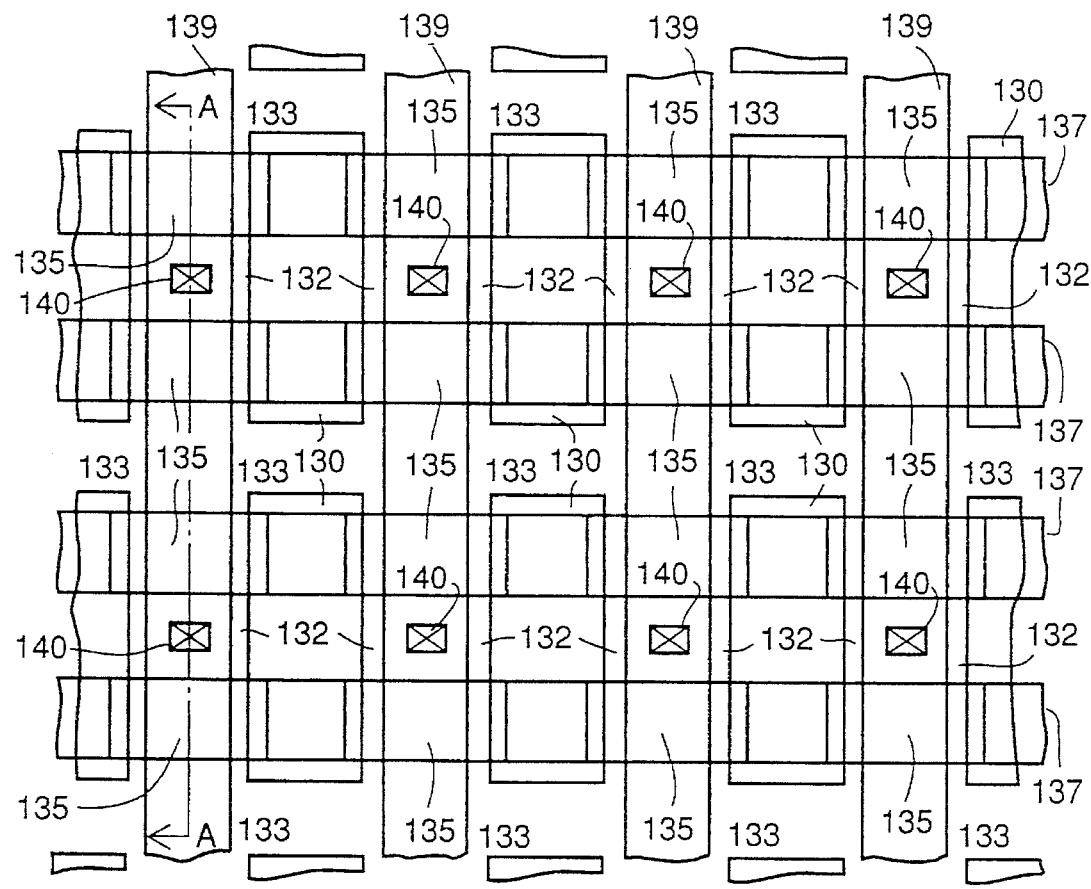
FIG. 59 is a schematic plan showing a flash EEPROM of a stack gate type in the prior art.
Figure 60:
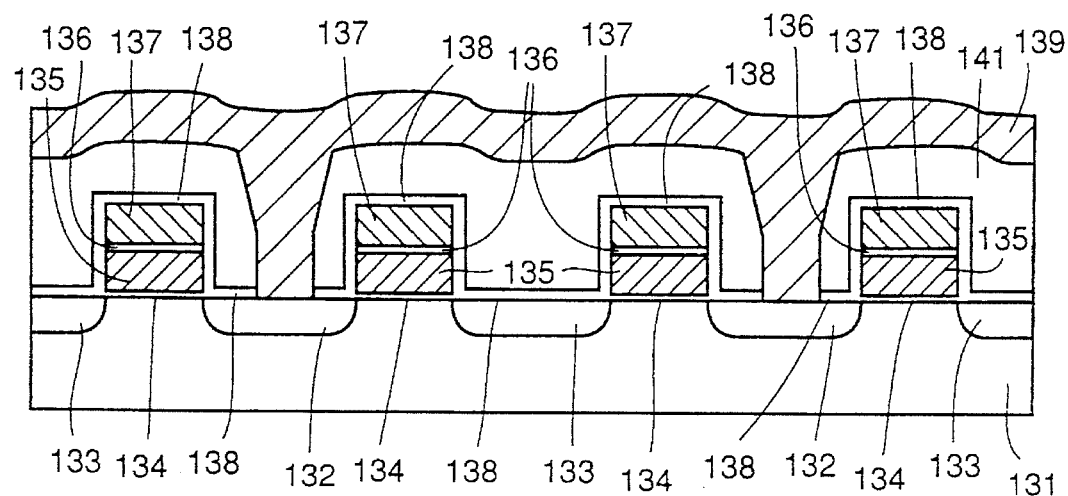
FIG. 60 is a cross section of the flash EEPROM taken along line A—A in FIG. 59.
Figure 61:
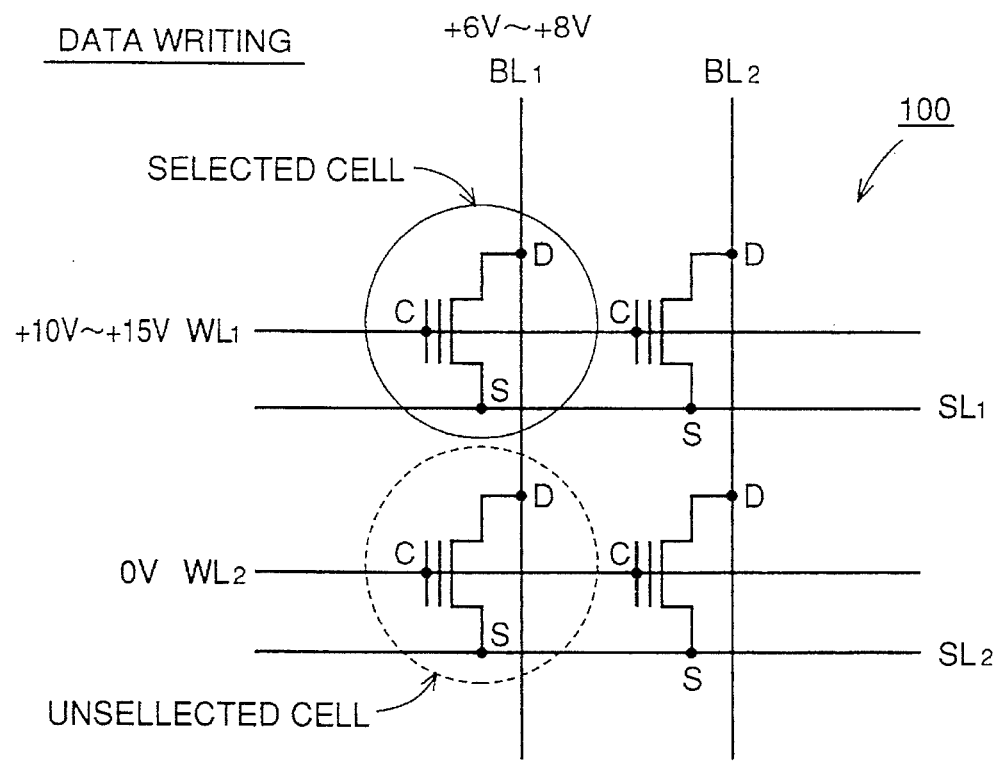
FIG. 61 is a fragmentary equivalent circuit diagram of a memory cell matrix showing a drain disturb phenomenon.
Figure 62:
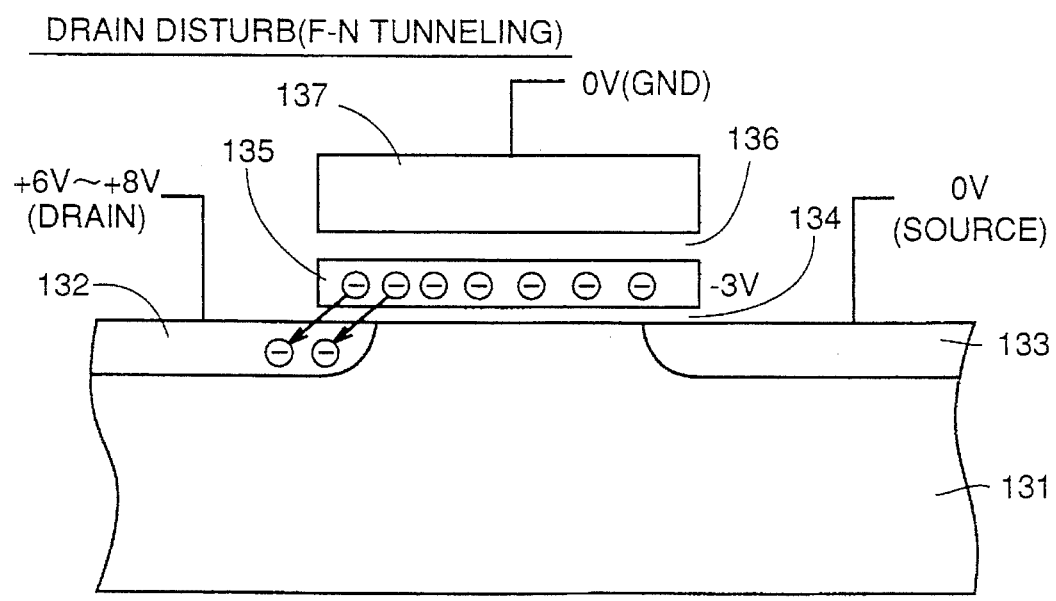
FIG. 62 is a cross section showing a drain disturb phenomenon by F-N tunneling.
Figure 63:
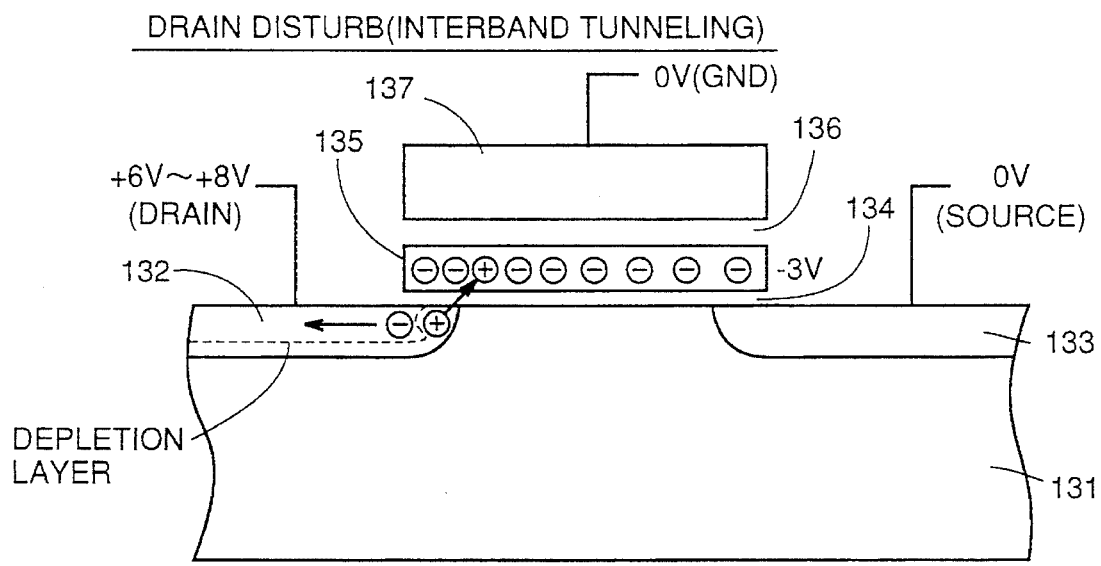
FIG. 63 is a cross section showing a drain disturb phenomenon by interband tunneling.
Figure 64:
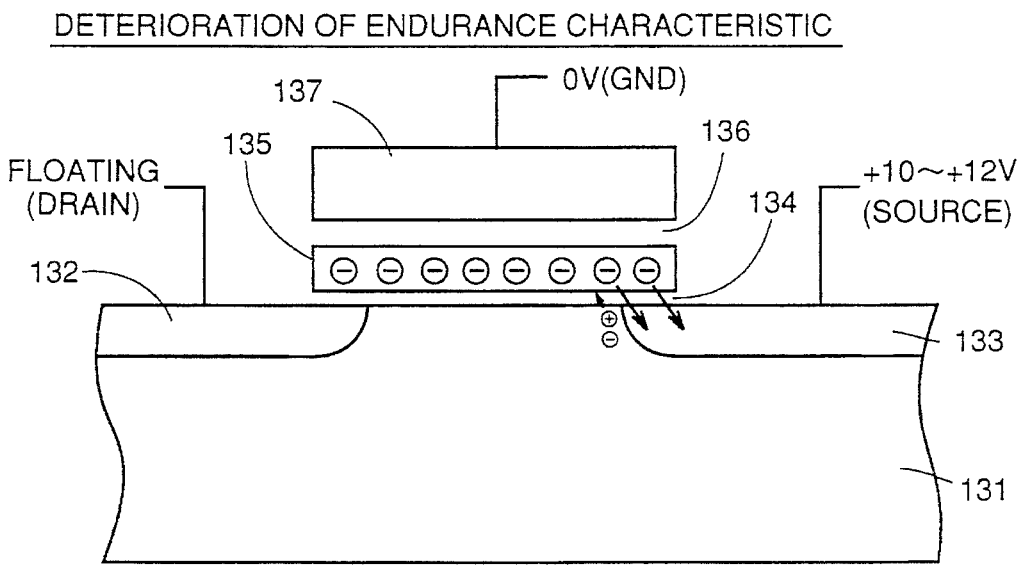
FIG. 64 is a cross section showing deterioration of an endurance characteristic caused during erasing of data.

As shown in FIG. 56, the interlayer insulating film 73 of about 5000 to 15000 Å in thickness is formed on the whole surface. Thereafter, heat treatment is carried out to flatten the upper surface of the interlayer insulating film 73. Thereafter, the contact holes 73a and 68c are formed in the interlayer insulating films 73a and 68c, respectively.

Finally, as shown in FIG. 49, the TiN film of about 500 Å in thickness is formed to be electrically connected in the contact holes 68c and 73a to the drain conductive layer 66a. The aluminium interconnection layer 75 is formed on the TiN film 74 at a thickness of about 10000 Å. In this manner, the flash EEPROM of the twelfth embodiment is completed.

According to the semiconductor memory device of one aspect of the invention, as described hereinbefore, the third impurity region of the second conductivity type is formed on the main surface of the semiconductor substrate of the first conductivity type located in the channel region, whereby a high electric field is not applied to a boundary region between the third impurity region and the source region, i.e., first or second impurity region in the data erasing operation, so that the interband tunneling in the boundary region can be effectively prevented. Therefore, the band tunneling itself, which may be caused in the data erasing operation, is suppressed as compared with the prior art, and the interband tunneling occurs at a position under the third impurity region, i.e., a position remote from the first dielectric film. As a result, holes generated by the interband tunneling in the data erasing operation can be effectively prevented from being trapped in the first dielectric film. Thereby, a film property of the first dielectric film does not deteriorate in the data erasing operation, and such a disadvantage can also be prevented that draw of electrons from the charge storage electrode is impeded. The third impurity region suppresses the interband tunneling which may generate at the boundary region between the third impurity region and the drain region, i.e., first or second impurity region in an unselected cell during the writing of data, so that the drain disturb phenomenon, which may be caused by the interband tunneling in the unselected cell during writing of data, can be suppressed. Further, in the semiconductor memory device of this aspect, at least one of the first and second impurity regions does not overlap the charge storage electrode. This reduces an electric field between the charge storage electrode and the drain region formed of first or second impurity region in the unselected cell during writing of data, compared with the prior art, so that the drain disturb phenomenon, which may be caused by the F-N tunneling, can be effectively prevented. Since at least one of the first and second impurity regions does not overlap the charge storage electrode, the electric field in the unselected cell does not concentrate at a position immediately under the charge storage electrode, and holes caused by the interband tunneling are not located immediately under the charge storage electrode. This prevents implantation of the holes generated by the interband tunneling into the charge storage electrode, and thus effectively prevents the drain disturb phenomenon, which may be caused by the interband tunneling.

According to the semiconductor memory device of another aspect of the invention, the third impurity region of the second conductivity type is formed on the main surface of the semiconductor substrate of the first conductivity type located in the channel region. Therefore, such a disadvantage can be prevented that draw of electrons from the charge accumulation electrode is impeded, and it is possible to suppress the disturb phenomenon, which may be caused by the interband tunneling generated in the unselected cell during writing of data. The fourth impurity region of the first conductivity type is formed under the third impurity region of the second conductivity type. Therefore, even in a case that the channel region is located under the third impurity region and thereby the electric field from the charge accumulation electrode to the channel region is weakened, the avalanche phenomenon is promoted by increasing a concentration of impurity in the fourth impurity region, so that reduction of the writing efficiency in the data writing operation can be effectively prevented. Since the fourth impurity region is formed at a depth smaller than that of junction between the first and second impurity regions, the depth of the third impurity region is reduced in proportion thereto. This effectively prevents weakening of the electric field applied from the charge storage electrode to the channel region located under the third impurity region. Therefore, the so-called "punch-through phenomenon", which makes the control from the charge storage electrode impossible, can be effectively prevented. That is, in the semiconductor memory device according to this aspect, the phenomenon which impedes draw of electrons from the charge storage electrode in the data erasing operation (i.e., deterioration of an endurance characteristic) can be effectively prevented, while significantly preventing generation of the punch-through phenomenon.

According to the semiconductor memory device of still another aspect, the source conductive layer is formed on and in contact with the source region, so that increase of resistance of the source region, which is formed commonly to a plurality of memory transistors, is effectively prevented even if the size of source region is reduced in accordance with miniaturization of elements. Consequently, disadvantageous delay of signals can be prevented.

In the case where the main surface of the semiconductor substrate located in the channel region has the irregularity or unevenness, the convex portion forming the irregularity promotes concentration of an electric field thereat, resulting in increase of a vertical electric field. This facilitates implantation of electrons into the charge storage electrode in the writing operation, and also facilitates draw of electrons from the charge storage electrode in the erasing operation. As a result, the writing and erasing efficiencies can be improved.

In the case where the impurity region of the second conductivity type is formed on the main surface of the semiconductor substrate located in the channel region, the buried channel structure is completed, so that a high electric field is not applied to the boundary region between the impurity region and the source region. As a result, generation of interband tunneling can be suppressed, and holes which are generated due to the interband tunneling are effectively prevented from being trapped by the first dielectric film.

According to a semiconductor memory device of yet another aspect, since the source conductive layer is formed on and in contact with the source region, and the charge storage electrode is formed over the source conductive layer with the first dielectric film therebetween, the erasing operation can be carried out in the overlapped portions of the source conductive layer and charge storage electrode. Since an area of the overlapping portions can be freely determined, a good erasing characteristic can be obtained by increase the area of the overlapping portions. Further, owing to the structure in which the erasing operation is carried out in the overlapped portions of the source conductive layer and charge storage electrode, it is not necessary to form the source region overlapping charge storage electrode on the channel region, which is required in the prior art, and the offset structure can be employed. Consequently, the interband tunneling occurs at the position remote from the first dielectric film on the channel region. Thereby, holes which are generated due to the interband tunneling in the data erasing operation are effectively prevented from being trapped by the first dielectric film, and thus deterioration of endurance characteristic can be prevented.

According to the semiconductor memory device of a further aspect of the invention, the drain conductive layer is formed on and in contact with the drain region, and the first dielectric film is formed on the drain region with the first dielectric film therebetween. Therefore, writing of data is carried out in the overlapping portions of the drain conductive layer and charge storage electrode. Since an area of the overlapping portions can be freely determined, a good writing characteristic can be obtained by increasing the area of the overlapping portions. At the same time, the drain region may have the so-called offset structure, whereby the electric field in the unselected cell does not concentrate at a position immediately under the charge storage electrode on the channel region in the data writing operation. Therefore, the holes generated by the interband tunneling are not located immediately under the charge storage electrode. Thereby, the holes generated by the interband tunneling are prevented from being implanted into the charge storage electrode, and the drain disturb phenomenon, which may be caused by the interband tunneling, is effectively prevented. Also, the electric field between the charge storage electrode on the channel region and the drain region is weakened, so that the drain disturb phenomenon, which may be caused by F-N tunneling, can be effectively prevented.

According to the manufacturing method of the semiconductor memory device of an aspect of the invention, the side wall insulating film is formed on the side walls of the charge storage electrode and the control electrode, and at least one of the second and third impurity regions is formed by introducing the impurity of the second conductivity type into the semiconductor substrate, using the control electrode and the side wall insulating film as a mask. Therefore, the second or third impurity regions is easily formed without overlapping the charge storage electrode. Thereby, the electric field between the charge storage electrode and the drain region, i.e., second or third impurity region in the unselected cell is weakened in the data writing operation, as compared with the prior art, and thus the drain disturb phenomenon, which may be caused by F-N tunneling, can be effectively prevented. Further, the electric field in the unselected cell does not concentrate at a position immediately under the charge storage electrode, so that holes generated by the interband tunneling are not located at the position immediately under the charge storage electrode. This prevents introduction of holes generated by the interband tunneling into the charge storage electrode, and thereby effectively prevents the drain disturb phenomenon which may be caused by the interband tunneling. Further, according to the manufacturing method of the semiconductor memory device of this aspect, the first impurity region is formed by introduction of impurity of the second conductivity type onto the main surface of the semiconductor substrate of the first conductivity type, so that the first impurity region is formed on the surface of the channel region of the memory cell which will be finally completed. Therefore, a high electric field is not applied to a boundary region between the first impurity region and the source region, i.e., the second or third impurity region, and thus generation of the interband tunneling at this region can be effectively prevented. This can effectively prevent a phenomenon, which impedes draw of electrons from the charge storage electrode and is caused due to generation of the interband tunneling.

According to the manufacturing method of the semiconductor memory device of a still further aspect, since the first impurity region is formed by the introduction of the impurity of the second conductivity type onto the main surface of the semiconductor substrate of the first conductivity type, the first impurity region is formed also on the surface region of the channel region of the memory cell which will be finally formed. This can effectively prevent a phenomenon, which impedes draw of electrons in the data erasing operation and is caused due to generation of the interband tunneling, and can also suppress the drain disturb phenomenon by the interband tunneling. Further, the second impurity region of the first conductivity type covering the first impurity region is formed in the region deeper than the region in which the first impurity region is formed. This can effectively prevent reduction of the writing efficiency, which may be caused due to the buried channel structure accomplished by the formation of the first impurity region. The second impurity region is located at a depth smaller than the depth of junction between the third and fourth impurity regions. In proportion to this, the first impurity region is located at a shallower position, which effectively prevents reduction of intensity of the electric field from the charge storage electrode to the channel located under the first impurity region. Consequently, the so-called punch-through phenomenon which makes the control from the charge storage electrode impossible, can be effectively prevented.

According to the manufacturing method of the semiconductor memory device of yet a further aspect, since the source conductive layer is formed on and in contact with the region in which the source region is formed, the semiconductor device can be easily manufactured in which increase of resistance of the source region is effectively prevented even if the size of source region is reduced in accordance with miniaturization of elements.

According to the manufacturing method of the semiconductor memory device of still another aspect, the source conductive layer is formed on the region in which the source region is formed, the drain conductive layer is formed on the region in which the drain region is formed, and the charge storage electrode is formed on the channel region, source conductive layer and drain conductive layer with the first dielectric film therebetween. Thereby, the erasing of data can be carried out at the overlapping portions of the source conductive layer and charge storage electrode, and the writing of data can be carried out at the overlapping portions of the drain conductive layer and charge storage electrode. At the same time, since the source and drain regions have the so-called offset structure, the semiconductor memory device can be easily manufactured, which can prevent deterioration of the endurance characteristic in the data erasing operation and can prevent the drain disturb phenomenon in the data writing operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor substrate of a first conductivity type having a main surface; and a memory cell transistor formed on said main surface and comprising:

first and second source/drain regions of a second conductivity type formed on said main surface on opposite sides of a channel region;

a charge storage electrode located on the channel region with a first dielectric layer therebetween;

a control gate electrode located on said charge storage electrode with a second dielectric layer therebetween, wherein at least one of said first and second source/drain regions does not overlap said charge storage electrode and said control gate electrode; and a first impurity region of the second conductivity type formed on said main surface in said channel region.

2. The semiconductor memory device according to claim 1, further comprising a second impurity region of the first conductivity type located under said first impurity region and extending across the entire channel region, said second impurity region being formed in a region shallower than a depth of a junction surface between said first and second source/drain regions and said semiconductor substrate.

3. A semiconductor memory device of a stacked gate type, having has a charge storage electrode and a control electrode and capable of electrically writing and erasing information, comprising:

a semiconductor substrate of a first conductivity type having a main surface;

first and second impurity regions of a second conductivity type, formed on said main surface of said semiconductor substrate and located at opposite sides of a channel region with a predetermined space between each other, at least one of said first and second impurity regions being formed without overlapping said charge storage electrode located on said channel region;

a third impurity region of the second conductivity type formed on said main surface of said semiconductor substrate located in said channel region; and a fifth impurity region of the second conductivity type covering the source region and formed at all the boundary regions between the source region and the substrate, said fifth impurity region having a concentration of impurity smaller than a concentration of impurity in said region which forms said source region.

4. A semiconductor device comprising:

a semiconductor substrate of a first conductivity type having a main surface; and a memory cell transistor formed on said main surface and comprising:

a source region and a drain region of a second conductivity type formed on said main surface on opposite sides of a channel region;

a charge storage electrode located on the channel region with a first dielectric layer therebetween;

a control gate electrode located on said charge storage electrode with a second dielectric layer therebetween, wherein said drain region does not overlap said charge storage electrode and said control gate electrode;

a first impurity region of the second conductivity type formed on said main surface in said channel region; and a second impurity region of the first conductivity type covering the drain region and formed at all the boundary regions between the drain region and the substrate, wherein the second impurity region has an impurity concentration of the first conductivity type greater than that of the substrate.

5. The semiconductor memory device according to claim 3, further comprising a sixth impurity region of the first conductivity type covering the drain region and formed at all the boundary regions between the drain region and the substrate.

6. A semiconductor device comprising:

a semiconductor substrate of a first conductivity type having a main surface; and a memory cell transistor formed on said main surface and comprising:

a source region and a drain region of a second conductivity type formed on said main surface on opposite sides of a channel region;

a first impurity region of the second conductivity type formed on said main surface in said channel region; and a second impurity region of the first conductivity type formed under said first impurity region and extending across the entire channel region, and having a junction surface to said semiconductor substrate at a depth smaller than a depth of a junction surface between said source/drain regions and said semiconductor substrate;

a charge storage electrode located on the channel region with a first dielectric layer therebetween;

a control gate electrode located on said charge storage electrode with a second dielectric layer therebetween.

7. A semiconductor memory device of a stacked gate type, capable of electrically writing and erasing information, comprising:

a semiconductor substrate of a first conductivity type having a main surface;

first and second impurity regions of a second conductivity type, formed on said main surface of said semiconductor substrate and located at opposite sides of a channel region with a predetermined space between each other;

a third impurity region of the second conductivity type formed on said main surface of said semiconductor substrate located in said channel region;

a fourth impurity region of the first conductivity type formed under said third impurity region and having a junction surface to said semiconductor substrate at a depth smaller than a depth of a junction surface between said first and second impurity regions and said semiconductor substrate;

a charge storage electrode formed on said third impurity region with a first dielectric film therebetween;

a control electrode formed on said charge storage electrode with a second dielectric film therebetween, and a fifth impurity region of the second conductivity type covering the source region and formed at all the boundary regions between the source region and the substrate; between said first and second impurity regions, said firth impurity region having a concentration of impurity smaller than a concentration of impurity in said region which forms said source region.

8. The semiconductor memory device according to claim 7, further comprising a sixth impurity region of the first conductivity type covering the drain region and formed at all the boundary regions between the drain region and the substrate.

9. A semiconductor memory device capable of electrically writing and erasing information, comprising:

a semiconductor substrate of a first conductivity type having a main surface;

a source region and a drain region of a second conductivity type, formed on said main surface of said semiconductor substrate and located at opposite sides of a channel region with a predetermined space between each other;

a source conductive layer formed on and in contact with said source region;

a charge storage electrode formed at least on said channel region with a first dielectric film therebetween; and a control electrode formed on said charge storage electrode with a second dielectric film therebetween;

wherein an upper surface of said source conductive layer formed of polysilicon or polycide is positioned below an edge portion of said control electrode, and said source region does not overlap a portion of said charge storage electrode located above said first dielectric film on said channel region.

10. A semiconductor memory device capable of electrically writing and erasing information, comprising:

a semiconductor substrate of a first conductivity type having a main surface;

a source region and a drain region of a second conductivity type, formed on said main surface of said semiconductor substrate and located at opposite sides of a channel region with a predetermined space between each other;

a source conductive layer formed on and in contact with said source region;

a charge storage electrode formed at least on said channel region with a first dielectric film therebetween; and a control electrode formed on said charge storage electrode with a second dielectric film therebetween;

wherein an upper surface of said source conductive layer formed of polysilicon or polycide is positioned below an edge portion of said control electrode, wherein said main surface of said semiconductor substrate located in said channel region has an irregularity, and wherein said source region does not overlap a portion of said charge storage electrode located above said first dielectric film on said channel region.

11. The semiconductor memory device according to claim 10, wherein said irregularity has a surface roughness in a range from about 200 to 300 Å.

12. A semiconductor memory device capable of electrically writing and erasing information, comprising:

a semiconductor substrate of a first conductivity type having a main surface;

a source region and a drain region of a second conductivity type, formed on said main surface of said semiconductor substrate and located at opposite sides of a channel region with a predetermined space between each other;

a source conductive layer formed on and in contact with said source region;

a charge storage electrode formed at least on said channel region with a first dielectric film therebetween; and a control electrode formed on said charge storage electrode with a second dielectric film therebetween;

wherein an upper surface of said source conductive layer formed of polysilicon or polycide is positioned below an edge portion of said control electrode, wherein an impurity region of the second conductivity type is formed on said main surface of said semiconductor substrate located in said channel region, and wherein said source region does not overlap a portion of said charge storage electrode located above said first dielectric film on said channel region.

13. A semiconductor memory device capable of electrically writing and erasing information, comprising:

a semiconductor substrate of a first conductivity type having a main surface;

a source region and a drain region of a second conductivity type, formed on said main surface of said semiconductor substrate and located at opposite sides of a channel region with a predetermined space between each other;

a source conductive layer having an upper surface and formed on and in contact with said source region;

a first dielectric film formed on and in contact with at least said channel region and said upper surface of said source conductive layer;

a charge storage electrode formed on said first dielectric film; and a control electrode formed on said charge storage electrode with a second dielectric film therebetween, wherein said source region does not overlap a portion of said charge storage electrode located above said first dielectric film on said channel region.

14. The semiconductor memory device according to claim 13, wherein a drain conductive layer having an upper surface is further formed on and in contact with said drain region, said first dielectric film is further formed on and in contact with said drain conductive layer, and said charge storage electrode is formed also on and in contact with the upper surface of said drain conductive layer with said first dielectric film therebetween.

15. A semiconductor memory device capable of electrically writing and erasing information, comprising:

a semiconductor substrate of a first conductivity type having a main surface;

a source region of a second conductivity type and a drain region of a second conductivity type, formed on said main surface of said semiconductor substrate and are located at opposite sides of a channel region with a predetermined space between each other;

a drain conductive layer having an upper surface and formed on and in contact with said drain region;

a first dielectric film formed on and in contact with said channel region and the upper surface of said drain conductive layer;

a charge storage electrode formed on said first dielectric film; and a control electrode formed on said charge storage electrode with a second dielectric film therebetween, wherein said drain region is formed without overlapping a portion of said charge storage electrode located above said first dielectric film on said channel region.

16. A semiconductor device comprising:

a semiconductor substrate of a first conductivity type having a main surface; and a memory cell transistor formed on said main surface and comprising:

a source region and a drain region of a second conductivity type formed on said main surface on opposite sides of a channel region;

a first impurity region of the second conductivity type formed on said main surface in said channel region;

a second impurity region of the first conductivity type formed under said first impurity region and extending across the entire channel region, and having a junction surface to said semiconductor surface at a depth smaller than a depth of a junction surface between said source/drain regions and said semiconductor substrate;

a charge storage electrode located on the channel region with a first dielectric layer therebetween; and a control gate electrode located on said charge storage electrode with a second dielectric layer therebetween, wherein said drain region does not overlap said charge storage electrode and said control gate electrode.

\* \* \* \* \*